(12) United States Patent
Nawata et al.

(10) Patent No.: US 12,656,536 B2
(45) Date of Patent: Jun. 16, 2026

(54) OPTICAL SYSTEM DEVICE

(71) Applicant: SCIVAX CORPORATION, Kawasaki (JP)

(72) Inventors: Akifumi Nawata, Kawasaki (JP);
Tomonori Nakamura, Kawasaki (JP);
Satoru Tanaka, Kawasaki (JP)

(73) Assignee: SCIVAX CORPORATION, Kawasaki (JP)

( * ) Notice: Subject to any disclaimer, the term of this patent is extended or adjusted under 35 U.S.C. 154(b) by 578 days.

(21) Appl. No.: 17/924,936

(22) PCT Filed: Dec. 17, 2020

(86) PCT No.: PCT/JP2020/047275
§ 371 (c)(1),
(2) Date: Nov. 11, 2022

(87) PCT Pub. No.: WO2021/229848
PCT Pub. Date: Nov. 18, 2021

(65) Prior Publication Data
US 2023/0204824 A1    Jun. 29, 2023

(30) Foreign Application Priority Data

May 13, 2020    (JP) ................................ 2020-084820
Aug. 8, 2020    (JP) ................................ 2020-135464

(51) Int. Cl.
*G02B 3/00*          (2006.01)
*G02B 3/04*          (2006.01)
(Continued)

(52) U.S. Cl.
CPC ......... *G02B 3/0056* (2013.01); *G02B 3/0037* (2013.01); *G02B 3/04* (2013.01);
(Continued)

(58) Field of Classification Search
CPC ...... G02B 3/0037; G02B 3/04; G02B 5/0294; G02B 5/0808; G02B 5/28; G02B 5/0284;
(Continued)

(56) References Cited

U.S. PATENT DOCUMENTS 5,453,876 A * 9/1995 Hamada ........... B29D 11/00278
                                                        359/625
11,085,609 B1 * 8/2021 Cheng ................... G01S 7/4815
(Continued)

FOREIGN PATENT DOCUMENTS

JP          H02-64501 A       3/1990
JP          2000298201 A  * 10/2000
(Continued)

OTHER PUBLICATIONS

Machine translation of JP 2000298201A (Year: 2000).*
(Continued)

*Primary Examiner* — Matthew Y Lee
(74) *Attorney, Agent, or Firm* — Morgan, Lewis & Bockius LLP

(57) ABSTRACT

An optical device is provided which does not need a collimate lens, and which has a high available efficiency of light. The optical device includes a light source unit 1 emitting light with a wavelength λ, and an optical element 2 with a concavo-convex structure including periodical lenses. When n is a natural number equal to or greater than 1, and the size of a k-th (where k is a natural number equal to or greater than 1) pitch from the smallest one among the pitches of the concavo-convex structure is $P_k$, a distance $L_1$ between the light source unit and the optical element satisfies the following formula 1 for equal to or greater than any one pitch $P_k$.

(Continued)

$$\frac{(n - 0.1)P_k^2}{2\lambda} \leqq L_1 \leqq \frac{(n + 0.1)P_k^2}{2\lambda} \qquad (1)$$

19 Claims, 63 Drawing Sheets

(51) Int. Cl.

| | |
|---|---|
| *G02B 5/02* | (2006.01) |
| *G02B 5/08* | (2006.01) |
| *G02B 5/28* | (2006.01) |
| *H01S 5/183* | (2006.01) |

(52) U.S. Cl.
CPC ......... *G02B 5/0294* (2013.01); *G02B 5/0808* (2013.01); *G02B 5/28* (2013.01); *H01S 5/183* (2013.01)

(58) Field of Classification Search
CPC .................. G02B 3/0056; G02B 30/27; G02B 27/0961; G02B 3/0006; G02B 3/0062; G02B 3/0068; G02B 19/0047; G02B 19/0052; G02B 19/0057; G02B 19/0061; G02B 19/0066; G02B 3/005; G02B 3/0043; G02B 26/10; H01S 5/183; H01S 5/005; H01S 5/423; G01S 7/481; H04N 13/305; H04N 13/32
See application file for complete search history.

(56) References Cited

U.S. PATENT DOCUMENTS

| | | | | |
|---|---|---|---|---|
| 11,175,010 | B2 * | 11/2021 | Han | F21V 5/045 |
| 2018/0267214 | A1 * | 9/2018 | Rossi | G02B 27/48 |
| 2019/0049097 | A1 * | 2/2019 | Rossi | F21V 23/003 |
| 2020/0096171 | A1 | 3/2020 | Han et al. | |
| 2020/0218077 | A1 * | 7/2020 | Li | G02B 3/0062 |
| 2021/0165101 | A1 * | 6/2021 | Ikeoh | G01S 17/42 |
| 2022/0037856 | A1 * | 2/2022 | Ghosh | G01B 11/24 |

FOREIGN PATENT DOCUMENTS

| | | |
|---|---|---|
| JP | 2002-277610 A | 9/2002 |
| JP | 2005-156203 A | 6/2005 |
| JP | 2018-511034 A | 4/2018 |
| WO | 2016/122404 A1 | 8/2016 |
| WO | 2017/131585 A1 | 8/2017 |

OTHER PUBLICATIONS

International Search Report issued in corresponding International Patent Application No. PCT/JP2020/047275 dated Mar. 9, 2021.

* cited by examiner

（a）

（b）

( a )

( b )

(a)

21
21

(b)

21

(a)

$L = 2 1 2. 8 \mu m \ (n = 1)$ (b)

$\Phi (deg)$ (c)

$\Phi (deg)$ (a)

L＝425．5μm（n＝2）

(b)

(c)

(a)

$L = 638.3\,\mu m\ (n=3)$ (b)

$\Phi\,(deg)$ (c)

$\Phi\,(deg)$ (a)

21

21

(b)

21

(a)

L=269. 3μm (n=1)

(b)

(c)

(a)

$L = 5 3 8 . 6 \mu m$ (n=2)

(b)

$\Phi$ (deg)

(c)

$\Phi$ (deg)

(a)

L = 8 0 7. 8 μm (n = 3)

(b)

Φ (deg)

(c)

Φ (deg)

y = sin x (a)

21        21

(b)

(a)

(b)

(a)

(b)

(c)                                        (d)

(a)

(b)

(c)

(d)

(a)

(b)

(c)

(d)

(a)

(b)

(c)

(d)

(a)

(b)

(c)

(d)

(a)

(b)

(c)

(d)

(a)

(b)

(c)

(d)

(a)

(b)

(a)

(b)

(a)

(b)

(a)

(b)

(a)

(b)

(a)

(b)

(c)

(d)

(a)

(b)

Spot Pattern at 50cm (c)

Half Shift Spot No. (within FOI) : 7729

(a)

(b)

Spot Pattern at 50cm (c)

One third Shift (a)

Spot No. (within FOI) : 11626

(b)

Spot Pattern at 50cm (c)

θ=90°

θ= 0°

θ= 1°

θ= 5°

θ= 1 0°

OPTICAL SYSTEM DEVICE

TECHNICAL FIELD

The present disclosure relates to an optical device and an optical element manufacturing method.

BACKGROUND ART

Three-dimensional measuring sensors that utilize a Time Of Flight (TOF) scheme are now to be adopted to a portable device, a vehicle, and a robot, etc. This is a sensor that measures a distance to an object from a time until light emitted to the object from a light source is reflected and returns. When light is uniformly emitted to the predetermined region of an object from a light source, a distance at each point to which light is emitted can be measured, enabling a detection of a three-dimensional structure of the object.

The above-described sensor system includes a light emitting unit that emits light to an object, a camera unit, and an arithmetic processing unit that calculates a distance from a light signal received by a camera.

Since conventionally available CMOS imager and CPU are applicable as the camera unit and the arithmetic processing unit, respectively, the unique component of the above-described system is the light emitting unit that includes a laser and an optical filter. In particular, a diffusing filter which shapes beams by allowing laser light to pass through a micro lens array, and which performs uniform light emission at a controlled region to an object is the distinguishing component of the above-described system.

In this case, according to conventional diffusing filters, since a micro lens array employs a periodic structure, there is a technical problem such that an unevenness of light intensity occurs due to diffraction. Hence, in order to suppress such unevenness, a devisal of arranging each lens at random, etc., is made (e.g., Patent Document 1).

CITATION LIST

Patent Literatures

[Patent Document 1] JP2006-500621A

SUMMARY OF INVENTION

Technical Problem

Conversely, regarding TOF, there are needs for measuring a long distance, and the intensity of emitted light that enables such a long distance measurement is necessary. However, since a micro lens array arranged at random has a high uniformity of emitted light, the intensity decreases by what corresponds to such a high uniformity, and thus it is not suitable for a long distance measurement.

Hence, as a scheme which saves electric power and which can process intensive light signal, emitting a dot pattern and performing a three-dimensional measurement from the time of flight regarding this light is taken into consideration.

As an optical filter that converts such incident laser beam into a dot pattern, a Diffraction Optical Element (DOE) is widely adopted which is formed of a concavo-convex pattern of a dielectric, and which changes the phase difference of light in accordance with a position on a translucent surface. Moreover, as a laser light source, a vertical resonance surface light emitting laser (VCSEL) that can easily make a two-dimensional array is adopted in many cases.

Light emitted from a VCSEL is first converted into parallel light by collimate lens. A DOE changes a phase difference by allowing such collimated light to pass through the concavo-convex pattern, and gives a predetermined light orientation distribution by the diffraction of those lights. Consequently, light is emitted to the surface of an object subjected to light emission at a predetermined intensity distribution.

In this case, light emitted from a VCSEL has a spread angle of substantially 20 degrees, and when adopted for a dot projector, as described above, a collimate lens is necessary. As for the collimate lens, however, in order to produce collimated light, it is necessary to place a light source at a focal position of such a lens. There are technical problems such that a focal distance is too long in order to accomplish high-quality collimated light, and a device size increases.

Hence, an objective of the present disclosure is to provide an optical device which does not need a collimate lens, and which has a high available efficiency of light, and also a manufacturing method of an optical element applied for such a device.

Solution to Problem

In order to accomplish the above objective, an optical device according to the present disclosure includes:

an optical element including a plurality of lenses arranged periodically, the lens allowing light with a wavelength $\lambda$ to pass therethrough; and an emitting including a light source that emits the light with the wavelength $\lambda$ to the plurality of lenses, in which when n is a natural number that is equal to or greater than 1, and a size of a k-th (where k is a natural number that is equal to or greater than 1) pitch from a smallest pitch among the pitches of the lenses is $P_k$, a distance $L_1$ between the emitting unit and the optical element satisfies a following formula 1 for equal to or greater than the any one pitch $P_k$.

[Equation 1]

$$\frac{(n-0.1)P_k^2}{2\lambda} \leqq L_1 \leqq \frac{(n+0.1)P_k^2}{2\lambda} \qquad \text{(Formula 1)}$$

In this case, the lens may be an aspheric lens with an overlapping rate of a surface in a normal direction that is equal to or smaller than 10%.

Moreover, the optical device may further include an aperture mask which is provided with an opening and which blocks some of the lights. The aperture mask may have the opening located at a portion including at least an optical axis of the lens. The aperture mask may be placed at an optical path of noise light of the lens. The aperture mask may be placed at a boundary portion between the lenses. The aperture mask may be provided which blocks the light emitted to a boundary portion between the lenses.

The aperture mask may be formed so as to be integrated with the optical element.

The optical element may include a light diffusion portion which is formed at a boundary portion between the lenses and which refracts transmitted light to an external side of an emitting angle of the lens.

A shape of the lens may be a non-rotationally symmetric.

It is preferable that the formula 1 should be satisfied for a smallest pitch $P_1$, and then it is preferable that the formula 1 should be satisfied for a second smallest pitch $P_2$.

The optical device may further include a mirror that reflects the light from the emitting unit in order to adjust the distance $L_1$.

The optical device according to the present disclosure may include a plurality of the emitting units.

The emitting unit may include:

a first emitting unit including a plurality of light sources each of which emit light with a wavelength $\lambda$ and which are arranged regularly; and a second emitting unit including a plurality of light sources each of which emit light with a wavelength $\lambda$ and which are arranged regularly so as to be shifted half period by half period in a vertical direction and in a horizontal direction relative to the plurality of light sources of the first emitting unit.

The emitting unit may include a first emitting unit, a second emitting unit and a third emitting unit each including a plurality of light sources each of which emit light with a wavelength $\lambda$ and which are arranged regularly; and relative to a direction in which the lenses of the optical element have the pitch $P_k$, the respective light sources of the first emitting unit, the second emitting unit and the third emitting unit are arranged so as to be shifted $P_k/3$ by $P_k/3$.

In this case, the respective emitting units may be caused to emit the light in sequence at different times.

A planar shape of the lens may be a square shape or a rectangular shape having any one of sides with a length R; and regarding the arrangement of the lenses, when i is a natural number that is equal to or greater than 1, respective rows of the lenses continuous in a direction along the side may be arranged so as to be shifted R/i by R/i.

It is preferable that the emitting unit should include a VCSEL with a plurality of light emitting modes; and the light emitting modes should have a rate of the mode which has a maximum intensity at an optical axis center, the rate being equal to or greater than 40% in the whole modes.

When m is a natural number that is equal to or greater than 1, the emitting unit may have a plurality of the light sources arranged regularly at m times or 1/m times of a period of the lenses of the optical element in any periodic direction thereof.

The emitting unit may have a plurality of the light sources arranged in a hexatic manner at a pitch of $mP_1$ or $P_1/m$; and a planar shape of the lens of the optical element may be a rectangular shape with a ratio between a short side and a long side that is $P_1:P_2=1:\sqrt{3}$.

The optical device according to the present disclosure may further include:

a diffuser that diffuses the light from the emitting unit in a predetermined shape;

a half mirror which is placed between the light source and the diffuser, and which allows some of the lights from the emitting unit to pass therethrough but reflects other lights from the emitting unit; and a mirror that reflects, to the optical element, the light reflected by the half mirror.

Moreover, the optical device according to the present disclosure may further include a diffuser emitting unit that includes a plurality of light sources each emitting light with a wavelength $\lambda$ and arranged consistently with the emitting unit, in which a distance $L_2$ between the diffuser emitting unit and the optical element may satisfy a following formula 2.

[Equation 2]

$$\frac{(n-0.9)P_k^2}{2\lambda} < L_2 < \frac{(n+0.1)P_k^2}{2\lambda}. \qquad \text{(Formula 2)}$$

The optical device according to the present disclosure may further include a diffuser emitting unit that includes a plurality of light sources each emitting light with a wavelength $\lambda$, in which, when m is a natural number that is equal to or greater than 1, the diffuser emitting unit may have the plurality of light sources arranged so as not to be m times or 1/m times of a period of the lenses of the optical element relative to a periodic direction thereof.

The optical device according to the present disclosure may further include a diffuser emitting unit arranged regularly and consistently with the light source of the emitting unit, in which a rotation angle of the emitting unit and a rotation angle of the diffuser emitting unit may be different from each other.

According to the present disclosure, an optical element manufacturing method of forming an optical element on which a plurality of lenses each allowing light with a wavelength $\lambda$ to pass therethrough and arranged periodically, the method includes:

an aperture mask forming process of forming, on a substrate, an aperture mask that blocks some of transmitted lights from the lenses; and a lens forming process of forming the lenses on the substrate on which the aperture mask is formed.

In this case, in the lens forming process, the lenses may be formed in such a way that the aperture mask is placed on an optical path of noise light of the lens. For example, in the lens forming process, the lenses may be formed in such a way that a boundary between the lenses is placed at a blocking portion of the aperture mask.

Moreover, according to the present disclosure, an optical element manufacturing method of forming an optical element on which a plurality of lenses each allowing light with a wavelength $\lambda$ to pass therethrough and arranged periodically, the method includes:

an aperture mask forming process of applying, on the lenses, a light blocking material that blocks the light, and eliminating the light blocking material in such a way that a part of the light blocking material remains at a position corresponding to a boundary between the lenses.

Advantageous Effects of Invention

The optical device according to the present disclosure does not need a collimate lens, and has a high available efficiency of light

DESCRIPTION OF EMBODIMENTS

Figure 1:
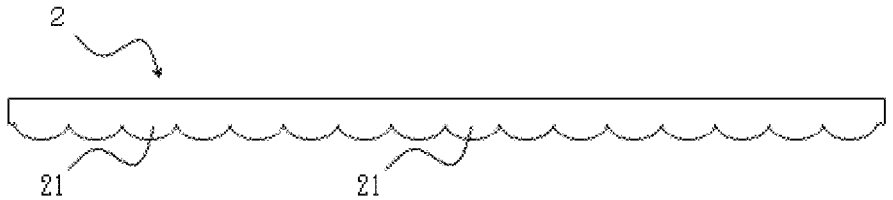
FIG. 1 is a schematic cross-sectional view illustrating an optical device according to the present disclosure.
Figure 1:
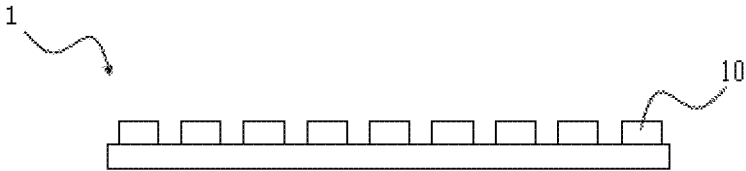

An optical device according to the present disclosure will be described below. As illustrated in FIG. 1, an optical device according to the present disclosure mainly includes an emitting unit 1 that emits light with a wavelength λ, and an optical element 2 that includes periodical lenses 21.

The emitting unit 1 is not limited to any particular one as far as it emits light with a wavelength λ. Moreover, the emitting unit 1 may be a single light source or multiple light sources. Furthermore, light from a single light source may be caused to pass through an aperture provided with multiple pores so as to accomplish a function like multiple light sources. When the emitting unit is formed by multiple light sources, it is preferable that such light sources should be placed on the same plane. A specific example of the emitting unit 1 is, for example, a Vertical Cavity Surface Emitting LASER (VCSEL) from which high output with little electric power can be expected. The VCSEL includes a plurality of light sources 10 each capable of emitting light in a vertical direction to a light emitting surface.

(Light Emitting Mode)

Figure 2:
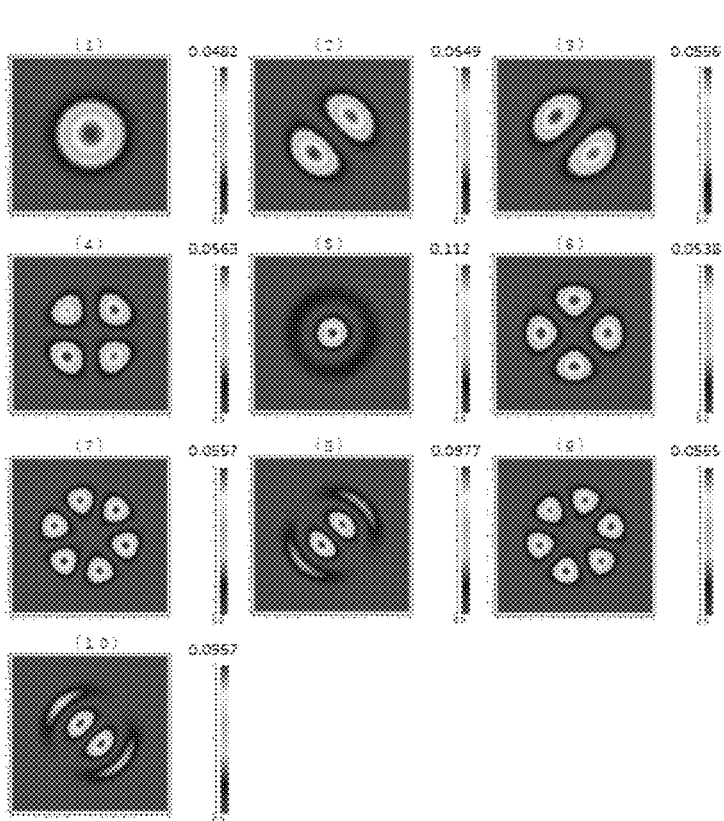
FIG. 2 is a diagram illustrating a light intensity at a far-field for each light emitting mode.
Figure 3:
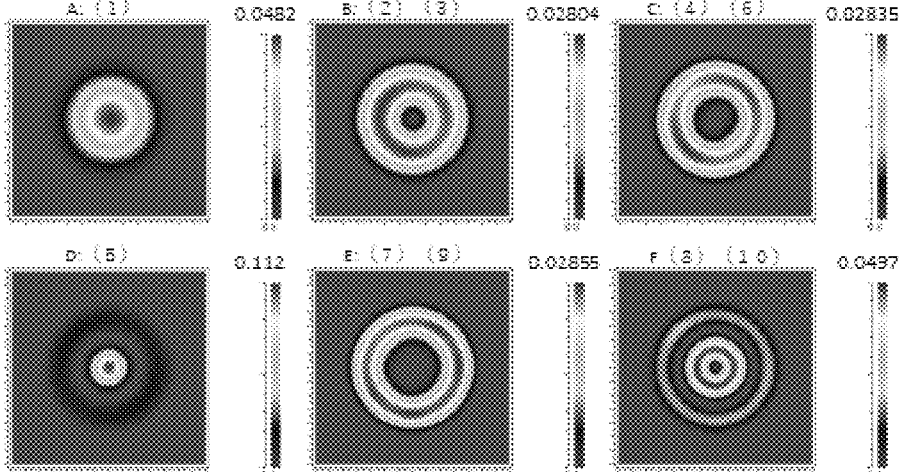
FIG. 3 is a diagram illustrating a light intensity which is classified and synthesized at a far-field for each light emitting mode.

Moreover, when the light intensity of the VCSEL is to be increased, it is known that light from the VCSEL includes a plurality of light emitting modes, such as a single mode and a multi-mode. FIG. 2 illustrates a specific example light emitting mode. Since (2) and (3), (4) and (6), (7) and (9), (8) and (10) that are rotationally symmetric to each other in the light emitting mode illustrated in FIG. 2 are always present at an equal ratio, when these similar modes are synthesized, respectively, as illustrated in FIG. 3, those can be consolidated to six kinds that are A, B, C, D, E, and F.

Figure 4:
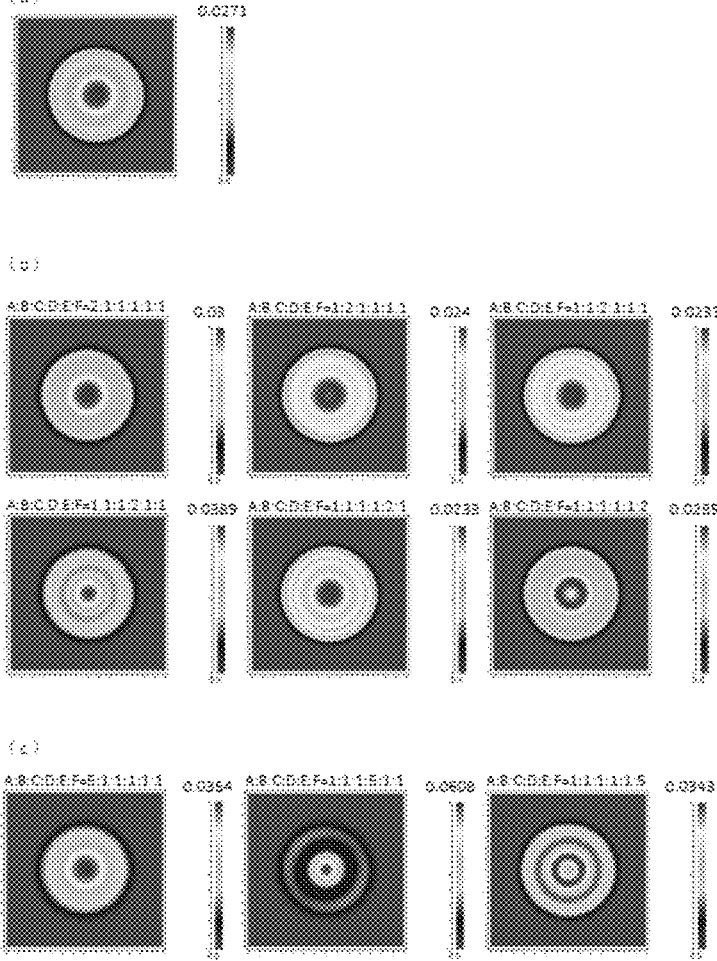
FIG. 4 is a diagram illustrating a light intensity of light which is synthesized while a rate is changed for each light emitting mode at a far-field.

When these six kinds of modes are synthesized at the same ratio (A:B:C:D:E:F=1:1:1:1:1:1), it becomes (a) in FIG. 4, and the maximum intensity is 0.0271. Note that the figure illustrates a light intensity at a far-field at each light distribution angle when the power of a light source is defined as 1.

Conversely, when these six kinds of modes are synthesized with only the one kind thereof being set as twice as the other modes, as illustrated in part (b) of FIG. 4, A:B:C:D:E:F=2:1:1:1:1:1 has the maximum intensity that is 0.03, A:B:C:D:E:F=1:1:1:2:1:1 has the maximum intensity that is 0.0389, and A:B:C:D:E:F=1:1:1:1:1:2 has the maximum intensity that is 0.0285. That is, it becomes clear that, among the respective modes, when the ratio of the mode A or D that has the maximum intensity at the center of an optical axis, or of the mode F that has the maximum intensity near the center of the optical axis is increased, in comparison with a case in which the six kinds of modes are set to be the same ratio, the maximum intensity of light after the synthesis increases. As for part (c) of FIG. 4, among the six kinds of modes, furthermore, only the mode A, the mode D, or the mode F is set as 5 times as the other modes, and synthesis is performed. A:B:C:D:E:F=5:1:1:1:1:1 has the maximum intensity that is 0.0354, A:B:C:D:E:F=1:1:1:5:1:1 has the maximum intensity that is 0.0608, and A:B:C:D:E:F=1:1:1:1:1:5 has the maximum intensity that is 0.0343. That is, regarding the synthesized light with the mode D set as 5 times (A:B:C:D:E:F=1:1:1:5:1:1), in particular, the maximum intensity of light after synthesis remarkably increases.

Based on the above facts, when a VCSEL that has a plurality of light emitting modes is utilized, the light source of the VCSEL can increase the light intensity of dot to be produced and can increase a contrast when the ratio of the light emitting mode that has the maximum intensity at the center of the optical axis among the light emitting modes is large, thus preferable. Hence, it is preferable that the ratio of the mode which has the maximum intensity at the center of the optical axis among the light emitting modes of the light source should be equal to or greater than 40%, more preferably, equal to or greater than 45%, and further preferably, equal to or greater than 60%. The light emitting mode may be simply adjusted by conventionally known scheme like controlling a current injection route for a light emitting layer of the VCSEL.

Figure 5:
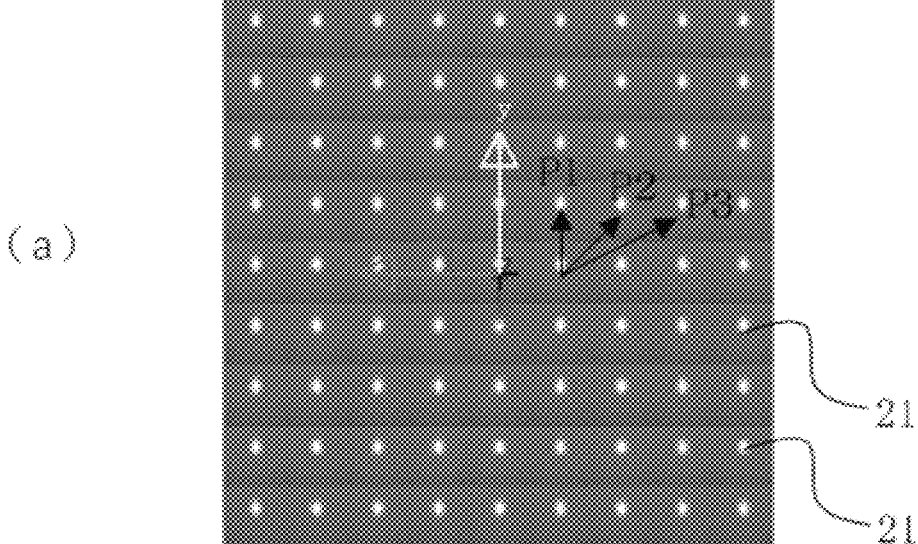
FIG. 5 is a schematic plan view illustrating an optical element according to the present disclosure.
Figure 5:
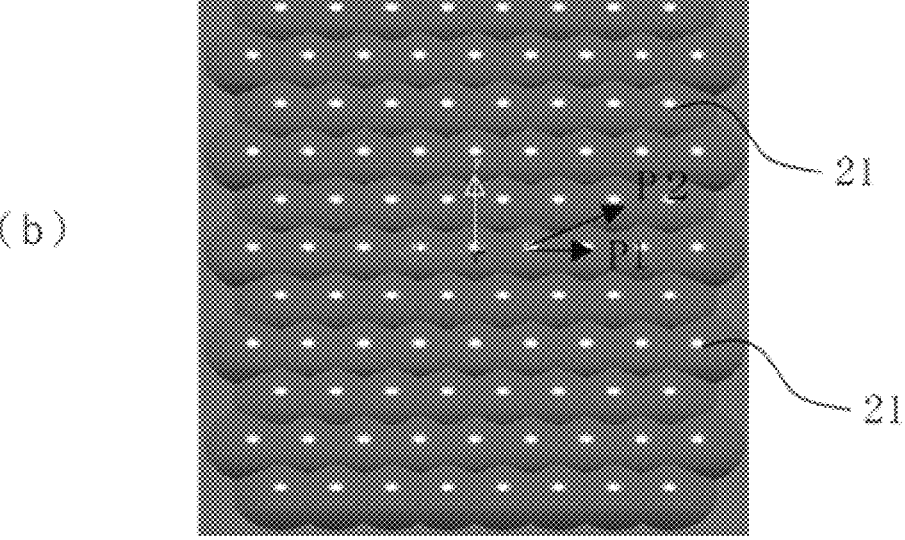

The optical element 2 has the lenses 21 which allow light with a wavelength λ to pass therethrough, and which are arranged periodically. The shape of the lens 21 can be designed freely in accordance with a spreading pattern of dot to be emitted (will be referred to as a dot pattern below). When, for example, the dot pattern is to be in a circular shape, the shape of the lens 21 may be made rotationally symmetric like a spherical lens. Moreover, when the dot pattern is to be in a non-circular shape, the shape of the lens 21 may be made non-rotationally symmetric like an aspheric lens, and adjusted as needed. An example specific lens shape is, in addition to a convex lens or a concaved lens, a saddle-type lens that can be seen as a convex lens or a concaved lens in a cross-sectional view. Moreover, regarding the periodic arrangement, as illustrated in part (a) of FIG. 5, the lenses 21 each in a square shape or in a rectangle shape in a planar view may be arranged in a tetragonal manner, or as illustrated in part (b) of FIG. 5, the lenses 21 each in a hexagonal shape in a planar view may be arranged in a hexatic manner.

(Distance Between Emitting Unit and Optical Element)

Moreover, when the wavelength of incident light from the emitting unit 1 is λ, the pitch of the lenses 21 of the optical element 2 is P, and the distance between the emitting unit 1 and the optical element 2 is $L_0$, lights are made intensive with each other when the distance $L_0$ satisfies the following formula A.

[Equation 3]

$$L_0 = \frac{P^2}{2\lambda}$$ (Formula A)

Note that, in this specification, the distance between the emitting unit 1 and the optical elements 2 means a distance from the light emitting surface of the light source of the emitting unit to the surface of the lens 21 of the optical element at a side near the light source. In practice, although an error due to the size of the lens 21 occurs, since the distance between the emitting unit 1 and the lens 21 of the optical element 2 is quite larger than the size of the lens 21 in the vertical direction (the direction along the optical axis), even if such a definition is made, a sufficient precision is still ensured.

Moreover, it becomes clear that lights are made greatly intensive like the following formula B when the distance L between the emitting unit 1 and the optical element 2 is n times (where n is a natural number that is equal to or greater than 1) of a distance $L_0$. Furthermore, it becomes clear that lights are made greatly intensive when n is an even number.

[Equation 4]

$$L = \frac{nP^2}{2\lambda} \quad \text{(Formula B)}$$

Note that it is preferable that an error in the distance L between the emitting unit 1 and the optical element 2 should be less than 10% of $L_0$, preferably, less than 5%, and further preferably, less than 3% When it is specifically expressed that an error in the distance L is less than 10% of $L_0$ in the form of a formula, it can be expressed as the following formula C.

[Equation 5]

$$\frac{(n - 0.1)P^2}{2\lambda} \leqq L \leqq \frac{(n + 0.1)P^2}{2\lambda} \quad \text{(Formula C)}$$

Moreover, the lenses 21 may have a plurality of periods. For example, as illustrated in part (a) of FIG. 2, when the lenses 21 each in a square shape in a planar view are arranged in a tetragonal manner, in addition to a pitch $P_1$ between the adjacent lenses, there are various pitches, such as a pitch $P_2$ ($=\sqrt{2}P1$) and a pitch $P_3$ ($=\sqrt{5}P1$) in a diagonal direction. Moreover, as illustrated in part (b) of FIG. 2, when the regular-hexagonal lenses 21 in a planar view are arranged in a hexatic manner, in addition to a pitch $P_1$ between the adjacent lenses, there is a pitch $P_2$ ($=\sqrt{6}P1$), etc. Furthermore, the lenses 21 may have a plurality of different periods like a case in which lenses each in a rectangular shape in a planar view are arranged regularly. In this case, when the size of the k-th (where k is a natural number that is equal to or greater than 1) pitch from the smallest among the pitches of the lens 21 is defined as $P_k$, it is appropriate that, for equal to or greater than any one of the pitches $P_k$, a distance $L_1$ between the emitting unit 1 and the optical element 2 satisfies the following formula 1.

[Equation 6]

$$\frac{(n - 0.1)P_k^2}{2\lambda} \leqq L_1 \leqq \frac{(n + 0.1)P_k^2}{2\lambda} \quad \text{(Formula 1)}$$

Note that it is preferable to adjust the distance L between the emitting unit 1 and the optical element 2 in such a way that equal to or greater than any two of the pitches $P_k$ satisfy the formula 1. In this case, since diffraction has the largest effect although the pitch is the smallest, it is preferable that the smallest pitch $P_1$ should satisfy the formula 1, and further preferably, the second smallest pitch $P_2$ should also satisfy the formula 1.

Note that when the pitch P becomes too smaller than the wavelength $\lambda$ of light from the light source 10, it becomes difficult to cause diffraction. Hence, as far as the enough lenses 21 to cause diffraction are present within a light distribution angle of the light source 10, it is preferable that the pitch P should be sufficiently greater than the wavelength $\lambda$ of light from the light source 10, and for example, equal to or greater than five times, preferably, equal to or greater than 10 times are preferable.

Next, simulations were carried out for a light intensity distribution, etc., at a far-field when the distance L between the emitting unit 1 and the optical element 2 was changed variously.

(Simulation 1)

Figure 6:
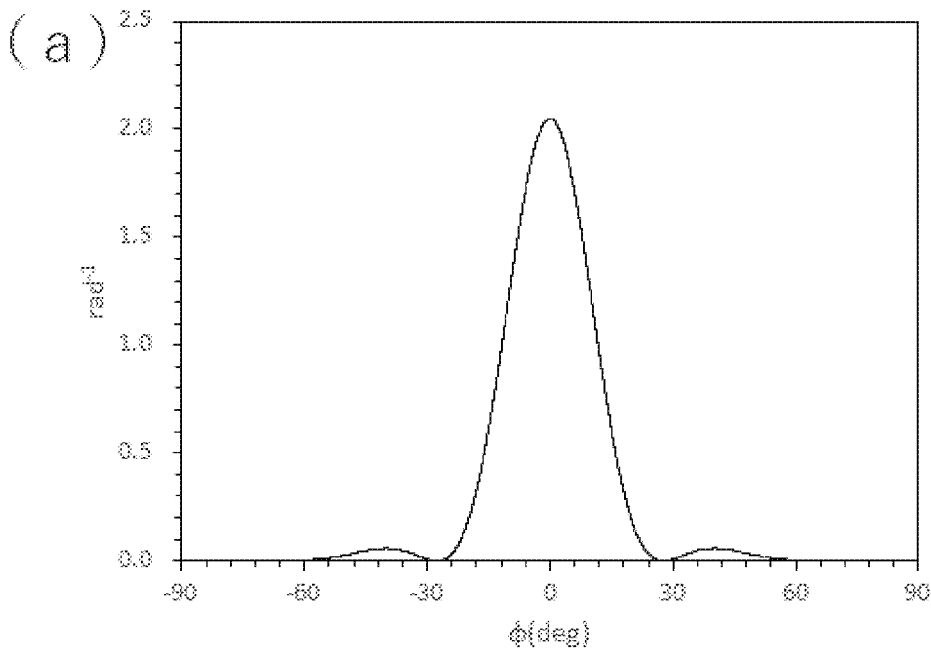
FIG. 6 is a diagram for describing a simulation 1.
Figure 6:
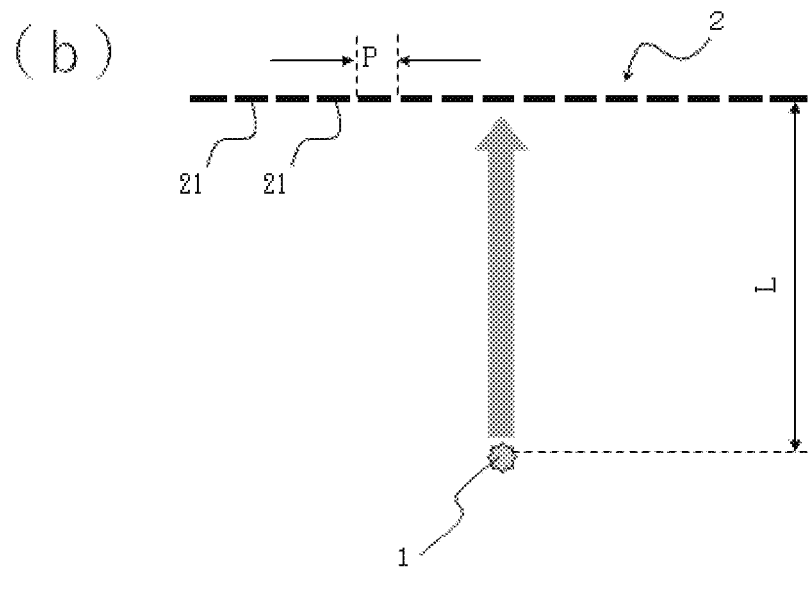
Figure 7:
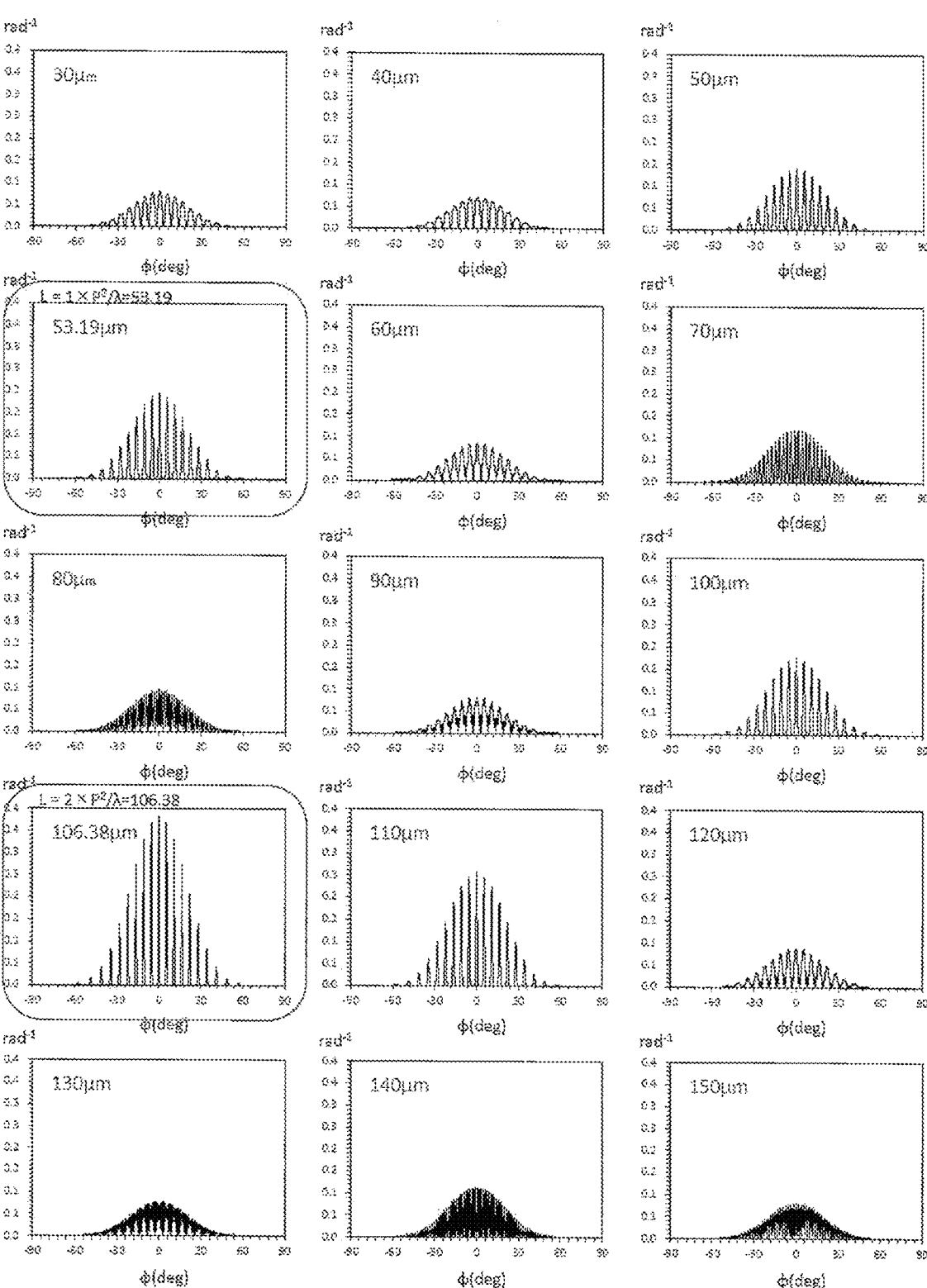
FIG. 7 is a diagram illustrating a light intensity at a far-field in the simulation 1 (30 to 150 μm)
Figure 8:
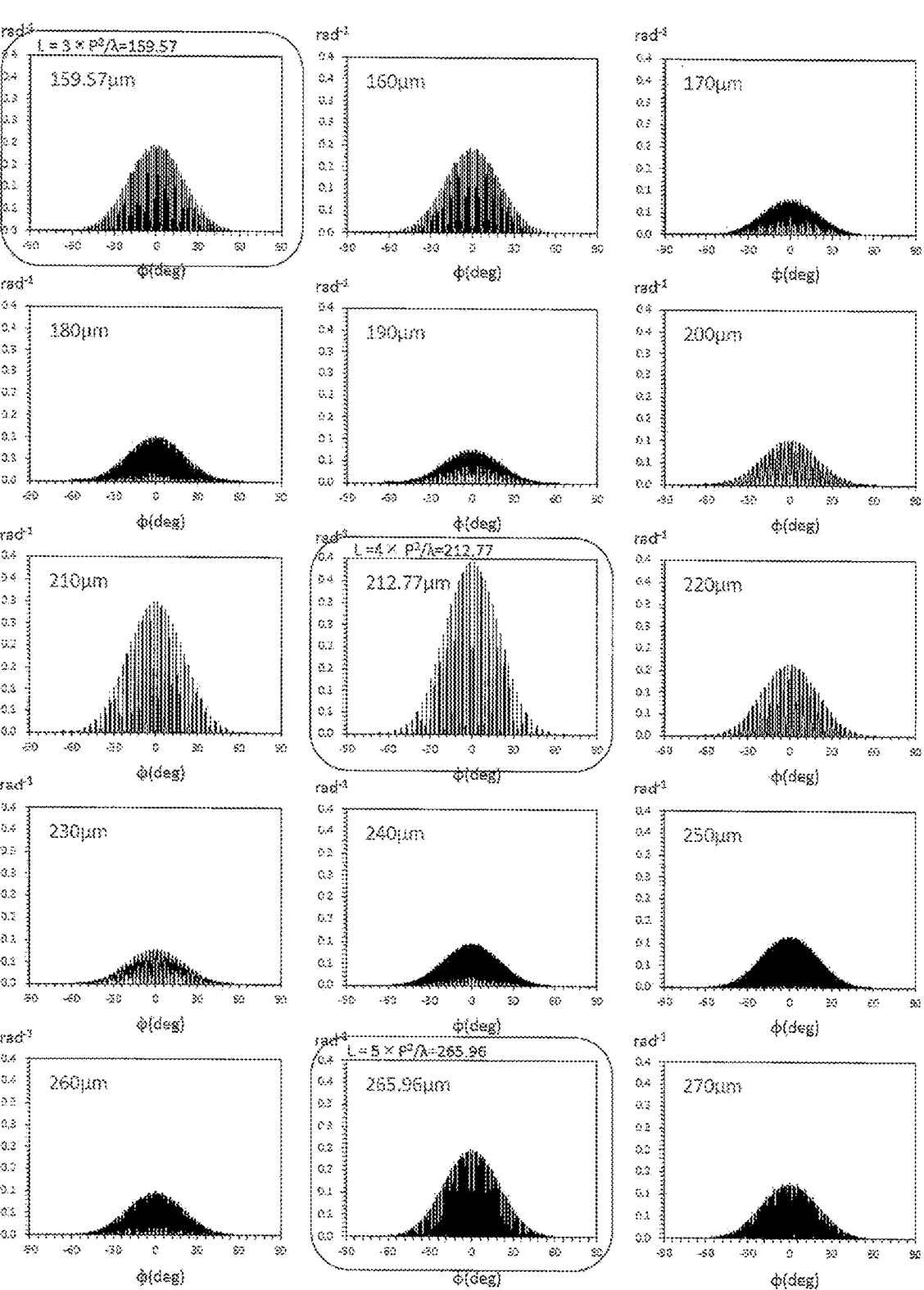
FIG. 8 is a diagram illustrating a light intensity at a far-field in the simulation 1 (159.57 to 270 μm)
Figure 9:
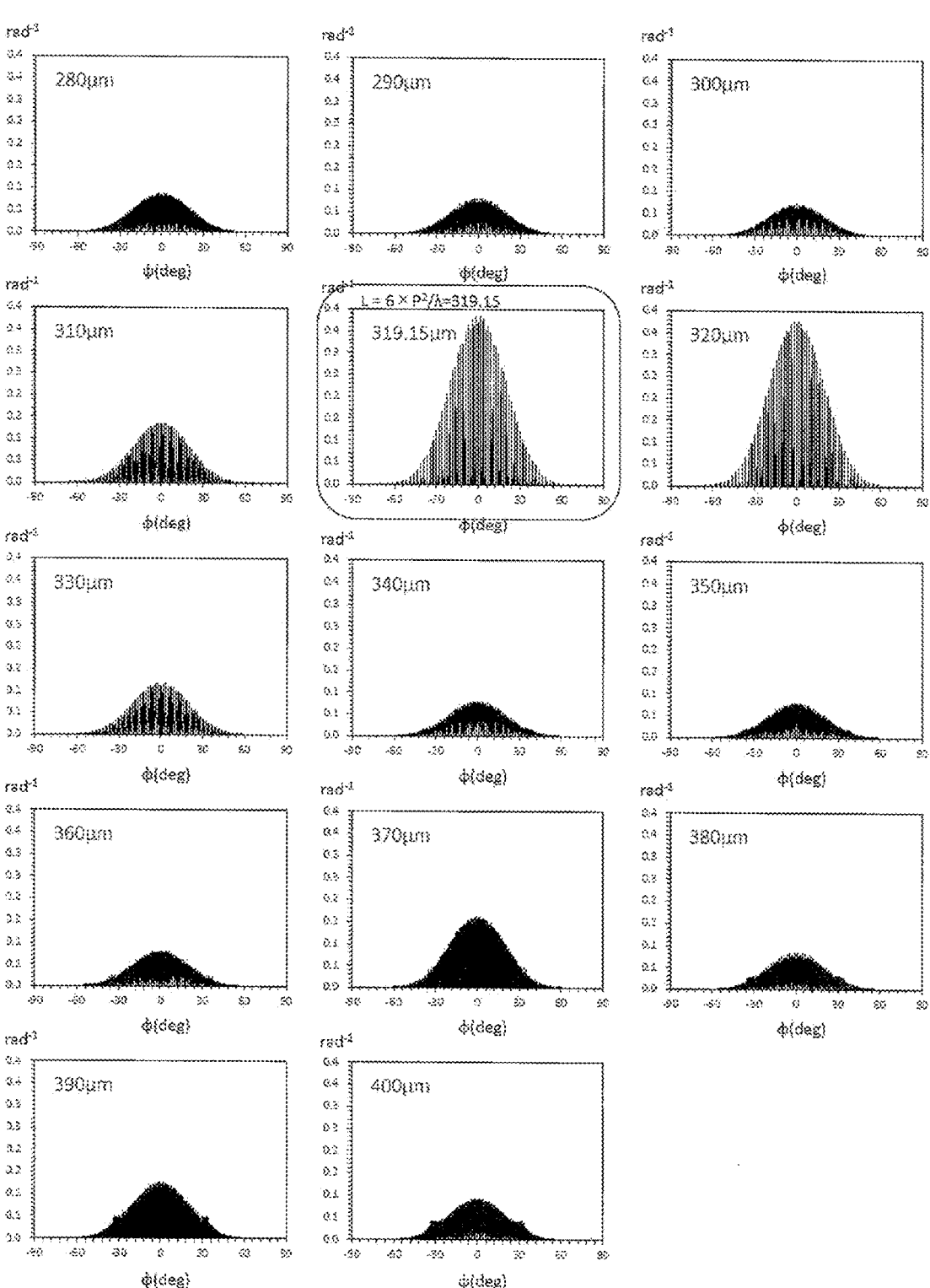
FIG. 9 is a diagram illustrating a light intensity at a far-field in the simulation 1 (280 to 400 μm)
Figure 10:
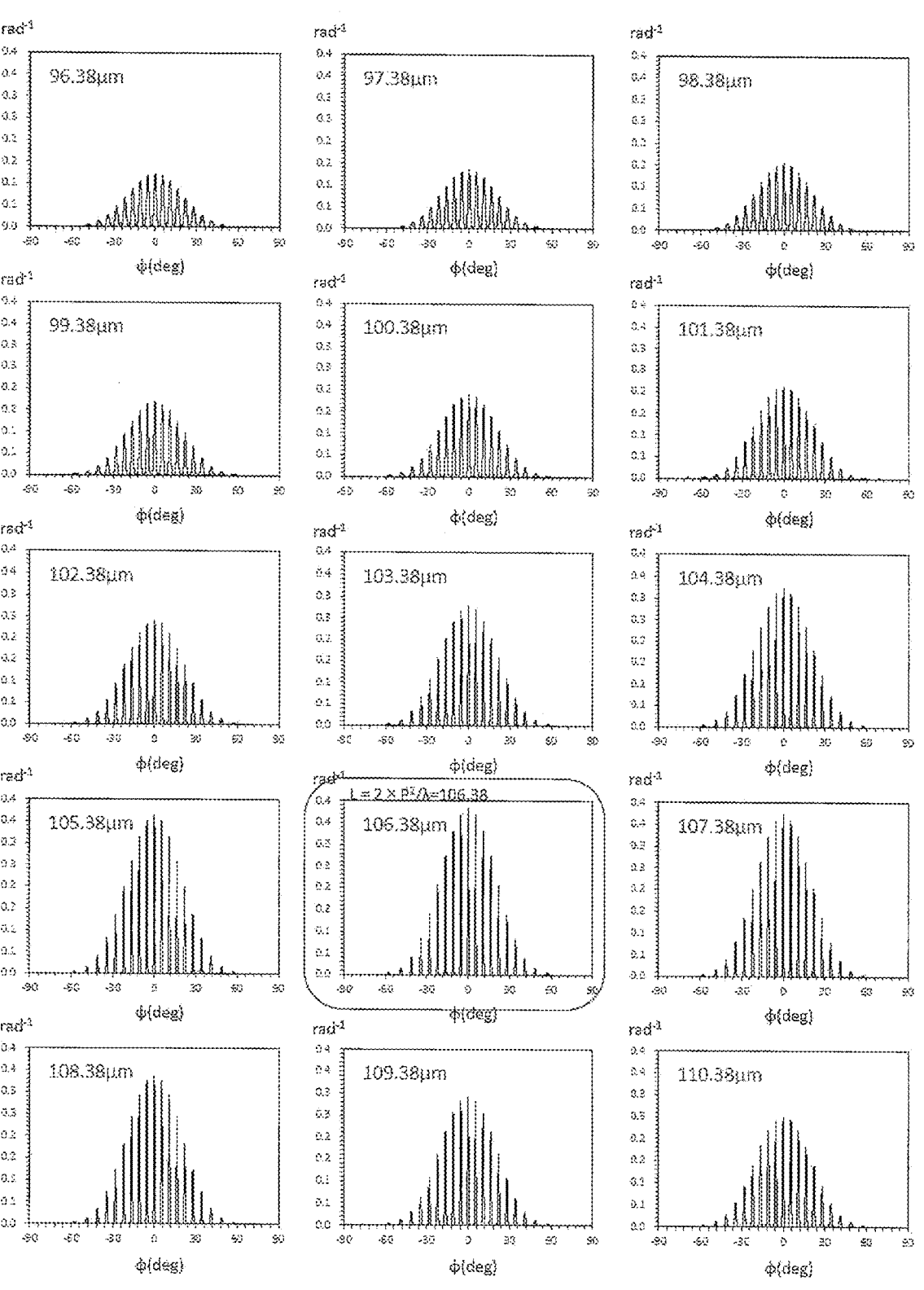
FIG. 10 is a diagram illustrating a light intensity at a far-field in the simulation 1 (96.38 to 110.38 μm)
Figure 11:
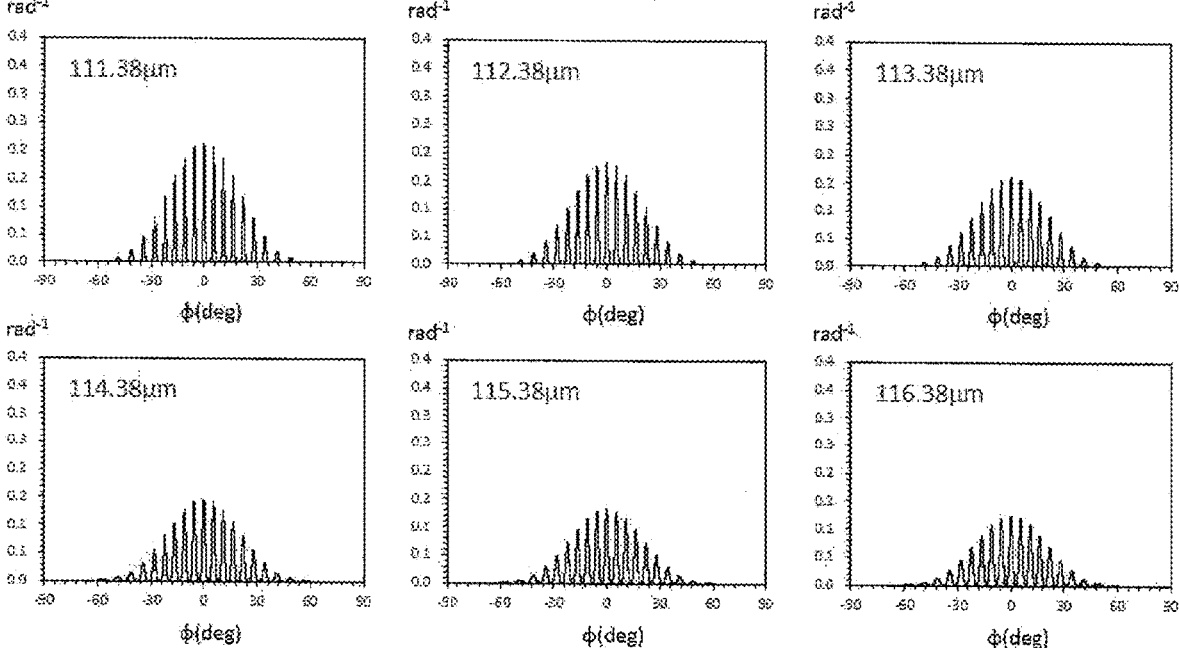
FIG. 11 is a diagram illustrating a light intensity at a far-field in the simulation 1 (111.38 to 116.38 μm)
Figure 12:
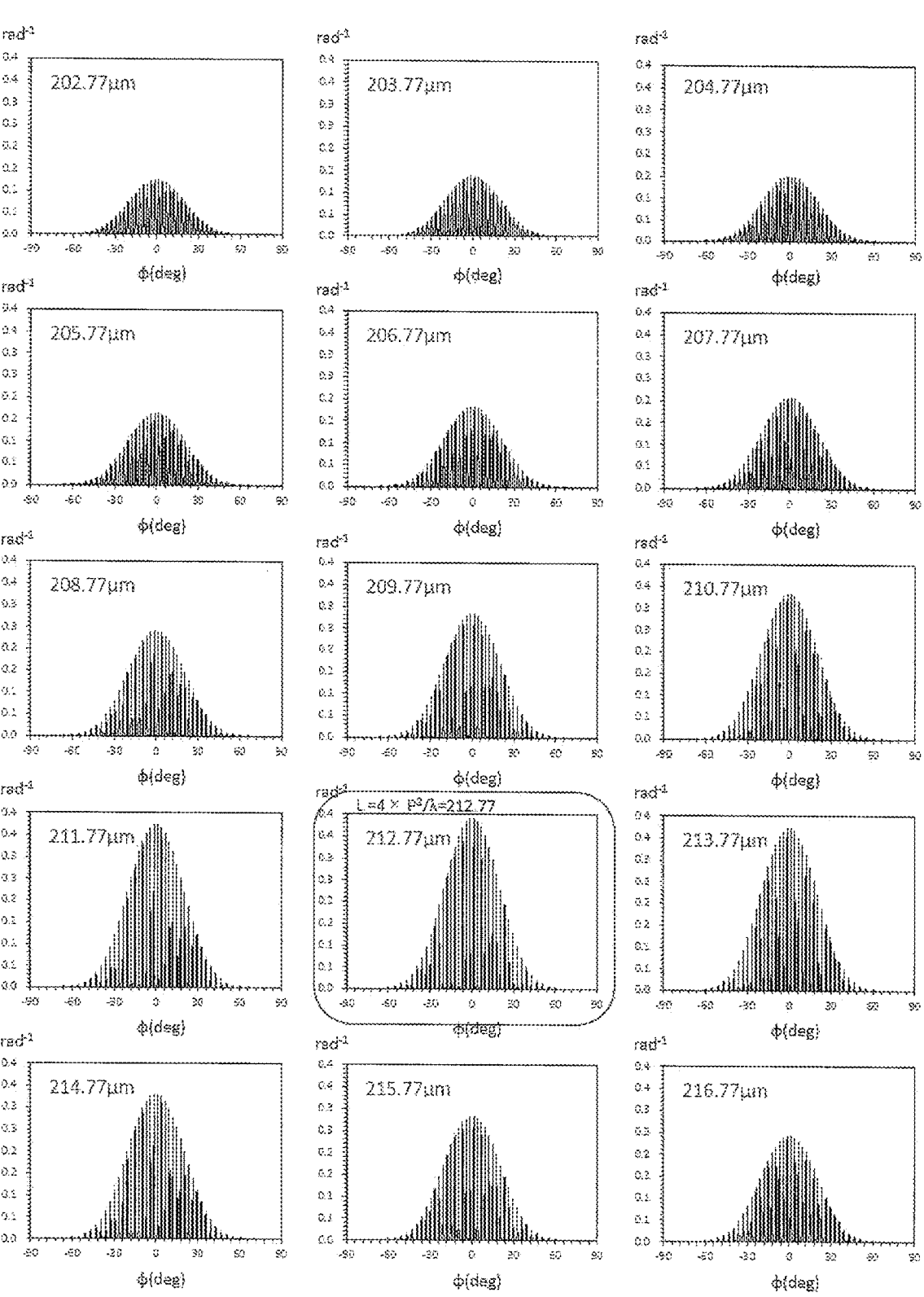
FIG. 12 is a diagram illustrating a light intensity at a far-field in the simulation 1 (202.77 to 216.77 μm)
Figure 13:
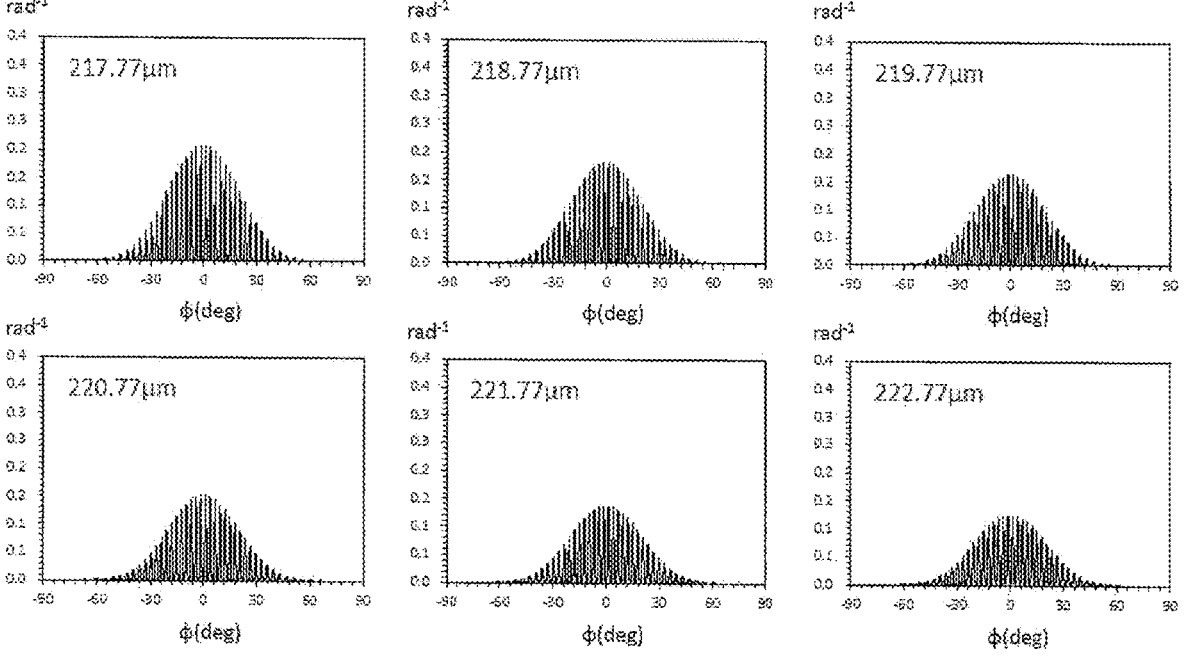
FIG. 13 is a diagram illustrating a light intensity at a far-field in the simulation 1 (217.77 to 222.77 μm)
Figure 14:
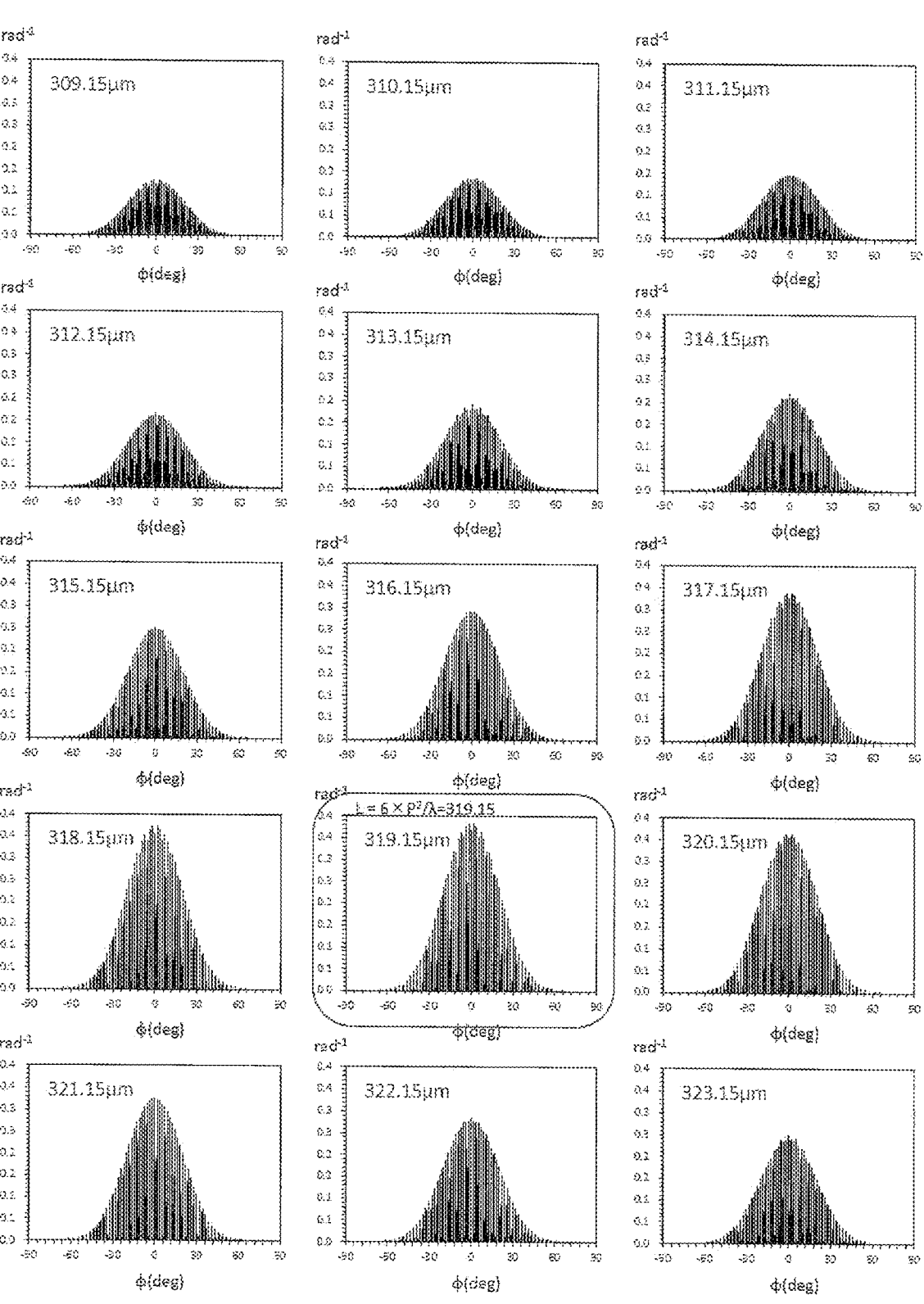
FIG. 14 is a diagram illustrating a light intensity at a far-field in the simulation 1 (309.15 to 323.15 μm)
Figure 15:
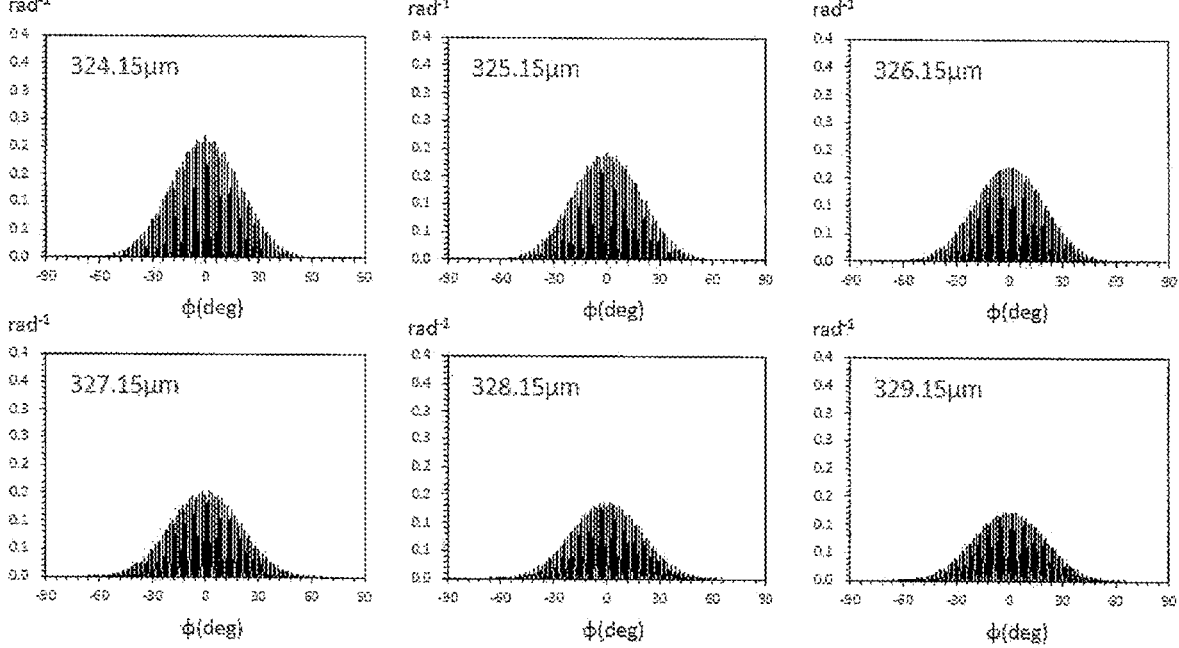
FIG. 15 is a diagram illustrating a light intensity at a far-field in the simulation 1 (324.15 to 329.15 μm)

The emitting unit 1 was a single light source that emitted light which had a wavelength of 940 nm and which was Gaussian light distribution as illustrated in part (a) of FIG. 6. Moreover, the optical element 2 had slit-shape openings arranged at a pitch of 10 μm as schematically illustrated in part (b) of FIG. 6. Note that the portions of the optical element other than the slits were materials that completely absorbed light. Moreover, the distance L between the emitting unit 1 and the optical element 2 was set to be 38 kinds that were changed 10 μm by 10 μm from 30 μm to 400 μm, and also six kinds that were 53.19 μm (n=1), 106.38 μm (n=2), 159.67 μm (n=3), 212.77 μm (n=4), 265.96 μm (n=5), and 319.15 μm (n=6) when n in the formula A was 1 to 6. FIGS. 7 to 9 illustrate simulation results when an optical simulation software BeamPROP (available from Synopsys Inc.,) was applied. Note that the horizontal axis represents a light distribution angle, and the vertical axis represents a light intensity at a far-field in each light distribution angle when the power of a light source was defined as 1.

Moreover, simulations were also carried out for three kinds that were 106.38 μm (n=2), 212.77 μm (n=4), and 319.15 μm (n=6) when n in the formula A was 2, 4 and 6, with each kind being changed 1 μm by 1 μm and totally by 10 μm back and forth. FIGS. 10 to 15 illustrate the simulation results.

It becomes clear that, from the simulation results, when the distance L is 53.19 μm (n=1), 106.38 μm (n=2), 159.67 μm (n=3), 212.77 μm (n=4), 265.96 μm (n=5), and 319.15 μm (n=6), the light intensity distribution shows a clear peak. Moreover, it becomes clear that, in the case of 106.38 μm (n=2), 212.77 μm (n=4), and 319.15 μm (n=6) when n is an even number, the light intensity of each peak is also large. Furthermore, it becomes clear that when the distance L satisfies the formula 1, a relatively clear peak is maintained and even if a slight error is present in the distance L, the light intensity is sufficiently high.

(Simulation 2)

Figure 16:
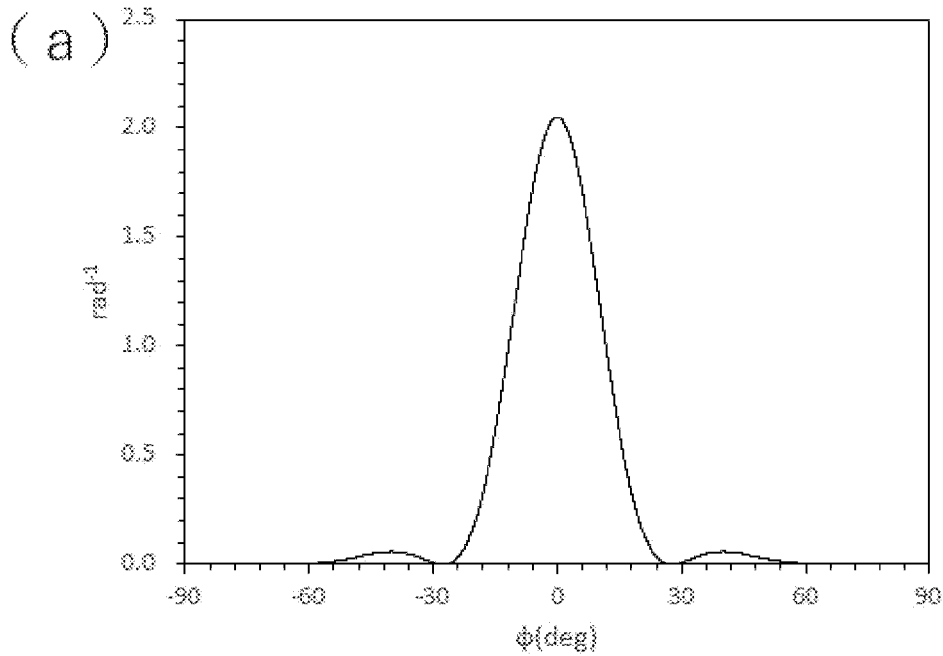
FIG. 16 is a diagram for describing a simulation 2.
Figure 16:
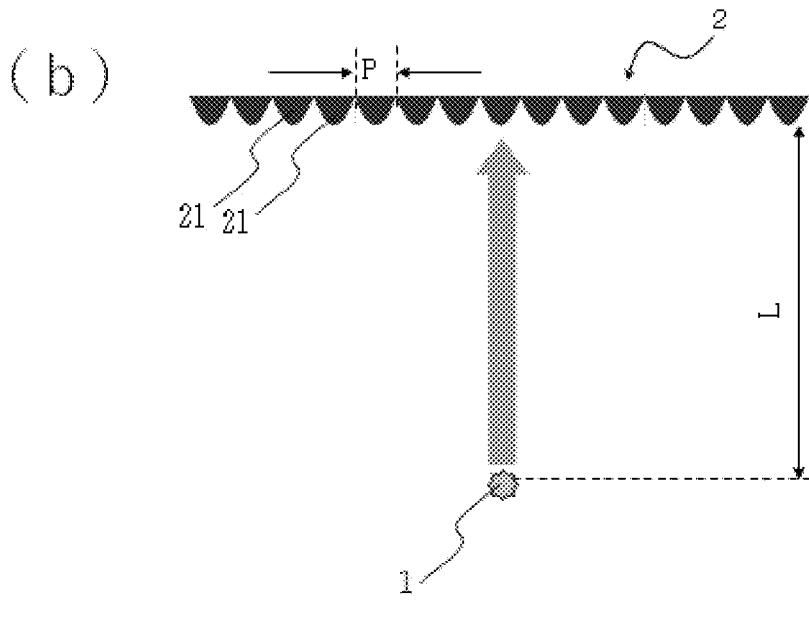
Figure 17:
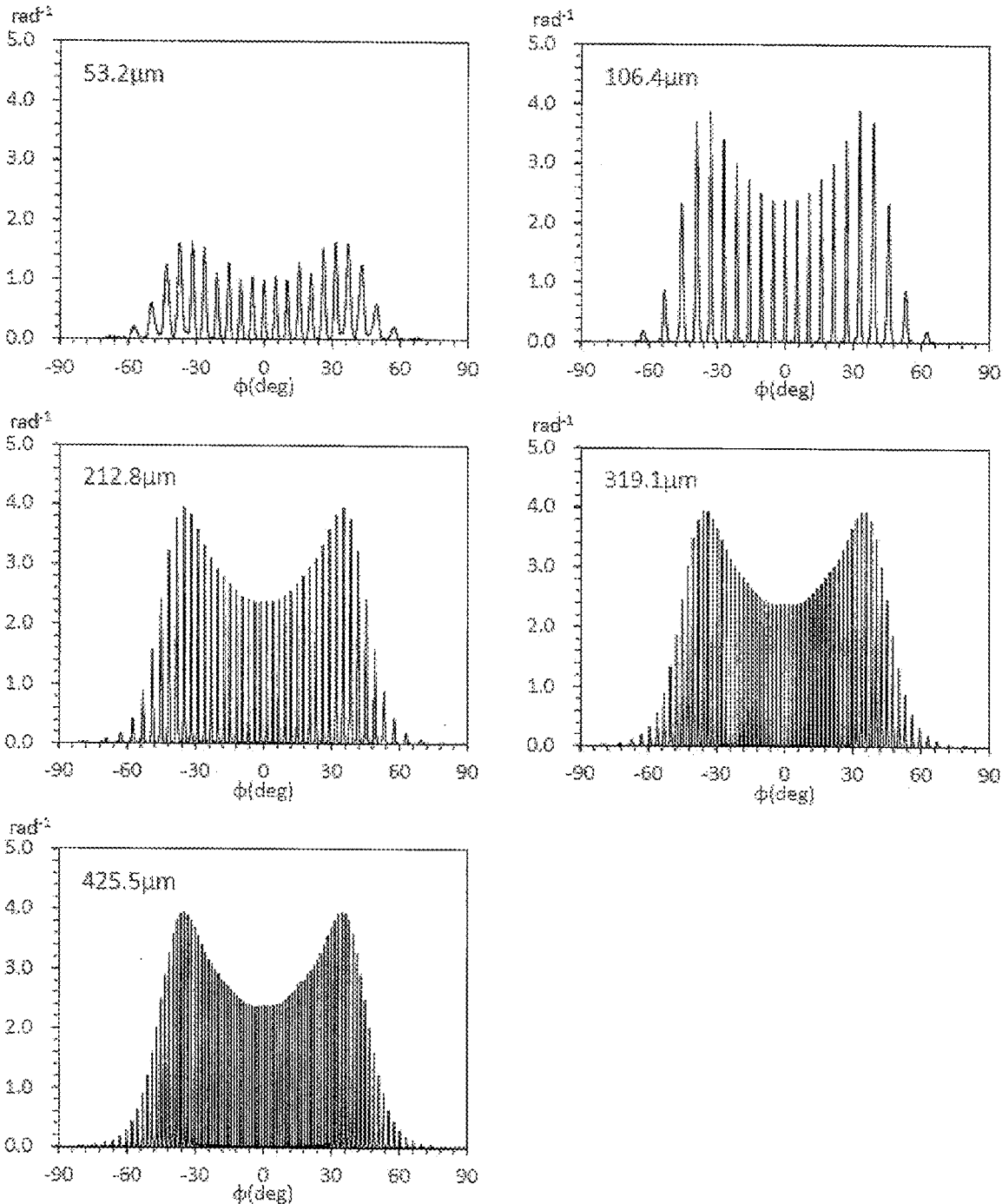
FIG. 17 is a diagram illustrating a light intensity at a far-field in the simulation 2.

The emitting unit 1 was a single light source that emitted light which had a wavelength of 940 nm and which was Gaussian light distribution as illustrated in part (a) of FIG. 16. Moreover, the optical element 2 had lenses 21 each having a height of 7 μm and arranged periodically at a pitch of 10 μm as illustrated in part (b) of FIG. 16. Moreover, the lens surface was in a non-circular-arc shape. As for the material, a PDMS that had an index of refraction which was 1.53 was assumed. As for the distance L, five kinds that were 53.2 μm (n=1), 106.4 μm (n=2), 212.8 μm (n=4), 319.1 μm (n=6), and 425.5 μm (n=8) when n in the formula A was 1, 2, 4, 6, and 8 were applied. FIG. 17 illustrate simulation results when the optical simulation software BeamPROP (available from Synopsys Inc.,) was applied. Note that the horizontal axis represents a light distribution angle, and the vertical axis represents a light intensity at a far-field in each light distribution angle when the power of a light source was defined as 1.

It becomes clear from the simulation results that even if the optical element 2 has the plurality of lenses 21 arranged, when the distance L is 53.2 μm (n=1), 106.4 μm (n=2), 212.8 μm (n=4), 319.1 μm (n=6), and 425.5 μm (n=8), a clear peak appears, and the light intensity of each peak is also high. Moreover, it also becomes clear that in the case of 106.4 μm (n=2), 212.8 μm (n=4), 319.1 μm (n=6), and 425.5 μm (n=8) when n is an even number, the light intensity of each peak is high.

(Simulation 3)

Figure 18:
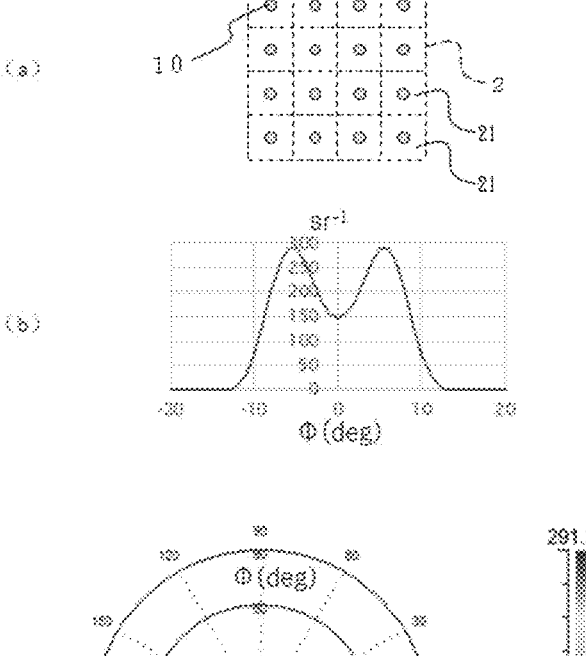
FIG. 18 is a diagram illustrating an arrangement of a light source and a light distribution characteristic in a simulation 3.
Figure 19:
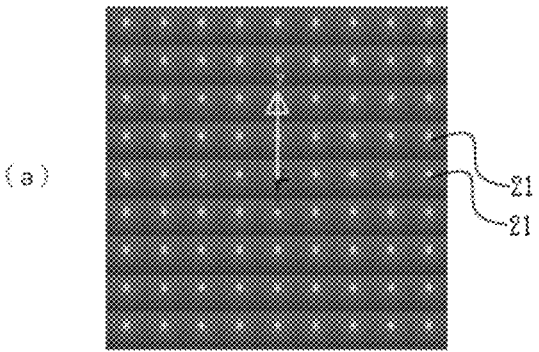
FIG. 19 is a diagram illustrating an optical element in the simulation 3.
Figure 19:
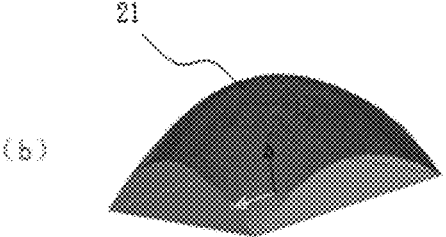
Figure 20:
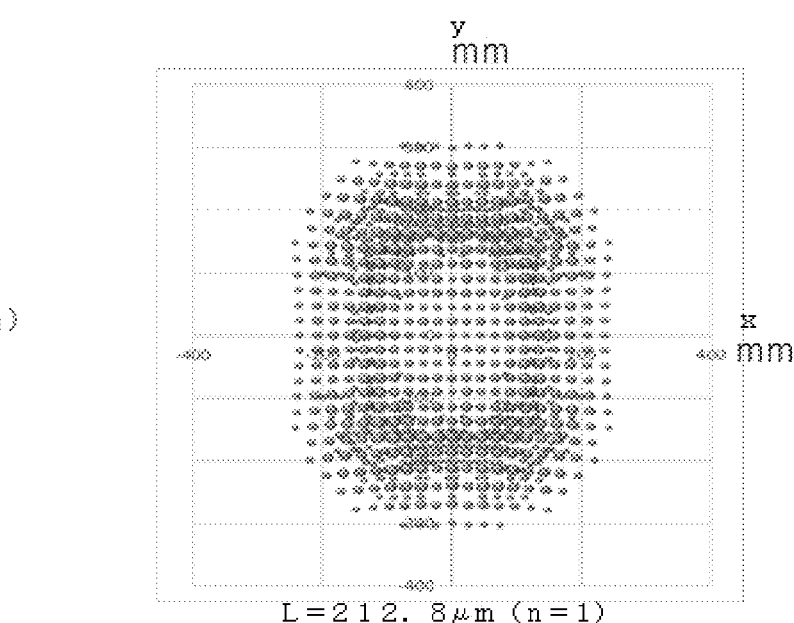
FIG. 20 is a diagram illustrating a light intensity at a far-field in the simulation 3 (when n=1)
Figure 20:
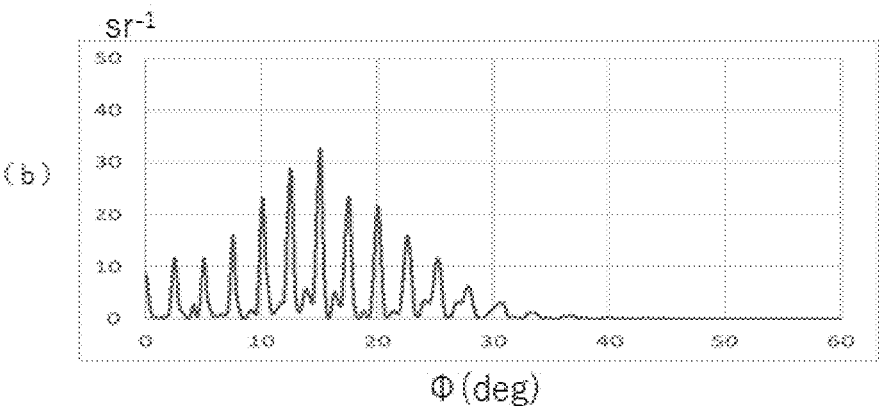
Figure 20:
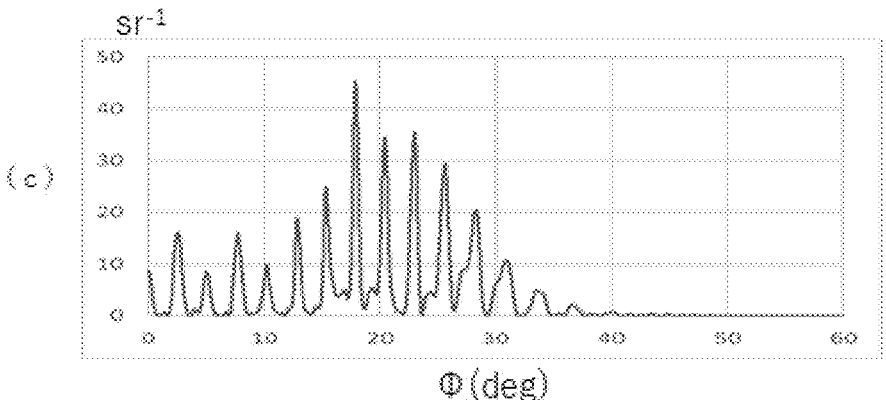
Figure 21:
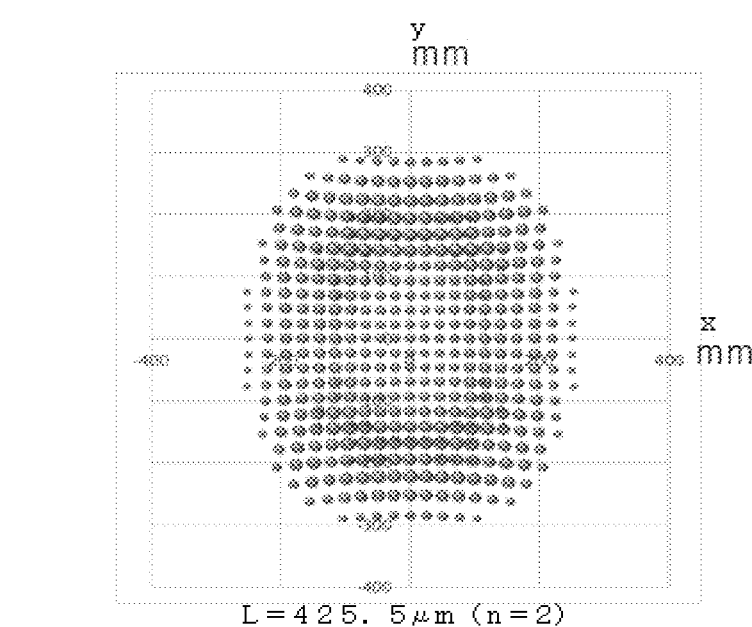
FIG. 21 is a diagram illustrating a light intensity at a far-field in the simulation 3 (when n=2)
Figure 21:
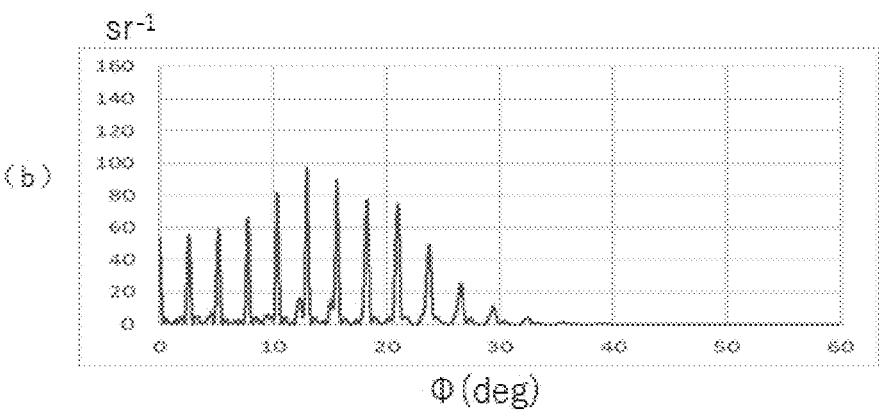
Figure 21:
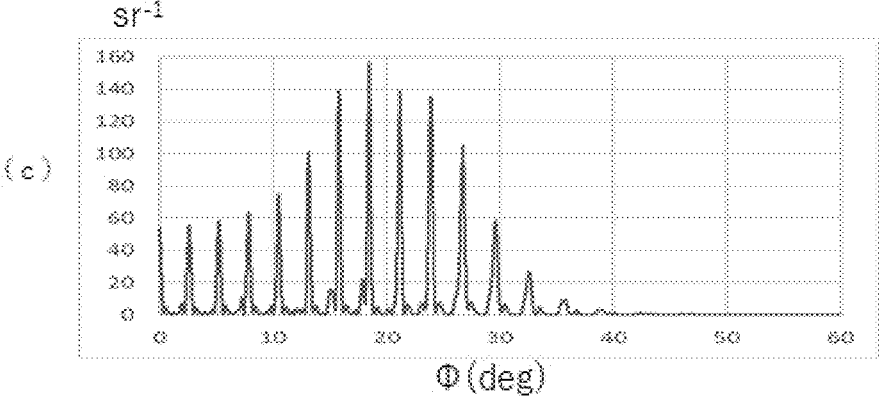
Figure 22:
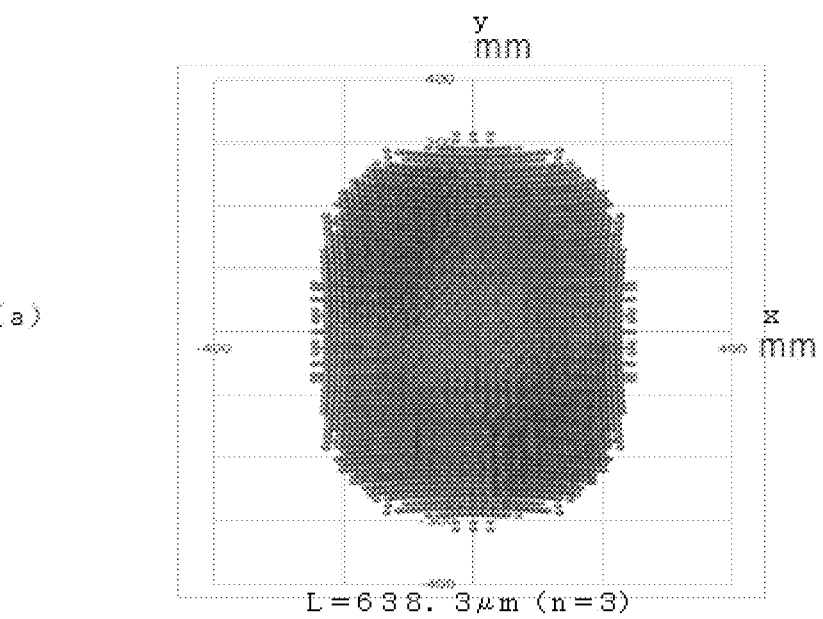
FIG. 22 is a diagram illustrating a light intensity at a far-field in the simulation 3 (when n=3)
Figure 22:
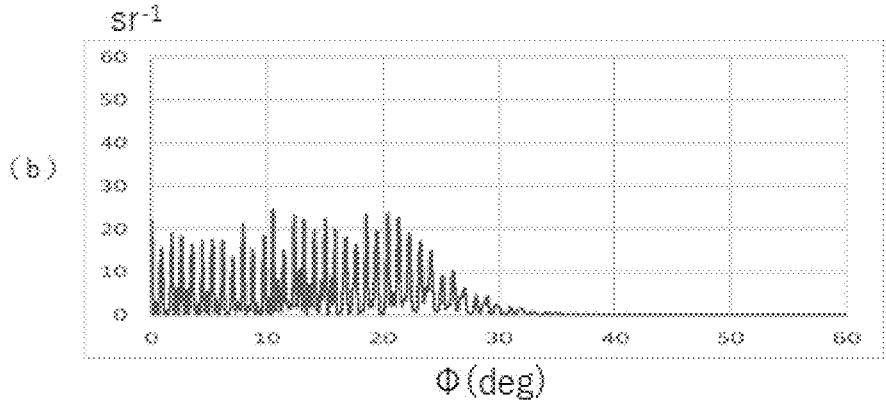
Figure 22:
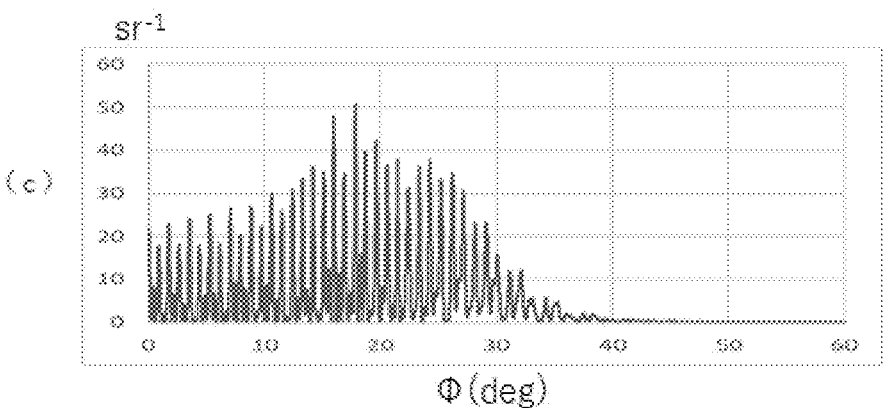

The emitting unit 1 was multiple light sources that had the light sources 10 each of which emitted light with a wavelength of 940 nm and which were arranged in a tetragonal manner as illustrated in part (a) of FIG. 18. Moreover, the applied light to be emitted by the light source was bat-wing light distribution as illustrated in part (b) of FIG. 18, and had a light intensity as illustrated in part (c) of FIG. 18 at a far-field. The optical element 2 had the lenses 21 arranged in a tetragonal manner at a pitch of 20 μm as illustrated in part (a) of FIG. 19. Moreover, as illustrated in part (b) of FIG. 19, in a planar view, regarding the shape of each lens 21, it was a square shape having respective sides each being 20 μm, and a height was 9.86 μm. Furthermore, a lens surface was an aspheric and non-rotationally-symmetric surface that had different curvatures in an x-axis direction and in a y-axis direction. As for the material, a PDMS that had an index of refraction which was 1.53 was assumed. The distances L were 212.8 μm (n in the formula A=1), 425.5 μm (n in the formula A=2), and 638.3 μm (n in the formula A=3). FIGS. 20 to 22 illustrate simulation results when an optical simulation software BeamPROP (available from Synopsys Inc.,) was applied. Note that part (a) in each of FIGS. 20 to 22 illustrates a dot pattern at a site 50 cm ahead of the optical element 2. The size of the dot represents the magnitude of light intensity. Moreover, part (b) in each of FIGS. 20 to 22 illustrates a light intensity of light at a far-field on an x-axis in part (a) of each of FIGS. 20 to 22, and part (c) of each of FIGS. 20 to 22 illustrates a light intensity of light at a far-field on a y-axis in part (a) of each of FIGS. 20 to 22. Note that the horizontal axis represents a light distribution angle, and the vertical axis represents a light intensity at a far-field in each light distribution angle when the power of a light source was defined as 1.

Figure 23:
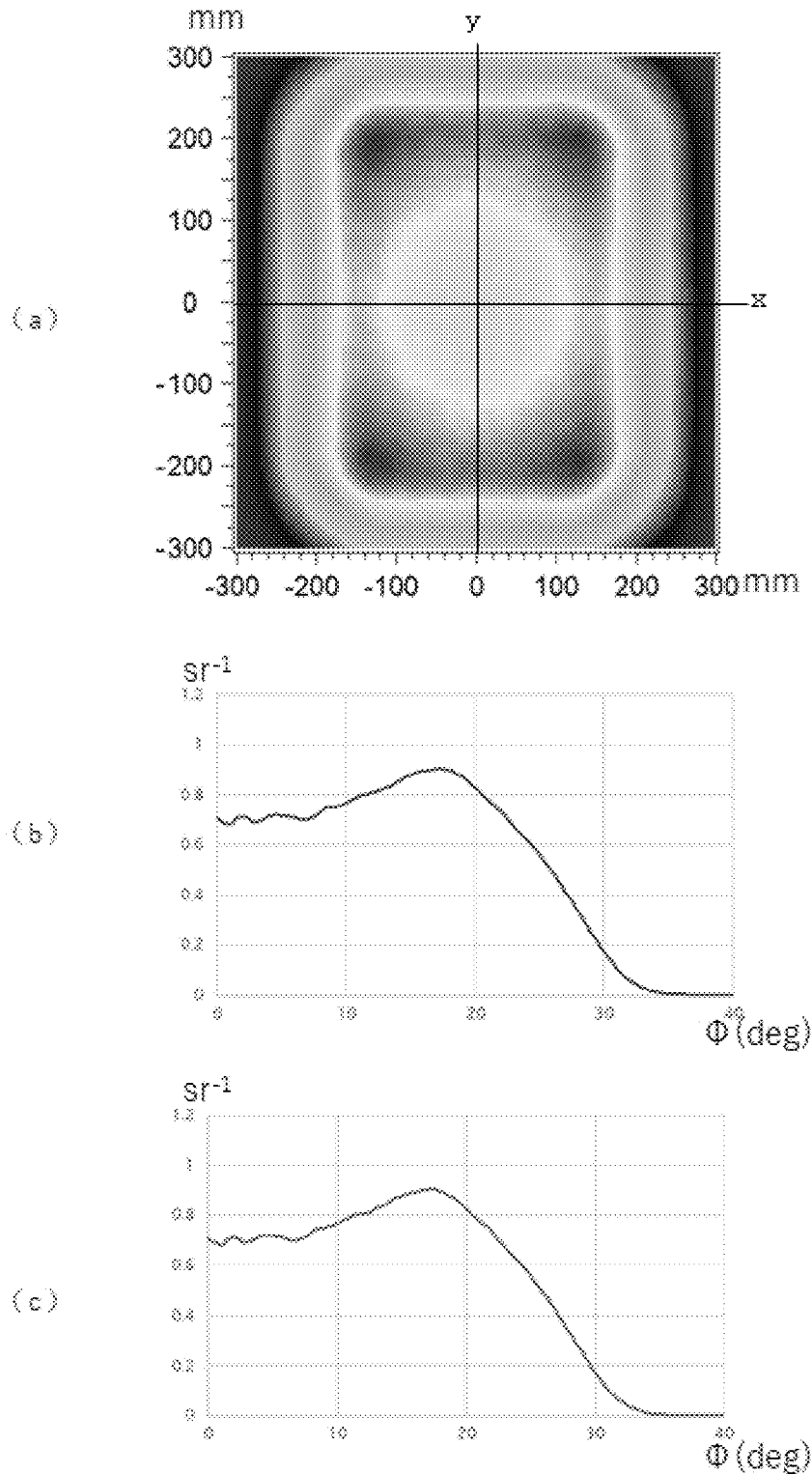
FIG. 23 is a diagram illustrating a light intensity at a far-field according to a comparative example for the simulation 3.

Moreover, as a comparative example, a simulation was carried out when a diffuser was applied which was capable of forming an emitting pattern in the substantially same shape as the above-described dot pattern. FIG. 23 illustrates a simulation result when an optical simulation software LightTools (available from Synopsys Inc.,) was applied. Part (a) of FIG. 23 illustrates an emitting pattern at a site 50 cm ahead of the diffuser. Moreover, part (b) of FIG. 23 illustrates a light intensity of light at a far-field on an x-axis in part (a) of FIG. 23, and part (c) of FIG. 23 illustrates a light intensity of light at a far-field on a y-axis in part (a) of FIG. 23.

It becomes clear from the simulation results that the dot pattern has a peak clearly appearing, and the light intensity of each peak is high. Moreover, it becomes clear that, in comparison with a case in which the diffuser was applied, the light intensity of each peak is remarkably high. Furthermore, when the lenses of the optical element 2 were arranged in a tetragonal manner, there was a pitch of 28.3 μm also in the diagonal direction. It becomes clear that, since L that had the pitch satisfying the formula A was 425.5 μm, the result in FIG. 21 has respective peaks aligned smoothly in comparison with the result in FIG. 20, the light intensity is also high.

(Simulation 4)

Figure 24:
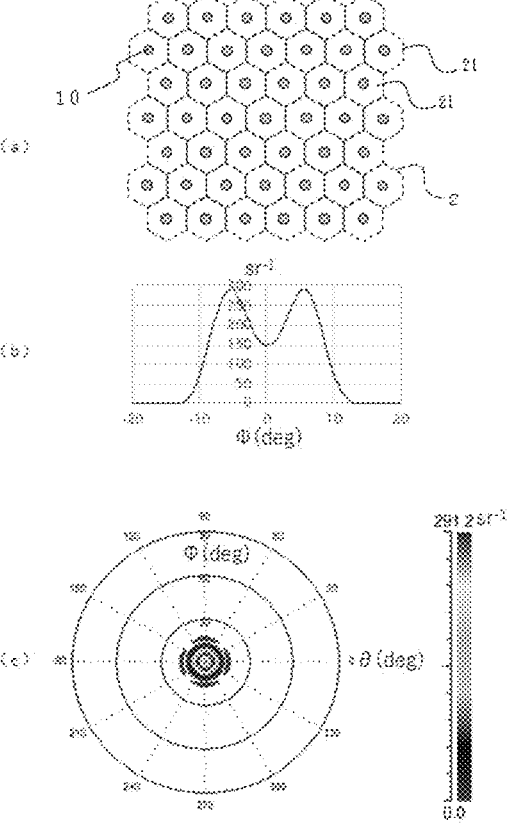
FIG. 24 is a diagram illustrating an arrangement of a light source and a light distribution characteristic in a simulation 4.
Figure 25:
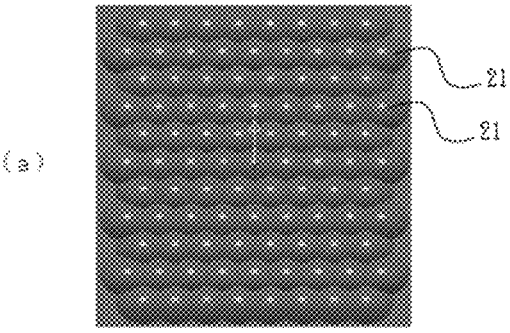
FIG. 25 is a diagram illustrating an optical element in the simulation 4.
Figure 25:
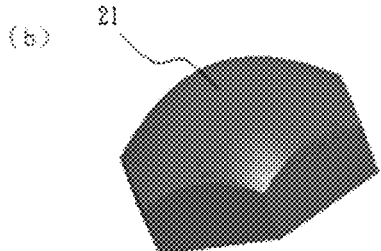
Figure 26:
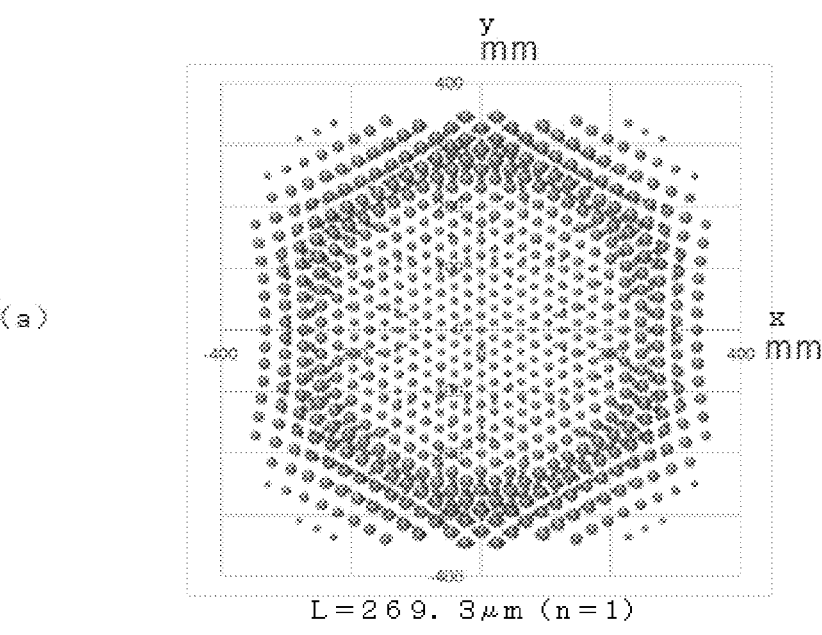
FIG. 26 is a diagram illustrating a light intensity at a far-field in the simulation 4 (when n=1)
Figure 26:
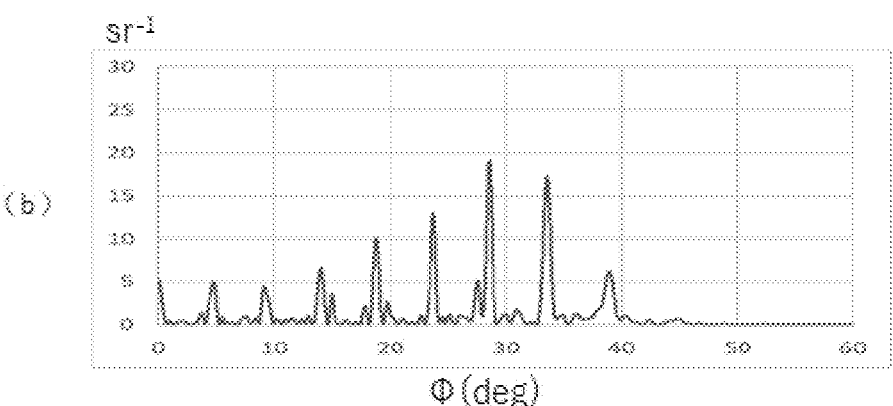
Figure 26:
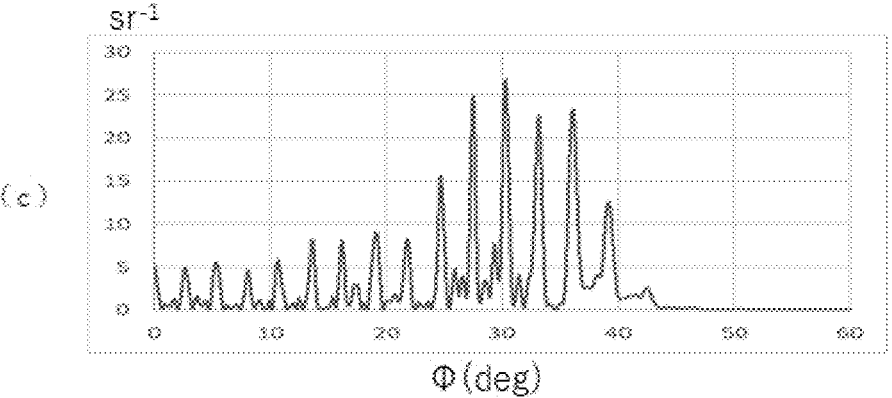
Figure 27:
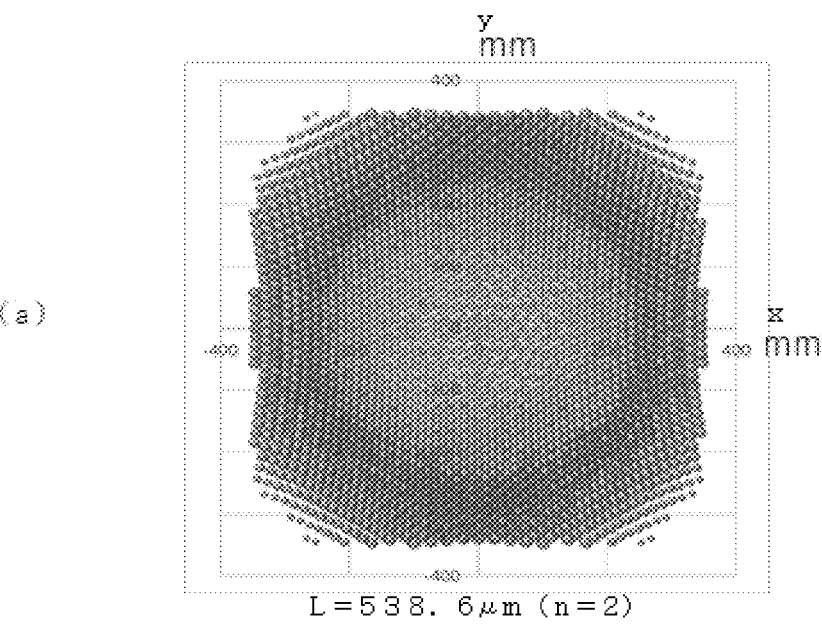
FIG. 27 is a diagram illustrating a light intensity at a far-field in the simulation 4 (when n=2)
Figure 27:
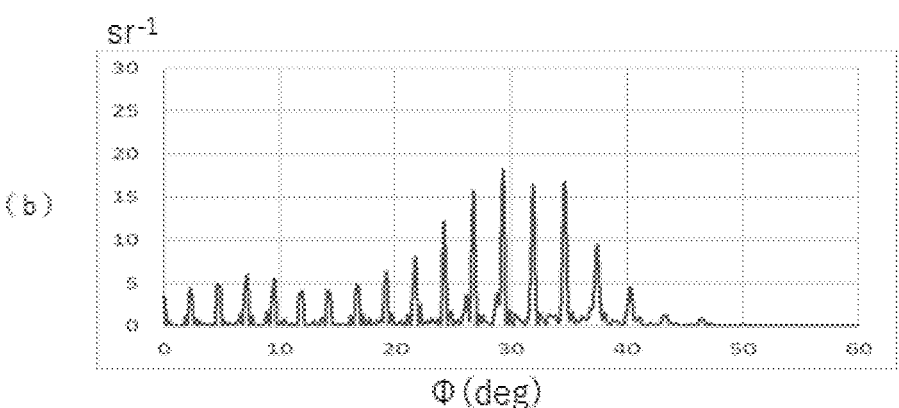
Figure 27:
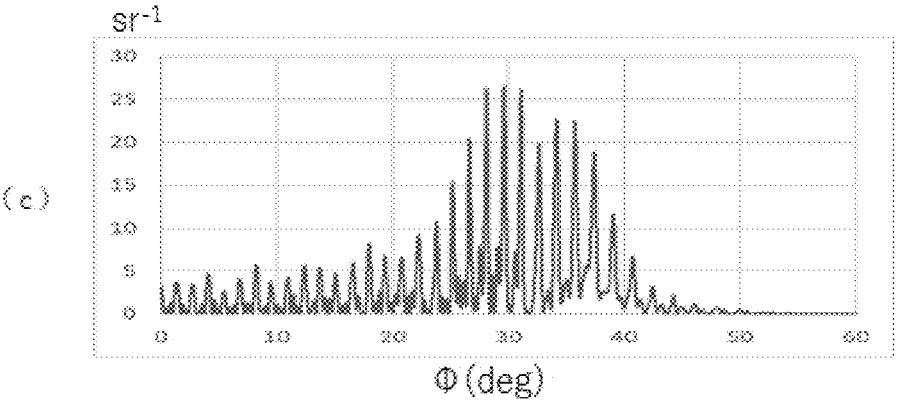
Figure 28:
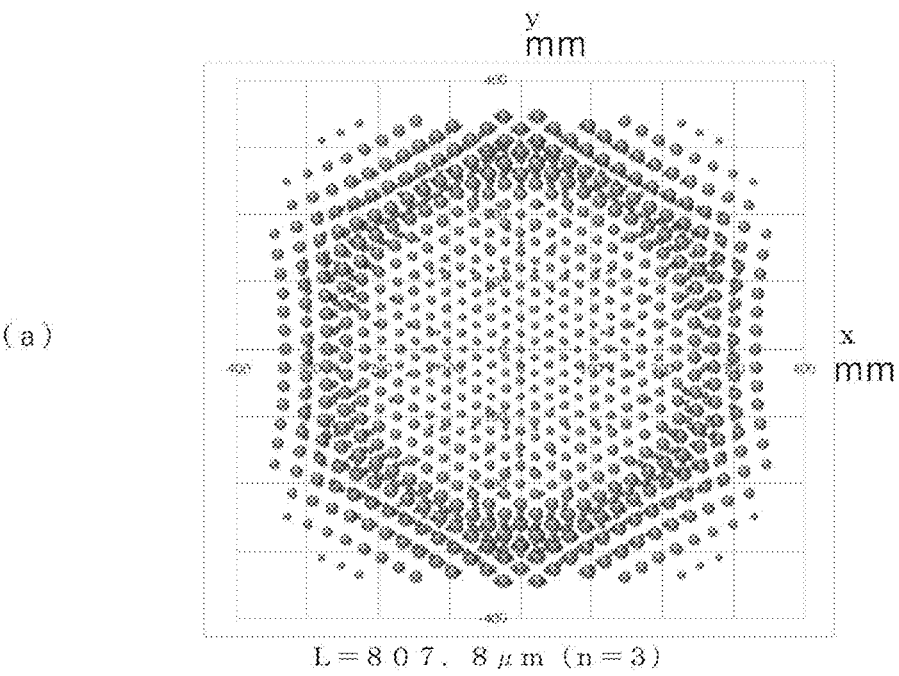
FIG. 28 is a diagram illustrating a light intensity at a far-field in the simulation 4 (when n=3)
Figure 28:
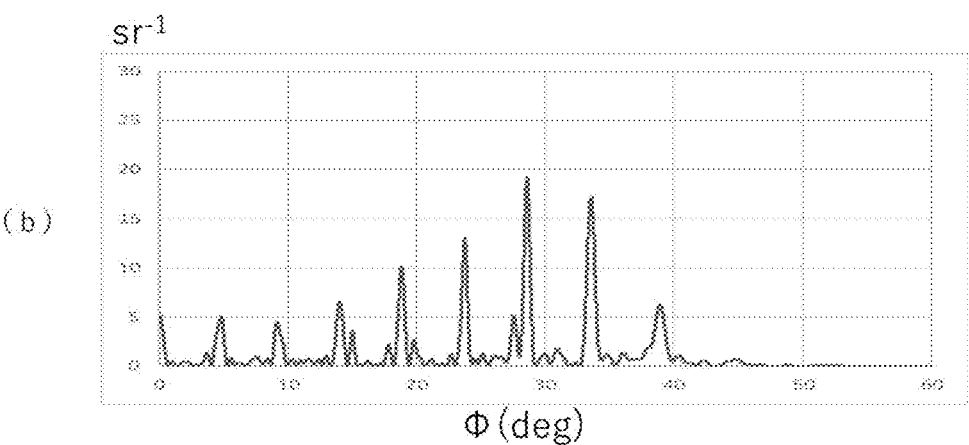
Figure 28:
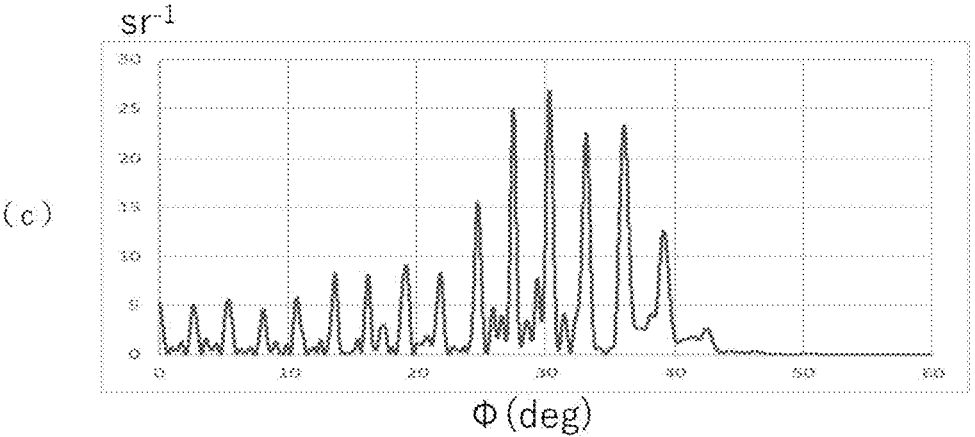

The emitting unit 1 was multiple light sources that had the light sources each of which emitted light with a wavelength of 940 nm and which were arranged in a hexatic manner as illustrated in part (a) of FIG. 24. Moreover, the applied light to be emitted by the light source was bat-wing light distribution as illustrated in part (b) of FIG. 24, and had a light intensity as illustrated in part (c) of FIG. 24 at a far-field. The optical element 2 had the lenses 21 arranged in a hexatic manner at a pitch of 22.5 μm as illustrated in part (a) of FIG. 25. Moreover, as illustrated in part (b) of FIG. 25, in a planar view, regarding the shape of each lens 21, it was a regular hexagonal shape, and a height was 12.9 μm. Furthermore, a lens surface was an aspheric and non-rotationally-symmetric surface that had different curvatures in the x-axis direction and in the y-axis direction. As for the material, a PDMS that had an index of refraction which was 1.53 was assumed. The distances L were 269.3 μm (n in the formula A=1), 538.6 μm (n in the formula A=2), and 807.8 μm (n in the formula A=3). FIGS. 26 to 28 illustrate simulation results when an optical simulation software BeamPROP (available from Synopsys Inc.,) was applied. Note that part (a) in each of FIGS. 26 to 28 illustrates a dot pattern at a site 50 cm ahead of the optical element 2. The size of the dot represents the magnitude of light intensity. Moreover, part (b) in each of FIGS. 26 to 28 illustrates a light intensity of light at a far-field on the x-axis in part (a) of each of FIGS. 26 to 28, and part (c) of each of FIGS. 26 to 28 illustrates a light intensity of light at a far-field on the y-axis in part (a) of each of FIGS. 26 to 28. Note that the horizontal axis represents a light distribution angle, and the vertical axis represents a light intensity at a far-field in each light distribution angle when the power of a light source was defined as 1.

Figure 29:
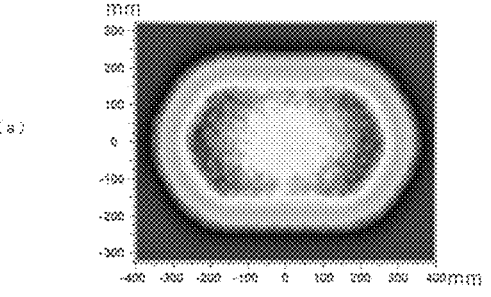
FIG. 29 is a diagram illustrating a light intensity at a far-field according to a comparative example for the simulation 4.
Figure 29:
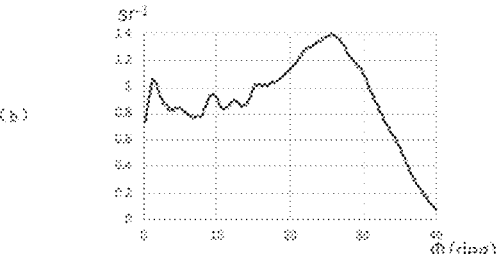
Figure 29:

Moreover, as a comparative example, FIG. 29 illustrates a simulation result when a diffuser was applied which was capable of forming an emitting pattern in the substantially same shape as the above-described dot pattern. Part (a) of FIG. 29 illustrates an emitting pattern at a site 50 cm ahead of the diffuser. Moreover, part (b) of FIG. 29 illustrates a light intensity of light at a far-field on the x-axis in part (a) of FIG. 29, and part (c) of FIG. 29 illustrates a light intensity of light at a far-field on the y-axis in part (a) of FIG. 29.

It becomes clear from the simulation results that a dot pattern has a peak clearly appearing, and the light intensity of each peak is also high. Moreover, it becomes clear that, in comparison with a case in which the diffuser was applied, the light intensity of each peak is remarkably high.

(Overlapping Rate of Transmitted Light)

Moreover, the lens shape of the optical element 2 was further examined. Upon examination, it becomes clear that an interference occurs when lights which pass through different positions of the surface of the lens 21 are output to the same direction, which becomes a cause of decreasing the contrast of dot. Hence, it is preferable to design the optical element in such a way that an overlapping rate of transmitted lights from the lens 21 in the output direction decreases.

(Lens Shape)

The output direction of transmitted light from the lens is defined by the inclination of the lens surface. That is, an overlapping rate of transmitted lights from the lens in the output direction is synonymous with an overlapping rate in the normal direction of the lens surface. Hence, in order to decrease the overlapping rate of transmitted lights from the lens in the output direction, the lens 21 may be formed in a shape that decreases the overlapping rate in the normal direction of the surface. For example, when the lens 21 has, on a line in the cross-section of the surface of the lens 21, an inflection point or a singular point at which the lens 21 changes from a concavo shape to a convex shape or from the convex shape to the concavo shape, a surface is produced which overlaps with the concavo portion and the convex portion in front of and behind such points in the normal direction.

(Simulation 5)

Figure 30:
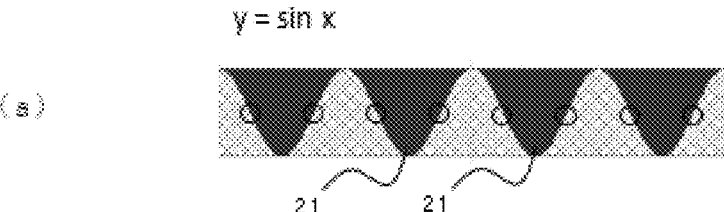
FIG. 30 is a diagram illustrating a light intensity at a far-field in a simulation 5 (with an inflection point)
Figure 30:
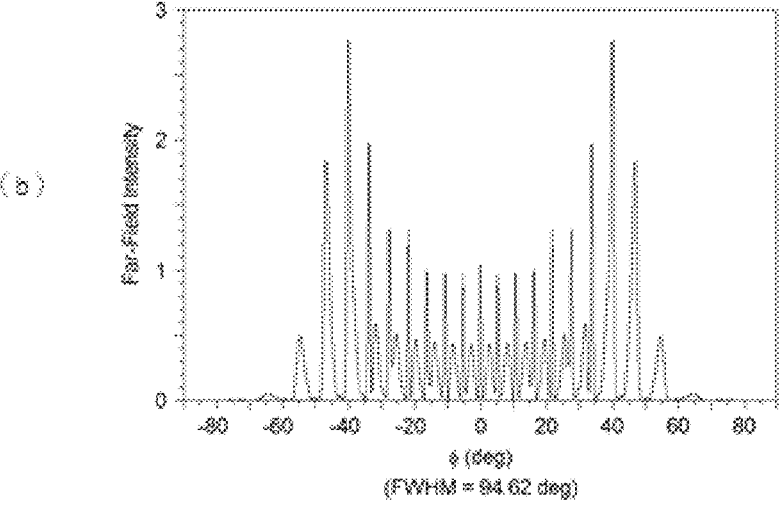
Figure 31:
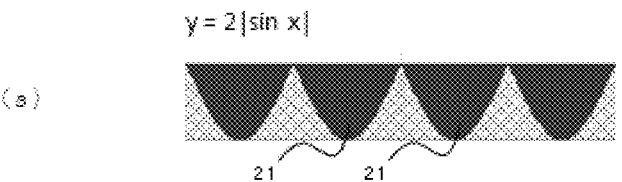
FIG. 31 is a diagram illustrating a light intensity at a far-field in the simulation 5 (without an inflection point)
Figure 31:
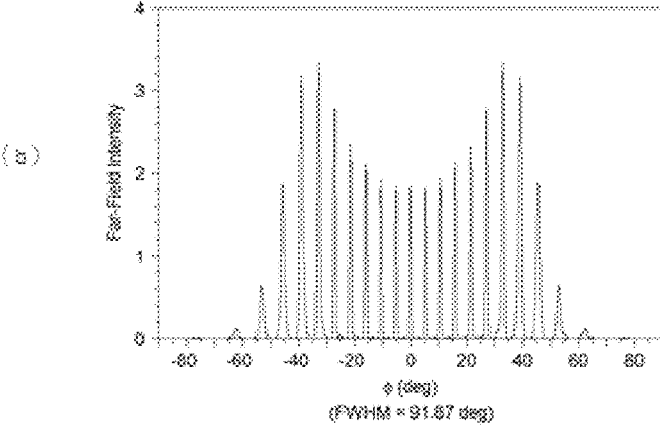
Figure 32:
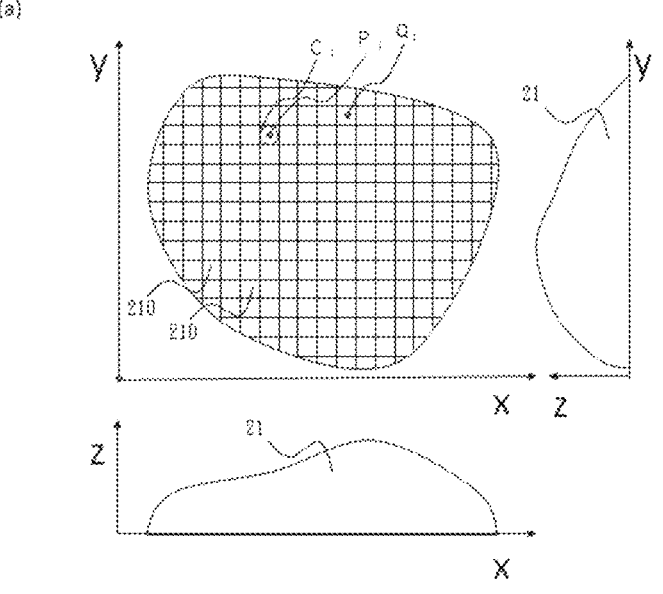
FIG. 32 is a diagram for describing a measuring scheme of a normal-line overlapping rate.
Figure 32:
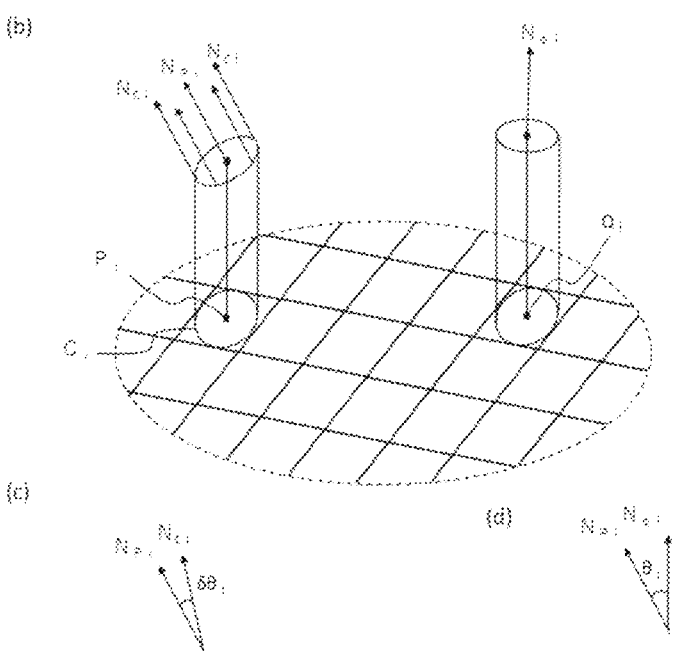

FIG. 30 illustrates an example lens that has an inflection point, and FIG. 31 illustrates an example lens that has no inflection point. Part (a) in FIG. 30 illustrates a lens which is formed in a shape that has a curved line of y=sinx rotated around the y-axis, and which has the inflection point at a portion indicated by a circle in the figure. Conversely, part (a) of FIG. 31 illustrates a lens which is formed in a shape that has a curved line of y=2|sinx| rotated around the y-axis, and which has no inflection point. Moreover, part (b) of FIG. 30 and part (b) of FIG. 31 each illustrate a light intensity of a dot pattern at a far-field when the optical element that had the lenses arranged periodically was applied. The emitting unit 1 was a single light source that emitted light which had a wavelength of 940 nm and which was Gaussian light distribution as illustrated in part (a) of FIG. 16. The optical element 2 had lenses 21 with a height of 10 μm arranged periodically at a pitch of 10 μm as illustrated in part (b) of FIG. 16. As for the material, a PDMS that had an index of refraction which was 1.53 was assumed. The applied distances L was 106.4 μm (n=2) when n in the formula A was 2. Part (b) of FIG. 31 and part (b) of FIG. 32 illustrate simulation results when an optical simulation software BeamPROP (available from Synopsys Inc.,) was applied. Note that the horizontal axis represents a light distribution angle, and the vertical axis represents a light intensity at a far-field in each light distribution angle when the power of a light source was defined as 1.

Since the lens illustrated in part (a) of FIG. 30 has the inflection point in the cross-sectional shape of the lens, the shape of the lens changes at this point from the concavo shape to a convex shape or from the convex shape to the concavo shape. In this case, since a region is produced in which the transmitted light through the convex portion and the transmitted light through the concavo portion travel in the same direction, as illustrated in part (b) of FIG. 30, noise light is caused due to interference between dots. This becomes a factor that decreases the contrast. Conversely, since the lens illustrated in part (a) of FIG. 31 does not have the inflection point in the cross-sectional shape of the lens, the shape of the lens is formed only by convex portions. In this case, since transmitted lights do not overlap with each other, as illustrated in part (b) of FIG. 31, a clear dot pattern that has no noise light can be formed. Accordingly, it is preferable that there should be no inflection point or singular point on a line in the cross-section of the surface of the lens 21, and either one of the concavo portion or the convex portion should be formed in a sufficiently large shape even if such a point is present.

Note that the overlapping rate in the normal direction of the surface of the lens 21 can be measured as follows.

(1) As illustrated in part (a) of FIG. 32, the lens 21 is divided into n number of pieces as extra-fine regions 210 each in a square shape in a planar view (an x-y plane). Next, numbers 1 to n which are not duplicated with each other are given to the respective extra-fine regions 210. Note that the size of one side of the extra-fine regions 210 is designed so as to be at least equal to or smaller than ¼ of the wavelength ($\lambda$/4) of light from the emitting unit.

(2) As illustrated in part (a) of FIG. 32, the center point of the i-th extra-fine region (where i=1, 2, and n, etc.,) among the divided extra-fine regions 210 is defined as $P_i$, and an inscribing circle thereto is defined as $C_i$. Moreover, a center point group of the extra-fine regions other than the i-th region among the divided minute regions 210 is defined as $Q_i$.

(3) as illustrated in part (b) of FIG. 32, a normal vector at an intersection between a line which passes through the point $P_i$ and which is perpendicular to the x-y plane (a parallel line to a z-axis) and the lens surface is defined as $N_{pi}$, and a normal vector group at an intersection between a line which passes through the circle $C_i$ and which is perpendicular to the x-y plane (a parallel line to the z-axis) and a lens surface is defined as $N_{ci}$. Next, as illustrated in part (c) of FIG. 32, the minimum value of an angle between $N_{pi}$ and $N_{ci}$ is defined as $\delta\theta_i$.

(4) As illustrated in part (b) of FIG. 32, a normal vector group at an intersection between a line which passes through the point group $Q_i$ and which is perpendicular to the x-y plane (a parallel line to the z-axis) and a lens surface is defined as $N_{qi}$.

(5) A state flag of the i-th extra-fine region among the divided extra-fine regions 210 is defined as $F_i$, and the initial value of $F_i$ is set to 0.

(6) As illustrated in part (d) of FIG. 32, an angle $\theta_i$ between the normal vector $N_{pi}$ and the vector group $N_{qi}$ is calculated for all i=1, 2, and n, etc., and $F_i$ is set to 1 when it is equal to or smaller than $\theta_i < \delta\theta_i$.

(7) Assuming that the number of $F_i$ that is 1 is m, the normal line overlapping rate can be obtained from (m/n)× 100(%). Note that the normal line overlapping rate converges when n is set to be infinite (n→infinite).

(Simulation 6)

Next, a simulation was carried out for a relation between the normal line overlapping rate of a lens shape and a light intensity distribution at a far-field. For the simulation, six kinds of lenses were applied as models. Note that the formula for the lens shape to be described later is expressed with the optical axis direction being as the z-axis, and the directions orthogonal to such a direction being as the x-axis and the y-axis, respectively. Note that the emitting unit 1 was multiple light sources that had the light sources 10 each of which emitted light with a wavelength of 940 nm and which were arranged in a tetragonal manner as illustrated in part (a) of FIG. 18. Moreover, the applied light to be emitted by the light source was bat-wing light distribution as illustrated in part (b) of FIG. 18, and had a light intensity as illustrated in part (c) of FIG. 18 at a far-field. The optical element 2 had the lenses 21 each of which had a square shape that was x=20 μm and y=20 μm in a planar view and which were arranged in a tetragonal manner at a pitch of 20 μm. As for the material, a PDMS that had an index of refraction which was 1.53 was assumed. The applied distances L was 425.5 μm (when n in the formula A=2). For the simulation, an optical simulation software BeamPROP (available from Synopsys Inc.,) was applied.

(Model 1)

A lens illustrated in part (a) of FIG. 33 will be described as a model 1. The shape of the lens is as expressed by the following formula.

$$z = \frac{-\left(x^2 + y^2\right)}{2} + 1 \qquad \text{[Equation 7]}$$

Figure 33:
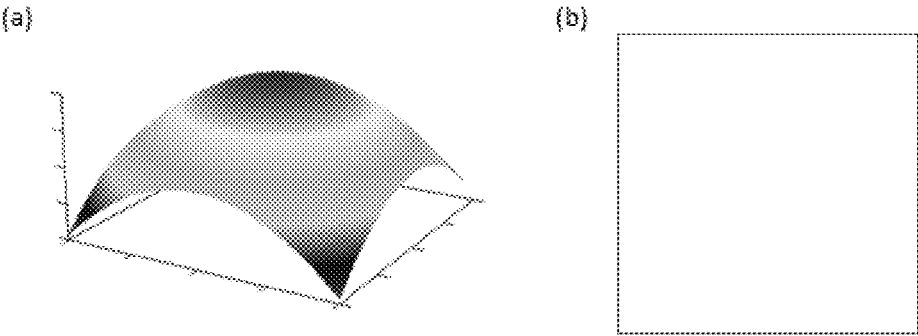
FIG. 33 is a diagram illustrating a light intensity at a far-field in a simulation 6 (a model 1)
Figure 33:
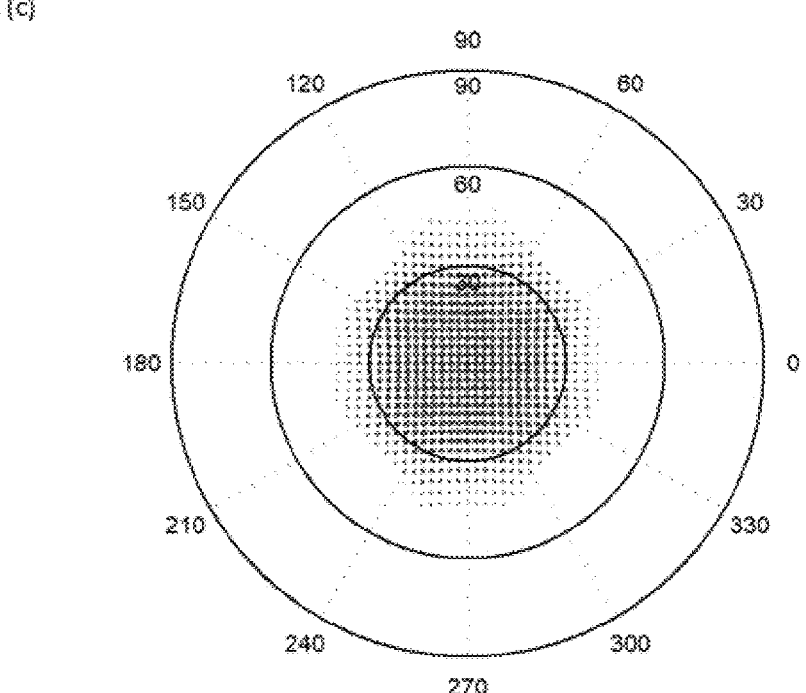
Figure 33:
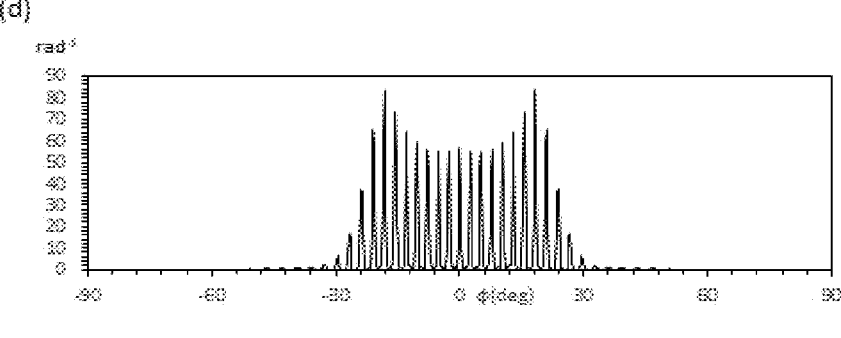

The white region in part (b) of FIG. 33 was a region where no normal lines overlap, and the normal line overlapping rate was 0%. Moreover, part (c) and part (d) of FIG. 33 each illustrate a light intensity at a far-field. It becomes clear that noise light is hardly present, and the light intensity of the peak is high as a whole.

(Model 2)

A lens illustrated in part (a) of FIG. 34 will be described as a model 2. The shape of the lens is as expressed by the following formula.

$$z = \cos(\pi \sqrt{(X^2 + y^2)/8}) \qquad \text{Equation 8}$$

Figure 34:
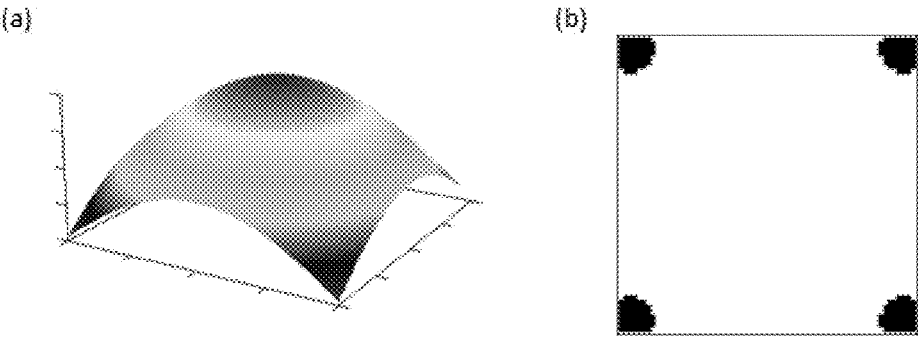
FIG. 34 is a diagram illustrating a light intensity at a far-field in the simulation 6 (a model 2)
Figure 34:
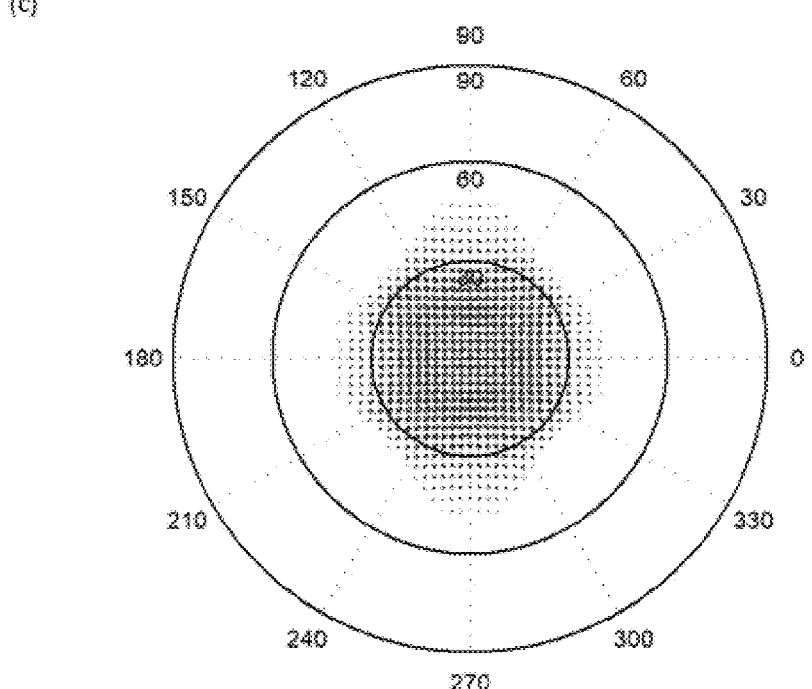
Figure 34:
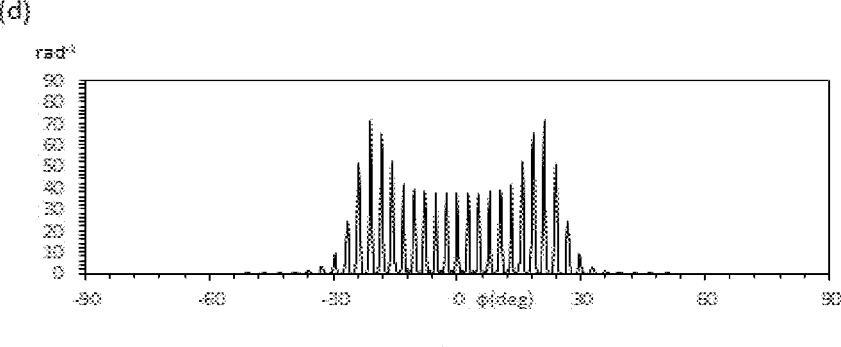

Black regions in part (b) of FIG. 34 were regions where normal lines overlapped, and the normal line overlapping rate was 5.3%. Moreover, part (c) and part (d) of FIG. 34 each illustrate a light intensity at a far-field. It becomes clear that although there is little noise light, in comparison with the model 1, the light intensity of the peak is slightly low.

(Model 3)

A lens illustrated in part (a) of FIG. 35 will be described as a model 3. The shape of the lens is as expressed by the following formula.

$$z = \frac{\cos\left(\pi\sqrt{0.18\left(x^2 + y^2\right)}\right)}{1.30901699437495} + 0.236067977 \qquad \text{[Equation 9]}$$

Figure 35:
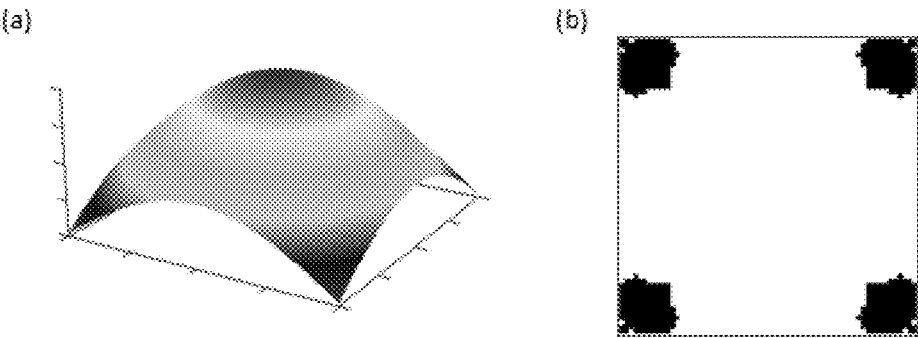
FIG. 35 is a diagram illustrating a light intensity at a far-field in the simulation 6 (a model 3)
Figure 35:
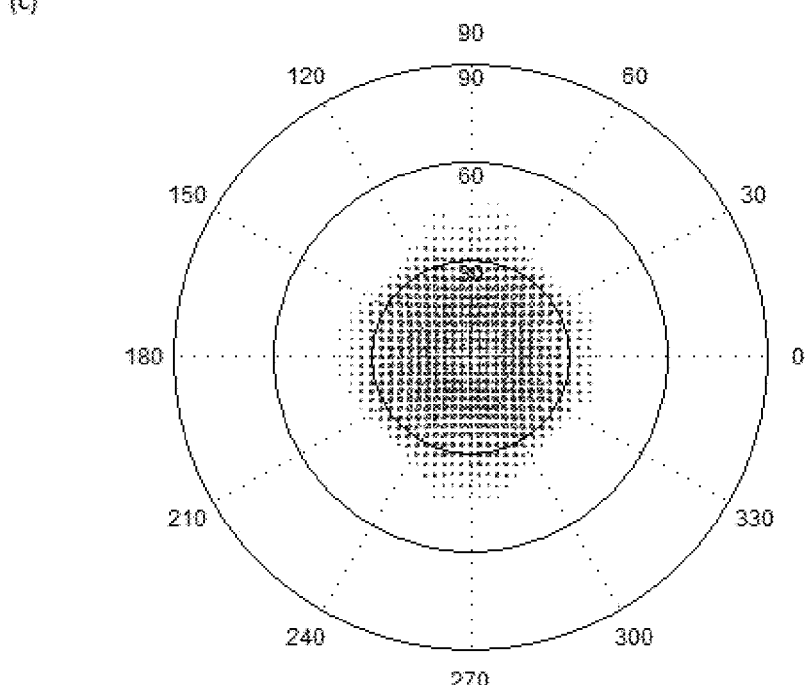
Figure 35:
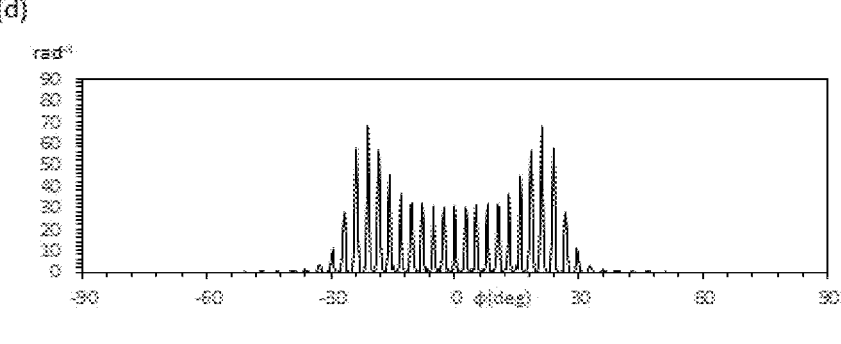

Black regions in part (b) of FIG. 35 were regions where normal lines overlapped, and the normal line overlapping rate was 12.8%. Moreover, part (c) and part (d) of FIG. 35 each illustrate a light intensity at a far-field. It becomes clear that the normal line overlapping rate exceeds 10% in comparison with the model 1, and the light intensity of the peak becomes further low in comparison with the model 1 and with the model 2.

(Model 4)

A lens illustrated in part (a) of FIG. 36 will be described as a model 4. The shape of the lens is as expressed by the following formula.

$$z = \frac{\cos\left(\pi\sqrt{\dfrac{x^2 + y^2}{2}}\right) + 1}{2} \qquad \text{[Equation 10]}$$

Figure 36:
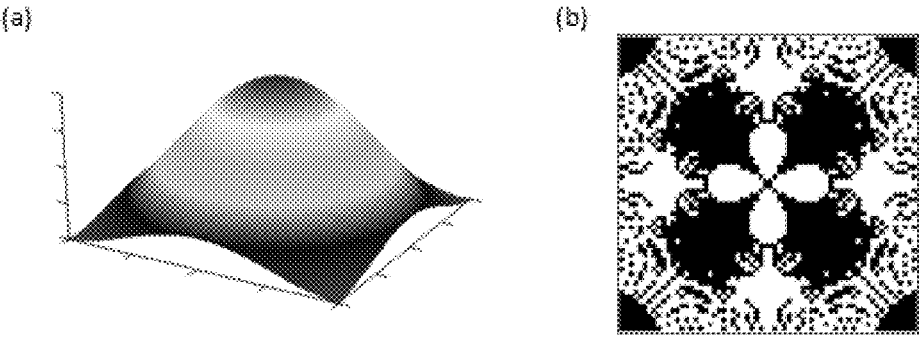
FIG. 36 is a diagram illustrating a light intensity at a far-field in the simulation 6 (a model 4)
Figure 36:
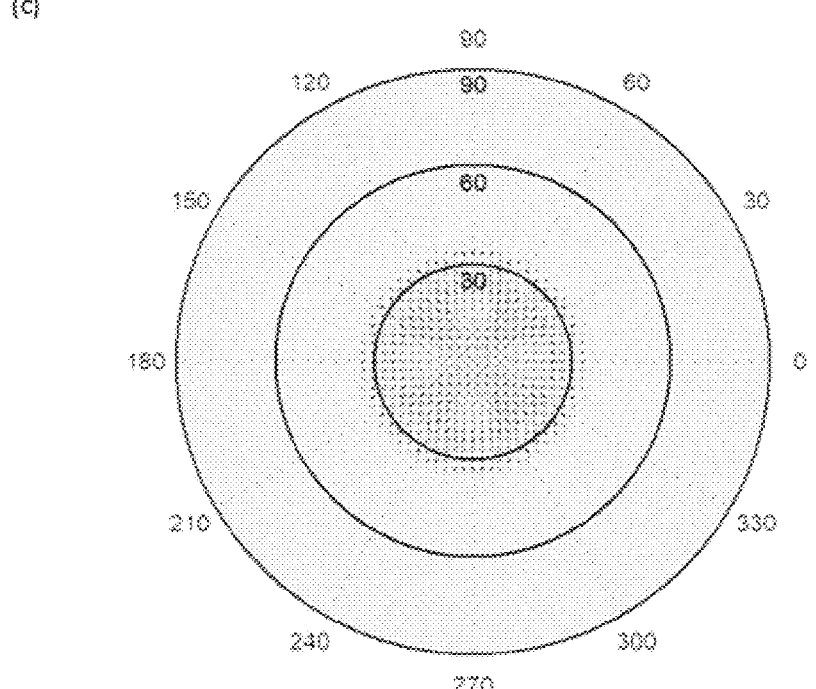
Figure 36:
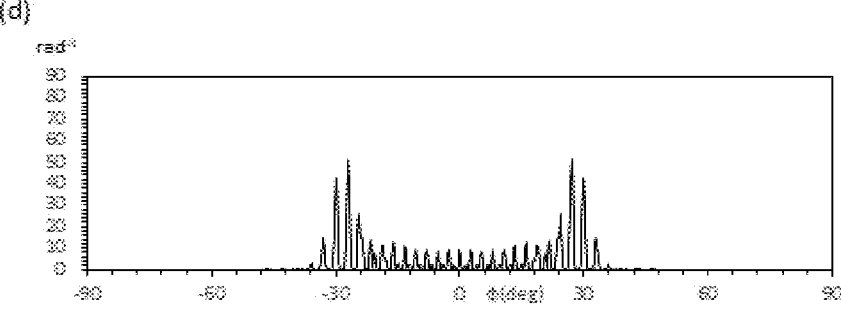

Black regions in part (b) of FIG. 36 were regions where normal lines overlapped, and the normal line overlapping rate was 49.8%. Moreover, part (c) and part (d) of FIG. 36 each illustrate a light intensity at a far-field. It becomes clear that, in comparison with the model 3, the normal line overlapping rate is further high, and the light intensity is low as a whole.

(Model 5)

A lens illustrated in part (a) of FIG. 37 will be described as a model 5. The shape of the lens is as expressed by the following formula.

$$z = \frac{\cos\left(\pi\sqrt{x^2 + y^2}\right) + 1}{2} \qquad \text{[Equation 11]}$$

Figure 37:
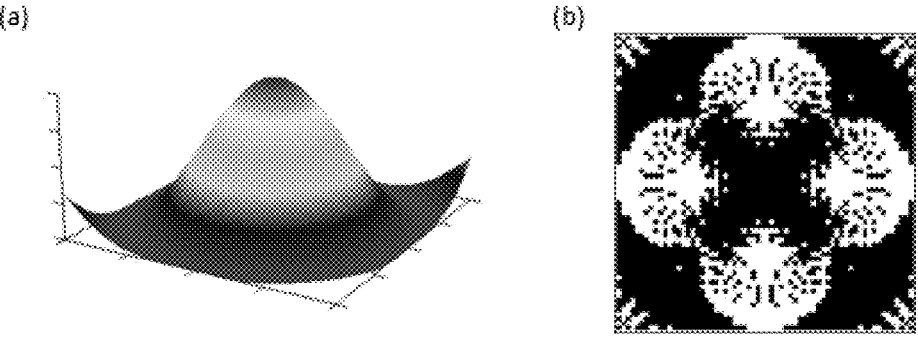
FIG. 37 is a diagram illustrating a light intensity at a far-field in the simulation 6 (a model 5)
Figure 37:
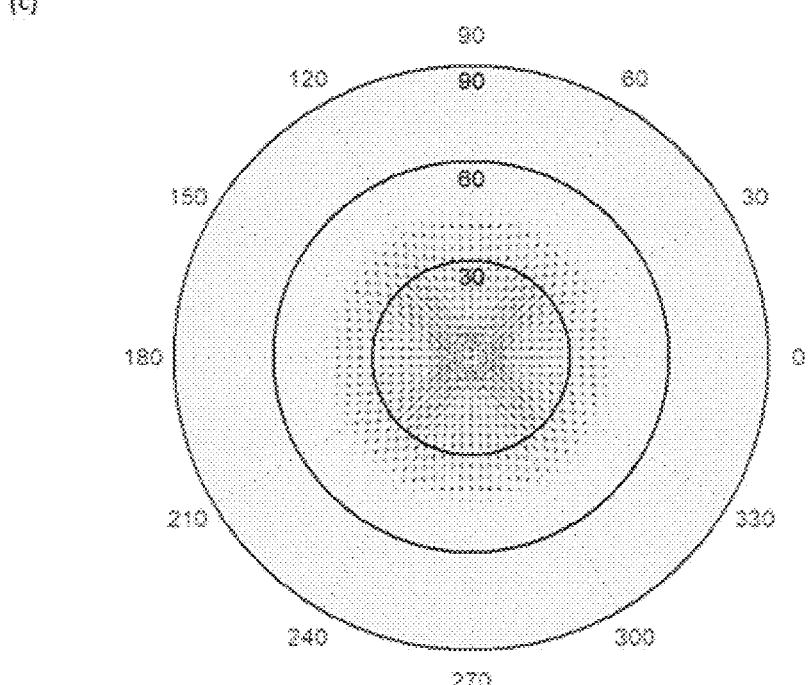
Figure 37:
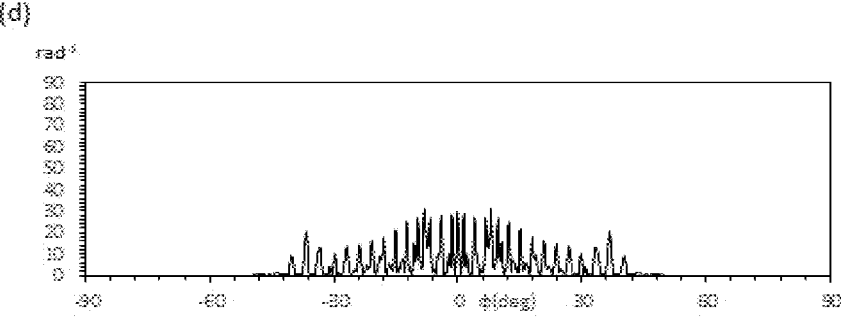

Black regions in part (b) of FIG. 37 were regions where normal lines overlapped, and the normal line overlapping rate was 62.2%. Moreover, part (c) and part (d) of FIG. 37 each illustrate a light intensity at a far-field. It becomes clear that, in comparison with the model 4, the normal line overlapping rate is further high, there are many noise lights, and the light intensity is low as a whole.

(Model 6)

A lens illustrated in part (a) of FIG. 38 will be described as a model 6. The shape of the lens is as expressed by the following formula.

$$z = \frac{\left(x^2 - y^2\right) + 1}{2} \qquad \text{[Equation 12]}$$

Figure 38:
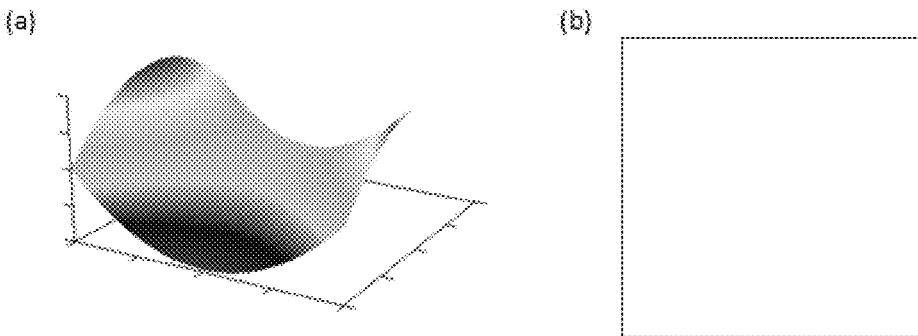
FIG. 38 is a diagram illustrating a light intensity at a far-field in the simulation 6 (a model 6)
Figure 38:
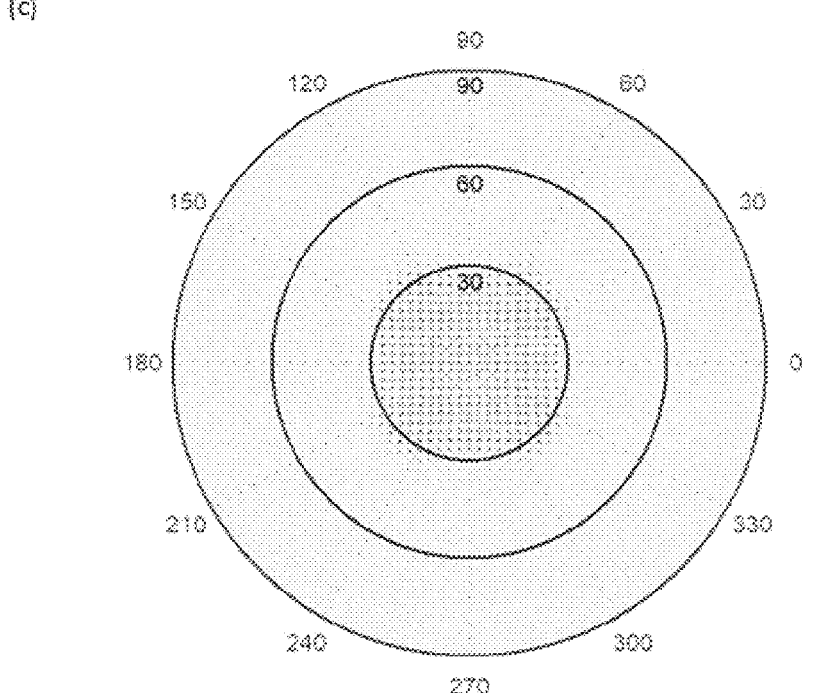
Figure 38:
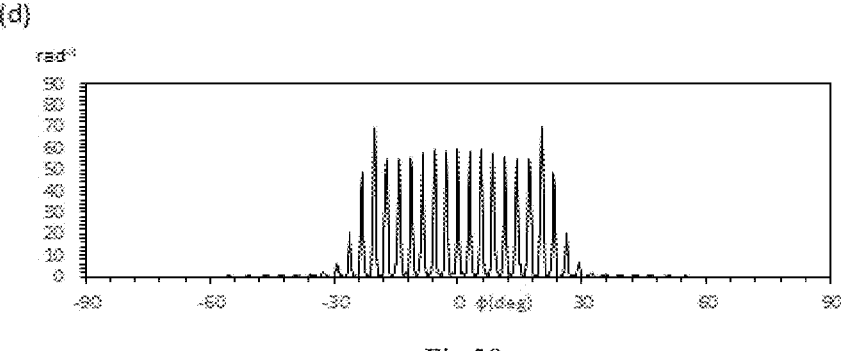

A white region in part (b) of FIG. 38 was a region where no normal lines overlap, and the normal line overlapping rate was 0%. Moreover, part (c) and part (d) of FIG. 38 each illustrate a light intensity at a far-field. It becomes clear that noise light is hardly present and the light intensity of the peak is high as a whole.

In view of the above-described results, it is preferable that the surface of the lens 21 should be formed in a shape in such a way that the overlapping rate in the normal direction becomes equal to or smaller than 10%, preferably, equal to or smaller than 5%, and more preferably, equal to or smaller than 3%. Moreover, it is preferable that the surface of the lens 21 should be formed in a shape in such a way that the overlapping rate of transmitted light from the lens 21 at a far-field becomes equal to or smaller than 10%, preferably, equal to or smaller than 3%, and more preferably, equal to or smaller than 5%.

(Aperture Mask)

Moreover, there is a case in which it is difficult to design the lens shape that has a low overlapping rate of transmitted lights as described above. Moreover, there is also a case in which even if the lens shape that has a low overlapping rate of transmitted lights can be designed, from the standpoint of manufacturing, it is difficult to reproduce such a lens shape. In such cases, the optical device may include an aperture mask 7 which is provided with openings 70 and which blocks some lights. More specifically, the aperture mask 7 may be applied which is provided with the openings 70 that allow necessary transmitted light (will be referred to as effective light) to pass therethrough, and which blocks transmitted light that becomes noise light (will be referred to as noise light). The effective light means light that contributes to formation of a dot pattern. Hence, the opening 70 is formed in a portion that includes at least the optical axis of the lens. Moreover, regarding the size of the opening 70, it is preferable so as to be formed in a size that allows as much effective light to pass through as possible. Furthermore, noise light means light that increases the above-described overlapping rate. As far as noise light can be blocked, the distance between the lens and the aperture mask 7 is optional, but it is desirable to place at the lens-side relative to the range where the optical paths of the respective effective lights of the adjacent lenses overlap with each other. When, for example, the adjacent lenses contact with each other, the effective lights of the respective lenses overlap with each other when it exceeds a distance that is twice as the distance from the focal point of the lens. Accordingly, it is preferable that the aperture mask 7 should be placed at the lens-side relative to the distance that is twice as the distance from the focal point of the lens. Still further, when the opening 70 of the aperture mask 7 is placed at a focal-point position, the opening 70 can be minimized, and can block a large number of noise lights, thus preferable.

Moreover, a boundary portion between the lenses 21, etc., becomes a singular point, and lights are scattered, thus becoming a cause of noise light. Furthermore, when the lens 21 is formed by, for example, imprinting, a distortion is likely to be produced at the boundary portion between the lenses 21. This often becomes a cause of increasing the overlapping rate of transmitted lights. Hence, the aperture mask 7 that blocks the transmitted light from the lens 21 may be formed at such a boundary portion between the lenses 21. Moreover, the aperture mask 7 may be also placed between the light source and the optical element. For example, the aperture mask 7 that blocks light from the light source may be formed at the boundary portion between the lenses 21.

Furthermore, the shape of the opening 70 of the aperture mask 7 may be any shape as far as it can allow effective light to pass therethrough, and it may be an arbitrary shape, such as a circular shape, an elliptical shape, a rectangular shape, or a hexagonal shape. Still further, the opening 70 may be formed for each lens, or the openings 70 for respective lenses may be connected to each other.

Moreover, the material of the aperture mask 7 is not limited to any particular material as far as it can suppress the transmission of light, but for example, an absorption material that absorbs light from the emitting unit, and a reflection material that reflects such light are applicable. An example absorption material that absorbs light is a black resist. Moreover, an example reflection material that reflects light is a metal, such as silver, aluminum, or chromic oxide.

Note that the aperture mask 7 may be formed separately from the optical element, or may be formed integrally with the optical element.

(Simulation 7)

Figure 39:
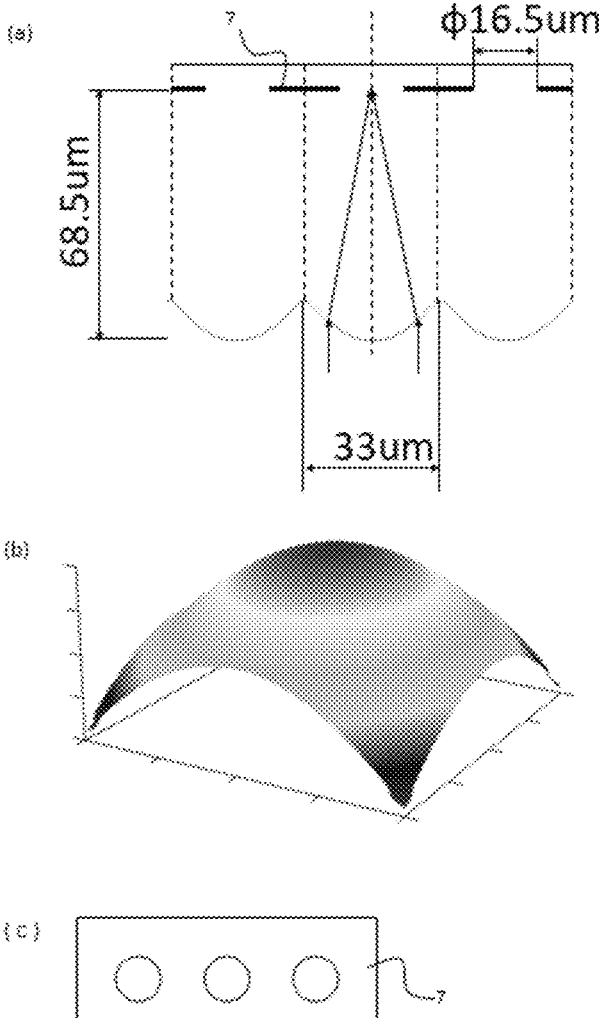
FIG. 39 is a diagram illustrating an aperture mask according to the present disclosure.

A simulation was carried out for an adverse effect of noise light due to presence or absence of the aperture mask 7. The emitting unit 1 was multiple light sources that had the light sources 10 each of which emitted light with a wavelength of 940 nm and which were arranged in a tetragonal manner as illustrated in part (a) of FIG. 18. Moreover, the applied light to be emitted by the light source was bat-wing light distribution as illustrated in part (b) of FIG. 18, and had a light intensity as illustrated in part (c) of FIG. 18 at a far-field. The optical element 2 had the lenses 21 arranged in a tetragonal manner at a pitch of 33 μm as illustrated in part (a) of FIG. 39. Furthermore, the shape of each lens 21 is expressed by the following formula as illustrated in part (b) of FIG. 39.

$$z = \frac{-\left(x^2 + y^2\right)}{2} + 1 \qquad \text{[Equation 13]}$$

Figure 40:
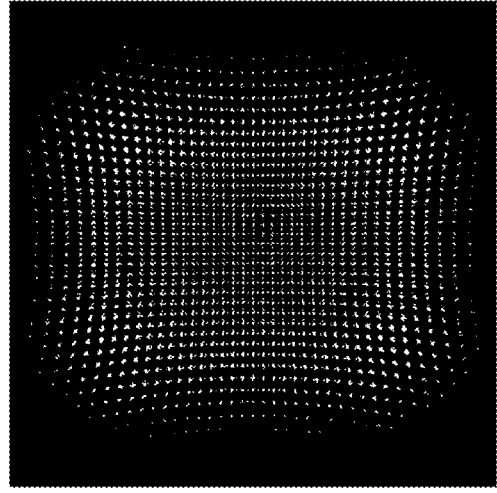
FIG. 40 is a diagram illustrating a light intensity at a far-field in a simulation 7 (with an aperture mask)
Figure 41:
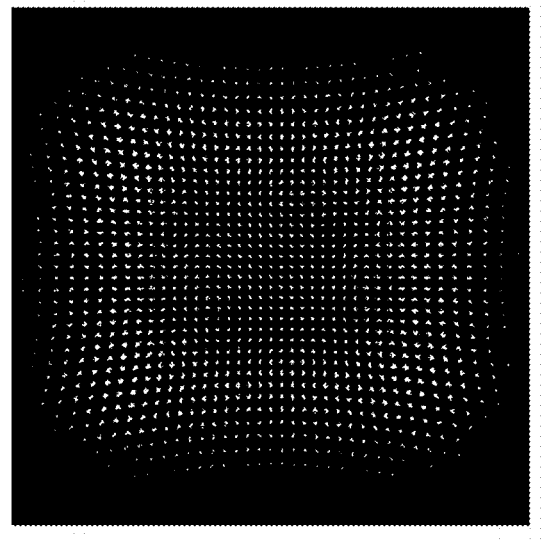
FIG. 41 is a diagram illustrating a light intensity at a far-field in the simulation 7 (without an aperture mask)

It was formed in a square shape having each side that was 33 μm in a planar view and having a height of 17.5 μm. A distance on the optical axis to the focal point of the lens was 68.5 μm. Moreover, the cross-sectional shape of a boundary portion between the respective lenses which often becomes the singular point when the lens is formed by imprinting was formed in parabolic shape which had a boundary with the minimum value, and which was smoothly continuous from the lens shape expressed by the above-described formula with a width of 1.5 μm. As for the material, a PDMS that had an index of refraction which was 1.53 was assumed. A distance L between the light source and the optical element was 1158.5 μm (a case in which n in the formula A=2). As illustrated in part (c) of FIG. 39, the aperture mask 7 that had circular openings 70 each having a diameter of 16.5 μm and arranged in a tetragonal manner was applied. Moreover, as illustrated in part (a) of FIG. 39, the aperture mask 7 was placed in such a way that the center of the opening 70 was aligned with the focal point of the lens. Regarding the adverse effect of noise light due to the presence or absence of the aperture mask 7, a dot pattern without the aperture mask 7 is illustrated in FIG. 40, and a dot pattern in a case in which there was the aperture mask 7 is illustrated in FIG. 41. The dot pattern was on a plate which was 70 cm×70 cm and which was apart from the optical element by 50 cm. Note that an optical simulation software BeamPROP (available from Synopsys Inc.,) was applied for the simulation.

It becomes clear that when there was no aperture mask 7, as illustrated in FIG. 40, small dots that were noise lights were produced between dots near the center. Conversely, when the aperture mask 7 was placed as illustrated in FIG. 41, no dot due to noise light was produced between dots near the center, and a clear dot pattern was formed.

(Simulation 8)

Next, a simulation was carried out for a relation between the aperture mask 7 and a light intensity distribution at a far-field. Four kinds of lenses were utilized as models in the simulation. Moreover, the planar shape of the lens was a square shape with x=20 μm and y=20 μm, and a pitch was 20 μm. Note that an optical simulation software BeamPROP (available from Synopsys Inc.,) was applied for the simulation.

(Model 1)

Figure 42:
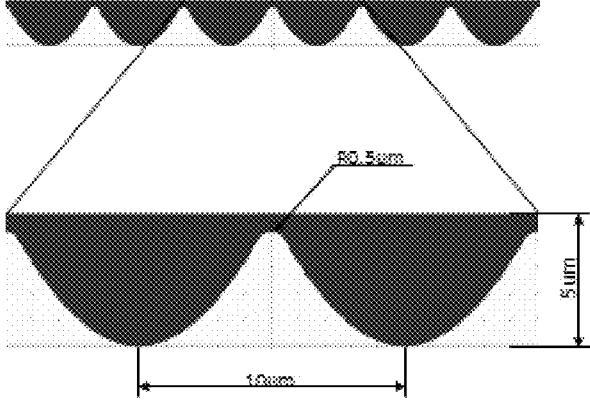
FIG. 42 is a diagram illustrating a light intensity at a far-field in a simulation 8 (a model 1)
Figure 42:
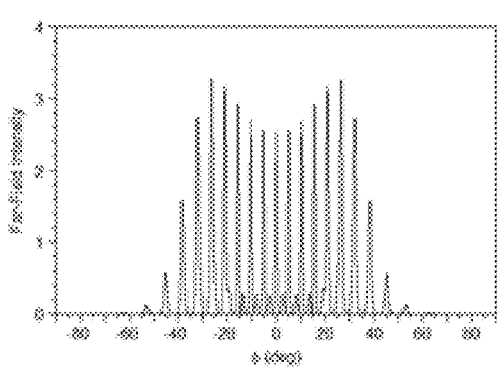

A model 1 when there was no aperture mask 7 is illustrated in part (a) of FIG. 42. The lens period was 10 μm, the lens height was 5 μm, and the shape of a boundary portion between the respective lenses which often becomes a singular point when the lens is formed by imprinting was in a circular-arc shape with a diameter of 0.5 μm. A light intensity in this case is illustrated in part (b) of FIG. 42. It becomes clear that a small peak that was noise light was produced between peaks near the center.

(Model 2)

Figure 43:
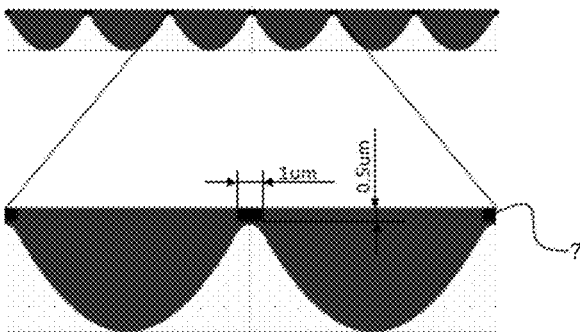
FIG. 43 is a diagram illustrating a light intensity at a far-field in the simulation 8 (a model 2)
Figure 43:
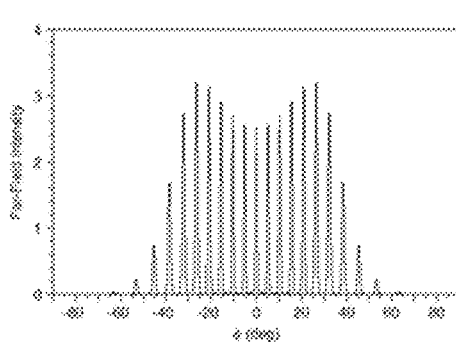

Next, a model 2 that had the aperture mask 7 which blocked transmitted light from the lens 21 and which was formed at a bottom-portion side of a boundary portion between the lenses 21 is illustrated in part (a) of FIG. 43. The width of the aperture mask 7 was 1 μm in accordance with the width of a circular arc with a diameter of 0.5 μm. Moreover, the thickness of a blocking portion was 0.5 μm. A light intensity in this case is illustrated in part (b) of FIG. 43. It becomes clear that, in comparison with the model 1 without the aperture mask 7, noise light at the center part was hardly present.

(Model 3)

Figure 44:
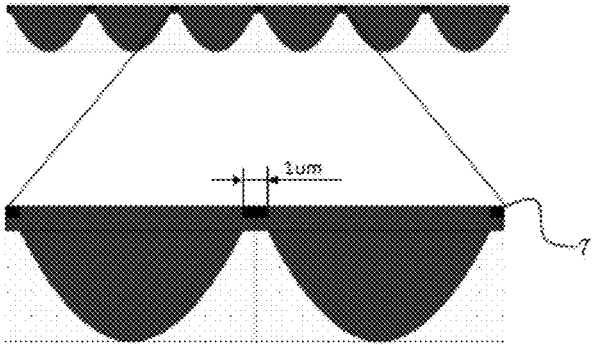
FIG. 44 is a diagram illustrating a light intensity at a far-field in the simulation 8 (a model 3)

In the lens according to the model 1, when the circular-arc part of the boundary portion is formed by imprinting, a distortion is likely to occur. Hence, as illustrated in part (a) of FIG. 44, the circular-arc part of the lens according to the model 1 was formed in a flat shape with a width of 1 μm, and this was adopted as a model 3. According to the model 3, the aperture mask 7 that blocked transmitted light from the lens 21 was formed at a bottom-portion side of the boundary portion between the lenses 21. The width of the aperture mask 7 was 1 μm in accordance with the flat portion. Moreover, the thickness of the blocking portion was 0.5 μm. A light intensity in this case is illustrated in part (b) of FIG. 44. It becomes clear that, in comparison with the model without the aperture mask 7, noise light at the center is hardly present.

(Model 4)

Figure 45:
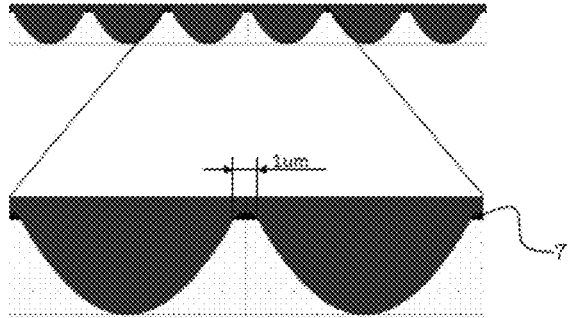
FIG. 45 is a diagram illustrating a light intensity at a far-field in the simulation 8 (a model 4)
Figure 45:
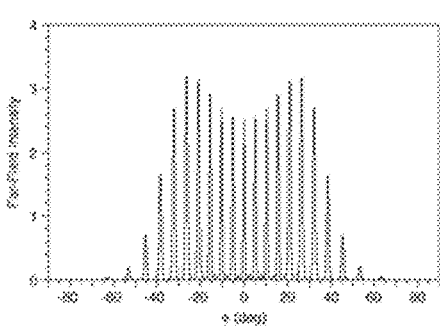

Next, a model 4 that had the aperture mask 7 which blocked light from a light source and which was formed on the surface of the boundary portion between the lenses 21 is illustrated in part (a) of FIG. 45. The width of the aperture mask 7 was set to 1 μm so as to block all incident lights to the circular-arc with a diameter of 0.5 μm. A light intensity in this case is illustrated in part (b) of FIG. 45. It becomes clear that, in comparison with the model 1 without the aperture mask 7, noise light at the center was hardly present.

(Light Diffusion Portion)

Moreover, the optical element may include a light diffusion portion 8 which is formed at the boundary portion between the lenses and which causes transmitted light to be refracted to the external side of the emitting angle of such a lens (the external side of the emitted range of a dot pattern). This can repel noise light to the external side of a dot pattern, and thus a clear dot pattern can be obtained. The shape of the light diffusion portion 8 is not limited to any particular shape as far as it can cause the incident light to be refracted to the external side of the emitting angle, and an arbitrary shape that can be easily produced can be selected. For example, a triangular cross-sectional shape by a parallel surface to the boundary between the lenses may be adopted.

(Simulation 9)

Figure 46:
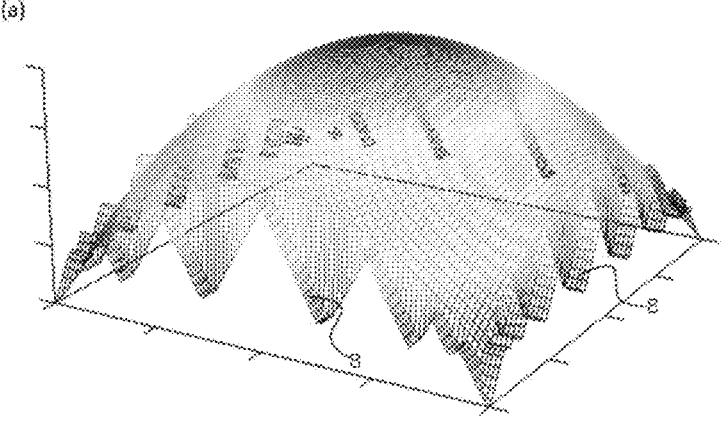
FIG. 46 is a diagram illustrating an light diffusion portion according to the present disclosure.
Figure 46:
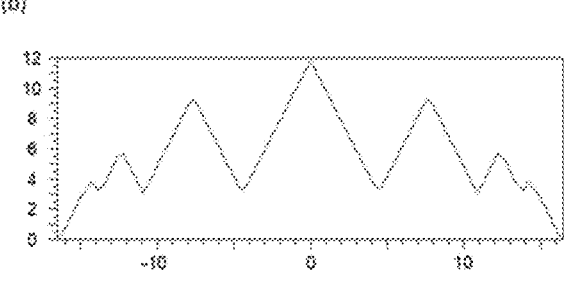

A simulation was carried out for an adverse effect of noise light due to the presence or absence of the light diffusion portion 8. As illustrated in part (a) of FIG. 46, a lens was formed in such a shape that the light diffusion portion 8 was provided at the boundary portion between the lenses applied in the simulation 7. The light diffusion portion 8 was formed at a width of 1.5 μm from the boundary around the lens. As illustrated in part (b) of FIG. 46, the cross-sectional shape of the light diffusion portion 8 (a cross-section parallel to the nearby boundary to the lens) was a concavo-convex structure having similar triangles each having the width of a bottom side and the height matching with each other so as to accomplish an aspect that was 1, and arranged side by side. Each of the similar triangles were arranged in such a way that the position of the bottom side of such a triangle matched the position of the bottom surface of the lens. The other conditions were the same as those of the simulation 7. A dot pattern when the light diffusion portion 8 was present is illustrated in FIG. 47.

Figure 47:
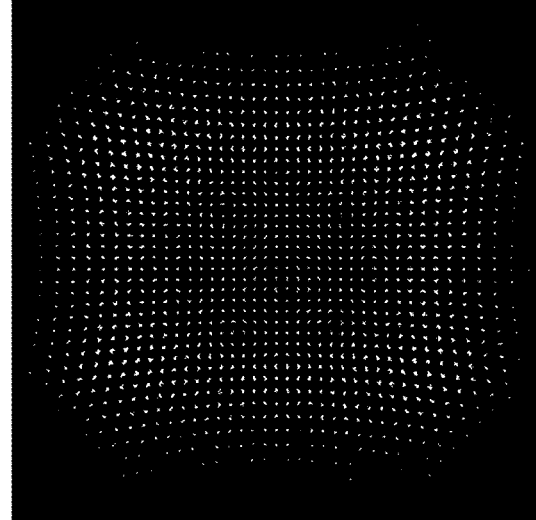
FIG. 47 is a diagram illustrating a light intensity at a far-field in a simulation 9.

It becomes clear that, when the light diffusion portion 8 is placed, as illustrated in FIG. 47, a dot by noise light is hardly produced between dots, and a clear dot pattern is formed.

(Optical Element Manufacturing Method)

A manufacturing method of the optical element will be described. The lens 21 of the optical element 2 may be manufactured by any schemes, but for example, may be manufactured by imprinting. More specifically, a material for the lens 21 is applied on a substrate 25 at a predetermined thickness by conventionally known schemes like spin coating (an applying process). The material is not limited to any particular material as far as the lens 21 that allows light with a wavelength λ to pass therethrough can be formed, and for example, polydimethylsiloxane (PDMS) is applicable.

Next, a mold with an inverted pattern of a pattern having the lenses 21 arranged periodically is prepared, and the mold is depressed on the material applied on the substrate 25, thereby transferring a pattern thereto (an imprinting process). Note that when the optical element that includes the above-described light diffusion portion 8 is to be formed, a mold that has the inverted pattern of the light diffusion portion 8 together with the above-described pattern may be applied.

Accordingly, since the optical element with little variability in the height direction of the lens 21 can be manufactured, an error in a distance $L_1$ can be reduced.

Moreover, when the aperture mask 7 is to be formed on the optical element, an aperture mask forming process is carried out. First, a description will be given of a case in which the aperture mask 7 is formed so as to be placed on the optical path of noise light of the lens 21.

Figure 48:
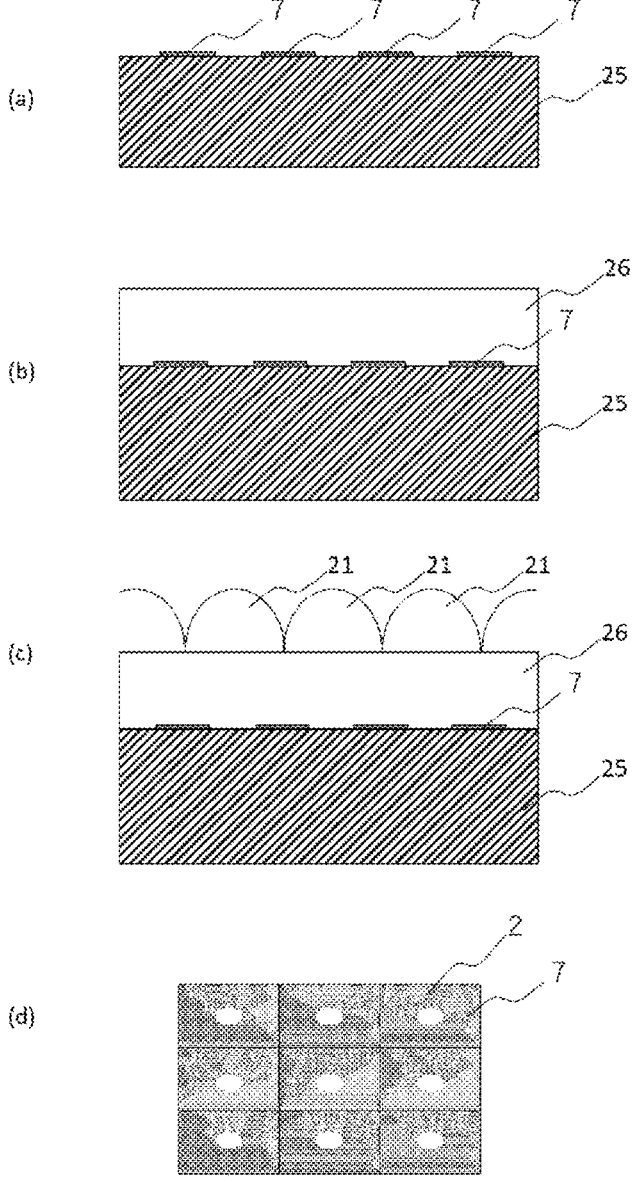
FIG. 48 is a diagram illustrating an optical element manufacturing method according to the present disclosure.

(1) As illustrated in part (a) of FIG. 48, the aperture mask 7 that prevents light from passing therethrough is formed at, on the substrate 25, a position apart by a predetermined distance from a position corresponding to at least the optical axis of the lens 21 (an aperture mask forming process). The aperture mask 7 may be formed by any schemes, but for example, may be formed by the following schemes.

(1.1) A film formed of a light blocking material is formed on the substrate 25. The film may be formed by a scheme like chemical vapor deposition (CVD), or may be formed by applying such a material.

(1.2) A resist is applied on the film formed of the light blocking material, and the resist is formed at portions other than the portions which correspond to the respective apertures of the aperture mask by conventionally known technology, such as photolithography or imprinting. The opening 70 may be formed in a size that allows as many effective lights to pass therethrough as possible. The light blocking material is etched using this resist, and the remaining resist is eliminated by ashing, etc., and thus the aperture mask 7 can be formed.

The light blocking material is not limited to any particular material as far as light to be applied can be blocked, but for example, metal, such as silver, aluminum, or chromic oxide, or a resin like black resist is applicable.

(2) After the aperture mask 7 is formed on the substrate 25, as illustrated in part (b) of FIG. 48, a transparent film 26 to adjust a distance between the lens 21 and the aperture mask 7 is formed. The transparent film 26 may be formed by any schemes, but for example, a transparent material is applied on the substrate 25 by a predetermined thickness to form such a film by conventionally known scheme like spin coating. The material is not limited to any particular material as far as it allows light with a wavelength λ to pass therethrough, and for example, polydimethylsiloxane (PDMS) is applicable.

(3) After the transparent film 26 is formed on the substrate 25, as illustrated in part (c) of FIG. 48, the lenses 21 are formed (a lens forming process). The lenses may be formed by any schemes, but for example, alignment with the respective aperture masks 7 is made, and the lenses 21 are formed by conventionally known technology like imprinting. In this case, a distance between the lens 21 and the aperture mask 7 is defined by the size of the transparent film 26 and that of the remaining film by imprinting. Thus, as illustrated in part (d) of FIG. 48, the aperture mask 7 integrated with the optical element 2 can be formed. Note that the distance between the lens 21 and the aperture mask 7 can be also adjusted only by the size of the remaining film by imprinting without the transparent film 26 being formed.

Figure 49:
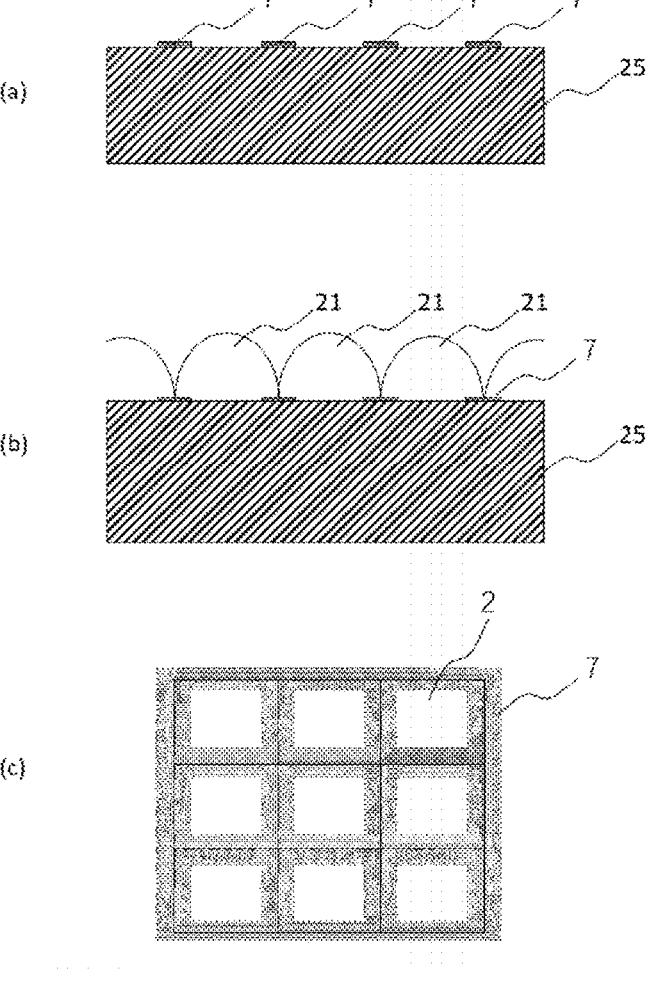
FIG. 49 is a diagram illustrating another optical element manufacturing method according to the present disclosure.

Moreover, as illustrated in part (c) of FIG. 49, when the aperture mask 7 that blocks transmitted light from the lens is formed at the boundary portion between the lenses 21 and at the transmitted-light side, it may be formed by the following schemes.

(1) As illustrated in part (a) of FIG. 49, the aperture mask 7 that prevents light from passing therethrough is formed on the substrate 25 and at a portion corresponding to the boundary between the lenses (an aperture mask forming process). The aperture mask 7 may be formed by any conventionally known schemes, but may be formed by the following schemes.

(1.1) A film formed of a light blocking material is formed on the substrate 25. The film may be formed by a scheme like chemical vapor deposition (CVD), or may be formed by applying such a material.

(1.2) A resist is applied on the film formed of the light blocking material, and the resist is formed only at the portion corresponding to the boundary between the lenses by conventionally known technology, such as photolithography or imprinting at a desired width that enables noise light to be blocked. The light blocking material is etched using this resist, and the remaining resist is eliminated by ashing, etc., and thus the aperture mask 7 can be formed.

The light blocking material is not limited to any particular material as far as light to be applied can be blocked, but for example, metal, such as silver, aluminum, or chromic oxide, or a resin like black resist is applicable.

(2) After the aperture mask 7 is formed on the substrate 25, as illustrated in part (b) of FIG. 49, the lenses 21 are formed in such a way that the boundary between the lenses 21 is positioned on the aperture mask 7 (a lens forming process). The lens may be formed by any schemes, but for example, alignment with the respective aperture masks 7 is made, and the lenses 21 are formed by conventionally known technology like imprinting. Hence, as illustrated in part (c) of FIG. 49, the aperture mask 7 integrated with the optical element 2 can be formed.

Figure 50:
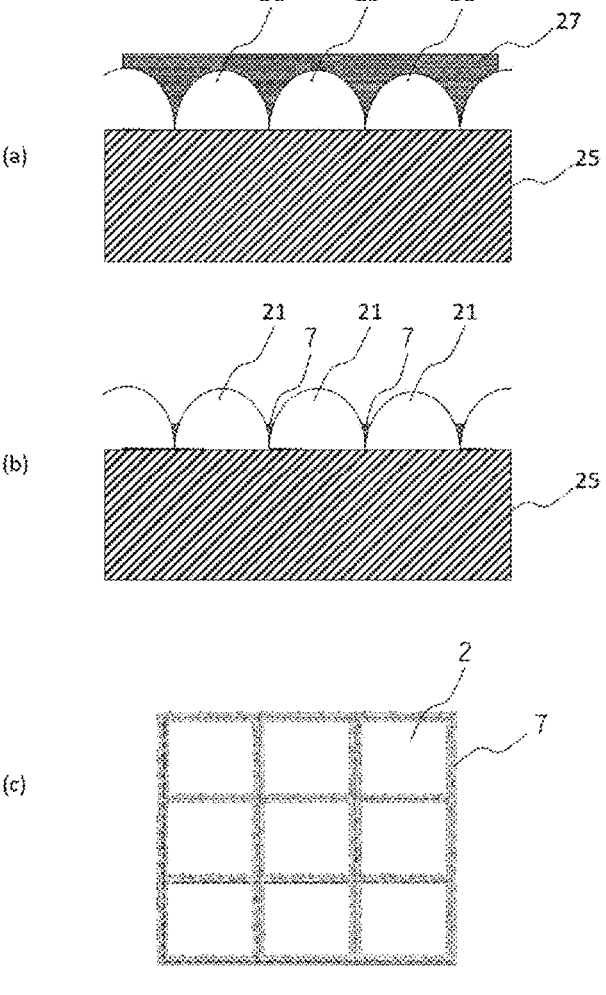
FIG. 50 is a diagram illustrating the other optical element manufacturing method according to the present disclosure.

Moreover, as illustrated in part (c) of FIG. 50, when the aperture mask 7 that blocks light from a light source is formed at the boundary portion between the lenses 21 and at the light-source side of the lens, it may be formed by the following schemes.

(1) An optical element that has the lenses 21 arranged periodically is prepared. The lenses 21 of the optical element may be formed by any schemes, but for example, a conventionally known technology like imprinting is applicable.

(2) Next, as illustrated in part (a) of FIG. 50, a light blocking material that prevents light from passing therethrough is applied on the whole of or some of the lenses 21 to form a light blocking film 27. Next, as illustrated in part (b) of FIG. 50, the light blocking material is removed in such a way that a part of the light blocking material is left at a portion corresponding to the boundary between the lenses 21, and the aperture mask 7 is formed (an aperture mask forming process). For example, a light blocking material like black resist is applied on the lenses 21. When the light blocking material is etched back by a desired amount by etching, an optical element having the light blocking material left only at a groove portion corresponding to the boundary between the lenses 21 can be formed.

As for the light blocking material, any materials are applicable as far as it can block light to be applied and has a sufficient etching rate relative to the lens 21. The wording "the etching rate is sufficiently high" means a level that does not give an adverse effect to the optical characteristics of the lens 21.

Regarding the etching scheme, any schemes are applicable as far as it enables etch-back, but for example, Reactive Ion Etching (RIE) or Chemical Dry Etching (CDE), etc., are applicable. Hence, as illustrated in part (c) of FIG. 50, the aperture mask 7 integrated with the optical element 2 can be formed.

(Pitch of Emitting Unit)

Figure 51:
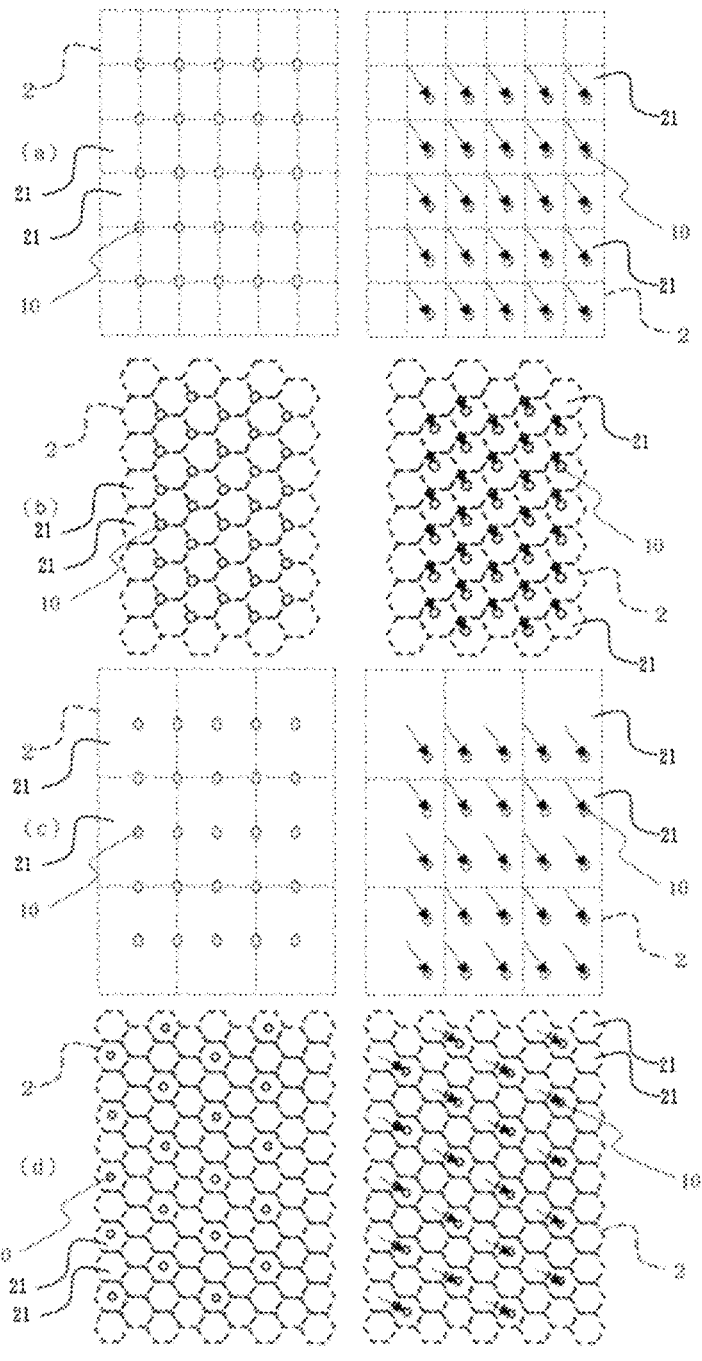
FIG. 51 is a schematic plan view illustrating a positional relation between an emitting unit and an optical element according to the present disclosure.

When the emitting unit 1 includes the plurality of light sources 10, a placement is necessary in such a way that the number of the light sources 10 relative to each lens 21 of the optical element 2 is consistent in a planar view even if each light source 10 and the optical element 2 are mutually moved in parallel with each other. More specifically, when it is defined that m is a natural number that is equal to or greater than 1, regarding the emitting unit, it is appropriate that the plurality of light sources is arranged regularly at, with respect to any periodic direction of the lenses 21 of the optical element, m times of such a period or 1/m times. In other words, it is appropriate that the light sources 10 of the emitting unit 1 are arranged regularly at, with respect to a direction in which the lenses 21 of the optical element 1 have a pitch $P_k$, a pitch $mP_k$ or $P_k/m$. In particular, a pitch $mP_1$ or $P_1/m$ is preferable. Part (a) of FIG. 51 and part (b) thereof illustrates a case in which, with m=1, the pitch of the light sources 10 is set to be equal to a pitch $P_1$ of the lenses 21 of the optical element 2. Moreover, part (c) of FIG. 51 illustrates a case in which, with m=2, the pitch of the light sources 10 is set to be ½ of the pitch $P_1$ of the lenses 21 of the optical element 2, i.e., $P_1/2$. Furthermore, part (d) of FIG. 51 illustrates a case in which, with m=2, the pitch of the light sources 10 is set to be twice as much as the pitch $P_1$ of the lenses 21 of the optical element 2, i.e., $2P_1$.

Note that when the emitting unit 1 has the light sources 10 arranged in a hexatic manner, when it is designed that the planar shape of the lens 21 of an optical element is rectangular, a ratio between the short side of the rectangular shape and the long side thereof is set to $P_1:P_2=1:\sqrt{3}$, and the pitch of the light sources 10 is $mP_1$ or $P_1/m$, the number of the light sources 10 relative to each lens 21 becomes consistent, thus preferable. Moreover, in this case, in order to satisfy the formula 1 regarding the smallest pitch $P_1$ (the size of a short side of a rectangular shape) and the second smallest pitch $P_2$ (the size of a long side of a rectangular shape), with $P_2=\sqrt{3}P_1$ being taken into consideration, it is preferable that the distance $L_1$ between the emitting unit 1 and the optical element 2 should satisfy:

$$\frac{3(n-0.1)P_1^2}{2\lambda} \leqq L_1 \leqq \frac{3(n+0.1)P_1^2}{2\lambda} \qquad \text{[Equation 14]}$$

and further preferably, satisfy:

$$L_1 = \frac{3nP_1^2}{2\lambda} \qquad \text{[Equation 15]}$$

Figure 52:
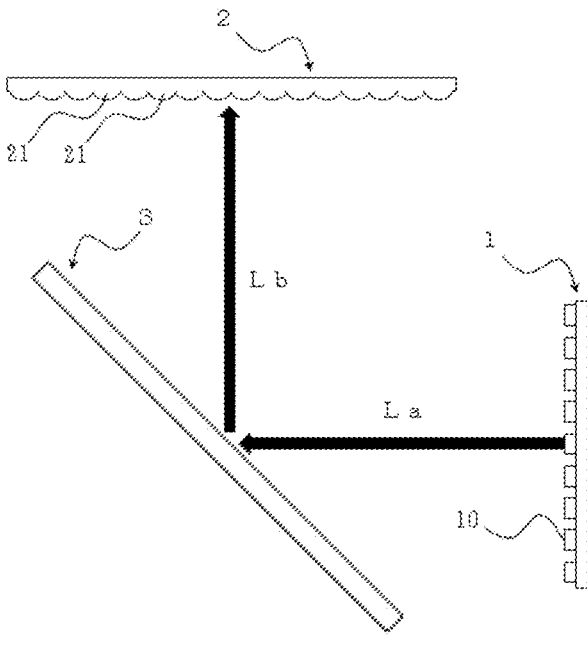
FIG. 52 is a schematic cross-sectional view illustrating another optical device according to the present disclosure.

Moreover, as illustrated in FIG. 52, it is not necessary that the light from the emitting unit 1 is directly emitted to the optical element 2, and the light from the emitting unit 1 may be emitted through a mirror 3 that reflects such light. In this case, the distance $L_1$ between the emitting unit 1 and the optical element 2 means a substantive distance. Hence, the distance $L_1$ in the case of FIG. 52 is La+Lb which is the sum of a distance La from the emitting unit 1 to the mirror 3 and a distance Lb from the mirror 3 to the optical element 2, as indicated by respective arrows. Accordingly, the distance L can be adjusted using the mirror 3. Moreover, the direction of the light from the light source can be also adjusted.

Figure 53:
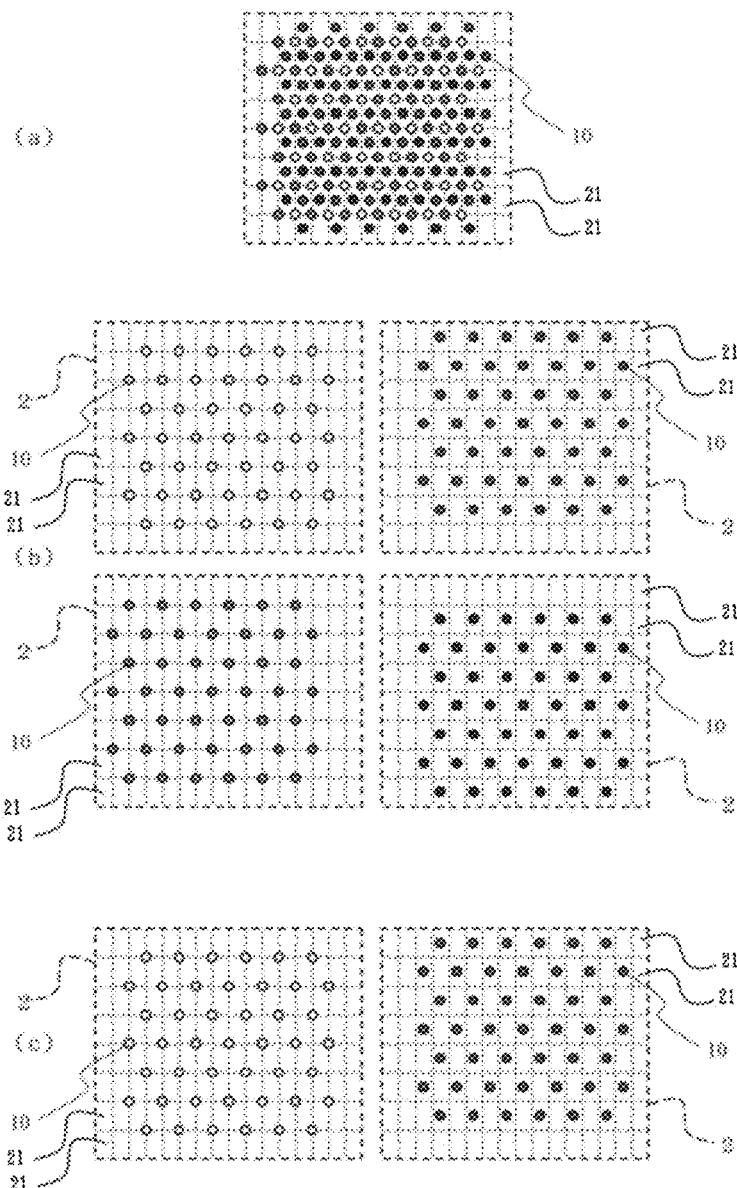
FIG. 53 is a schematic plan view illustrating a principle of another optical device according to the present disclosure.

Next, another embodiment of the present disclosure will be described. Part (a) of FIG. 53 is a schematic plan view illustrating the emitting unit 1 as viewed from the optical-element-2 side. In this example, the optical element 2 has the lenses 21 each formed in a rectangular shape in a planar view and arranged regularly. Moreover, the applied emitting unit 1 has the respective light sources 10 arranged in a hexatic manner. When divided, the arrangement of the light sources 10 illustrated in part (a) of FIG. 53 can be divided into four sections as illustrated in part (b) of FIG. 53. Among these, since respective dot patterns emitted from the upper left and lower left arrangements of the light sources 10, and from the upper right and lower right arrangements thereof in part (b) of FIG. 53 are consistent, those can be regarded as the same. Hence, the arrangement of the light sources 10 relative to the optical element 2 can be substantially classified into two kinds as illustrated in part (c) of FIG. 53.

Figure 54:
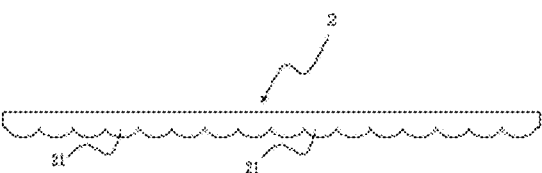
FIG. 54 is a schematic cross-sectional view illustrating an optical device that utilizes two kinds of emitting units according to the present disclosure.
Figure 54:
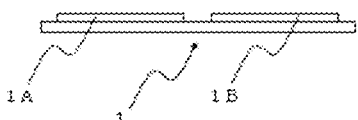

Hence, as illustrated in FIG. 54, when the emitting unit 1 is formed by a first emitting unit 1A that has the plurality of light sources 10 each of which emit light with a wavelength λ and which are arranged regularly, and a second emitting unit 1B that has the plurality of light sources 10 each of which emit light with a wavelength λ and which are arranged regularly so as to be shifted half period by half period in the vertical and horizontal directions relative to the first emitting unit 1A, the similar light distribution can be accomplished. In this case, as is clear when part (a) of FIG. 53 and part (c) thereof are compared, there is an advantage such that the pitch between the light sources 10 can be doubled.

Figure 55:
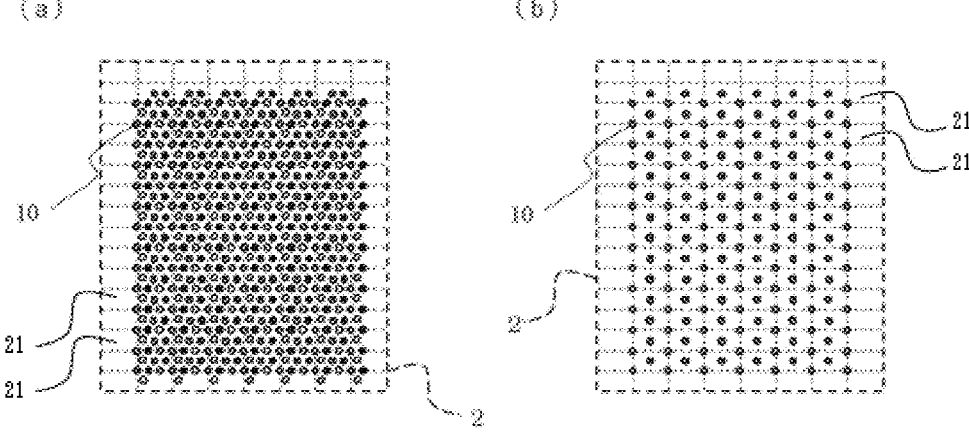
FIG. 55 is a schematic plan view illustrating a principle of the other optical device according to the present disclosure.
Figure 55:
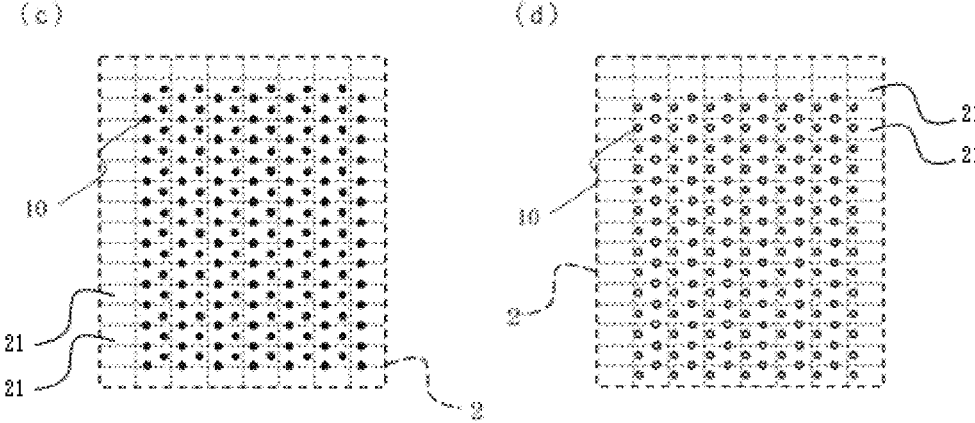
Figure 56:
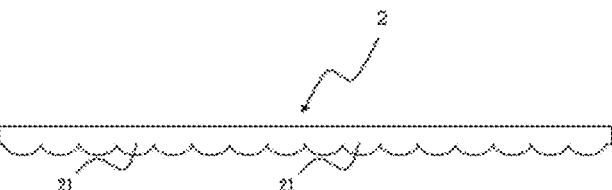
FIG. 56 is a schematic cross-sectional view illustrating an optical device that utilizes three kinds of emitting units according to the present disclosure.
Figure 56:

Moreover, the emitting unit 1 may be formed by a first emitting unit, a second emitting unit and a third emitting unit each of which have the plurality of light sources 10 each emitting light with a wavelength λ and which are arranged regularly, and each emitting unit may be arranged so as to be shifted $P_k/3$ by $P_k/3$ relative to a direction in which the lenses 21 of the optical element 2 have the pitch $P_k$. For example, part (a) of FIG. 55 illustrates a case in which the optical element 2 has the lenses 21 each in a rectangular shape in a planar view and arranged regularly, and the emitting unit 1 has the light sources 10 arranged in a hexatic manner. In this case, the emitting unit 1 illustrated in part (a) of FIG. 55 can be formed by three units that are a first emitting unit 11, a second emitting unit 12, and a third emitting unit 13 each having the light sources 10 arranged so as to be shifted $P_2/3$ by $P_2/3$ relative to a direction in which the lenses of the optical element 2 have the pitch $P_2$ as illustrated in parts (b) to (d) of FIG. 55. Hence, as illustrated in FIG. 56, the number of dots to be emitted without decreasing the light intensity of the emitting unit can be increased threefold by forming the optical device with the optical element 2 and three components that are the first emitting unit 11, the second emitting unit 12, and the third emitting unit 13. Moreover, when the resolution of a light receiving sensor applied for a TOF is low, sensing of all dots may be difficult even if the number of dots is increased threefold. In this case, the light emitting unit may cause the first emitting unit, the second emitting unit, and the third emitting unit to emit light in sequence at different times. Accordingly, by carrying out measurements by three times using the light receiving sensor, the resolution can be increased threefold.

Moreover, when the planar shape of the lens 21 is a square shape or a rectangular shape having any side with a length of R, regarding the arrangement of the lenses 21, when it is defined that i is a natural number equal to or greater than 1, the rows of the lenses 21 each continuous in the direction of the above-described side may be arranged so as to be shifted R/i by R/i. This multiplies the number of emitted dots to be i times.

Figure 57:
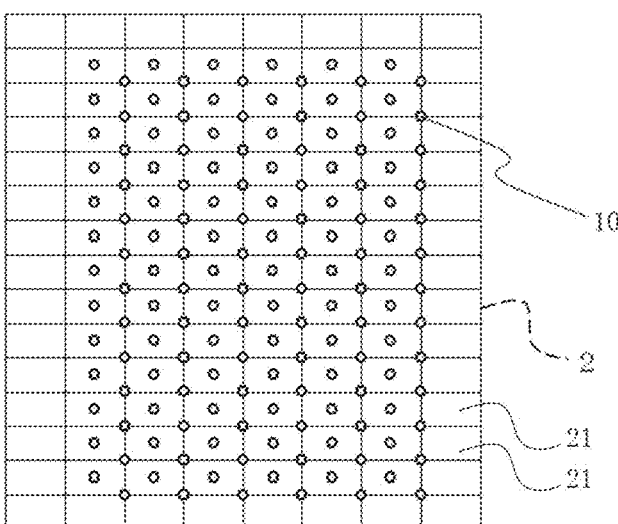
FIG. 57 is a diagram for describing a relation between an arrangement of optical elements and a dot number (1 times) according to the present disclosure.
Figure 57:
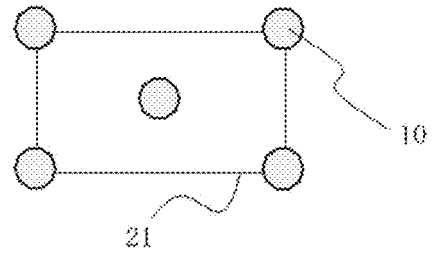
Figure 57:
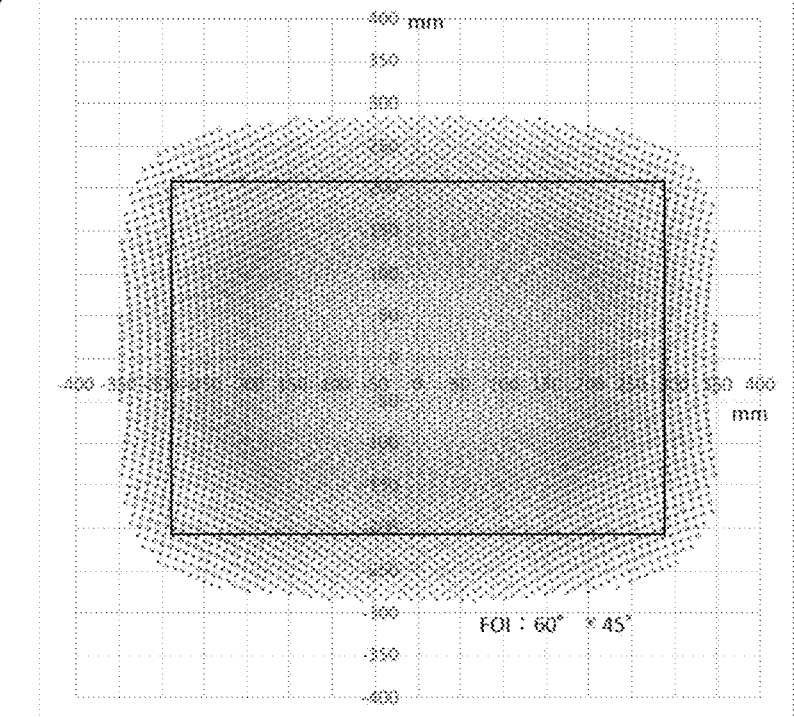
Figure 58:
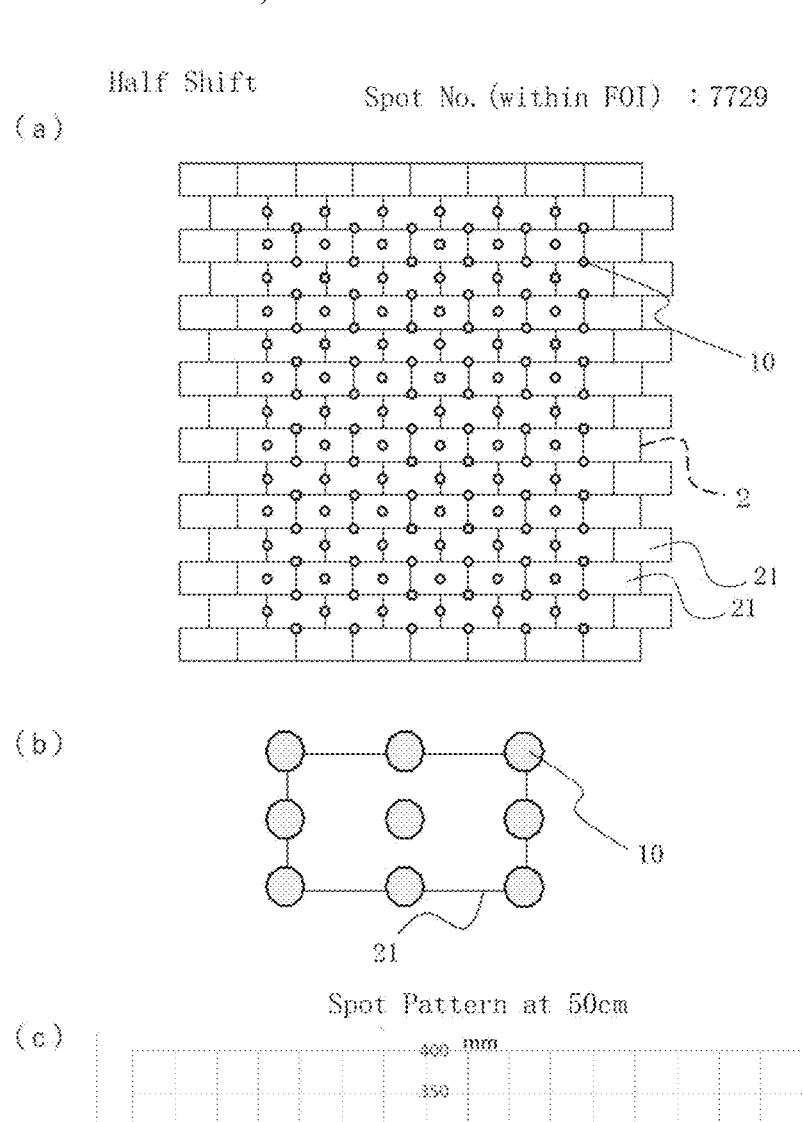
FIG. 58 is a diagram for describing a relation between an arrangement of optical elements and a dot number (twofold) according to the present disclosure.
Figure 58:
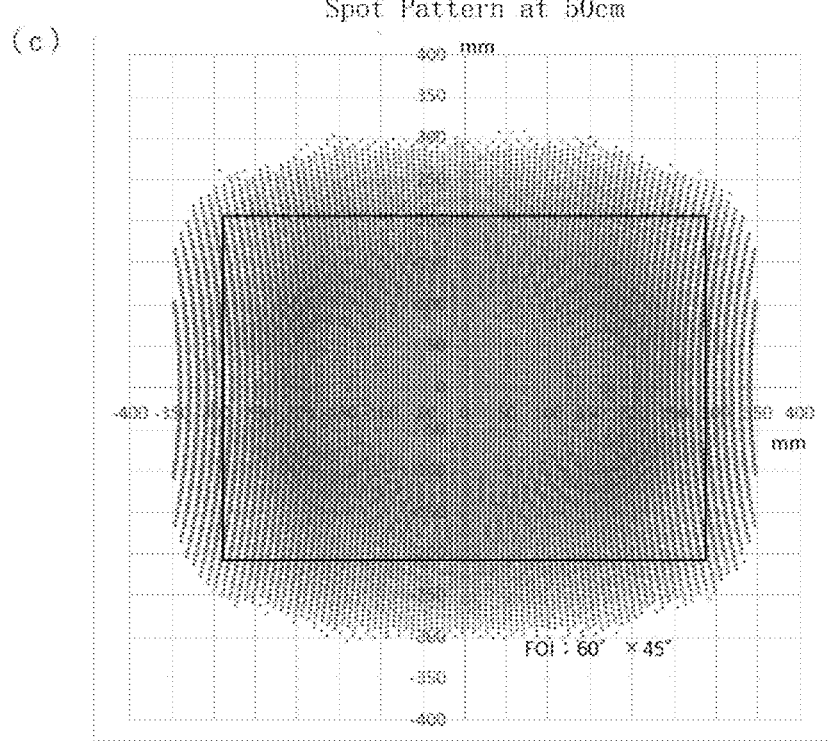
Figure 59:
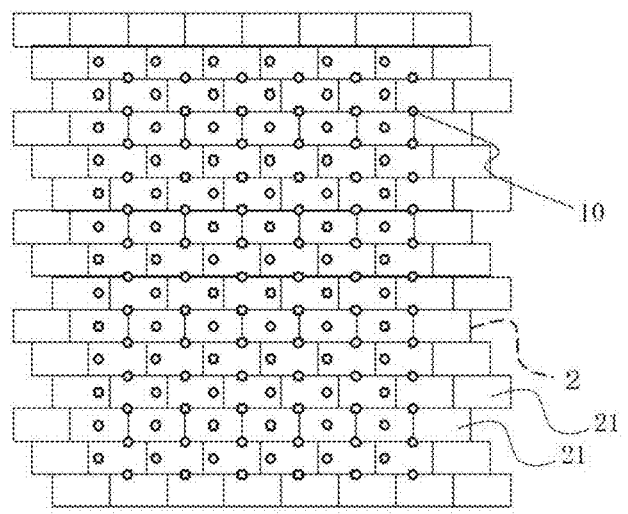
FIG. 59 is a diagram for describing a relation between an arrangement of optical elements and a dot number (three-fold) according to the present disclosure.
Figure 59:
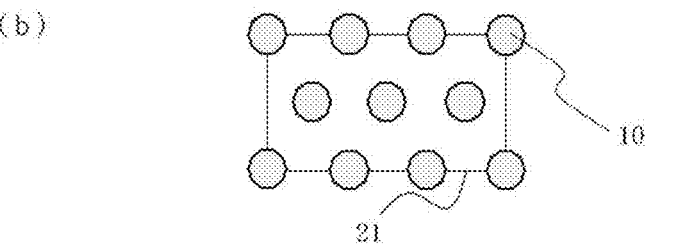
Figure 59:
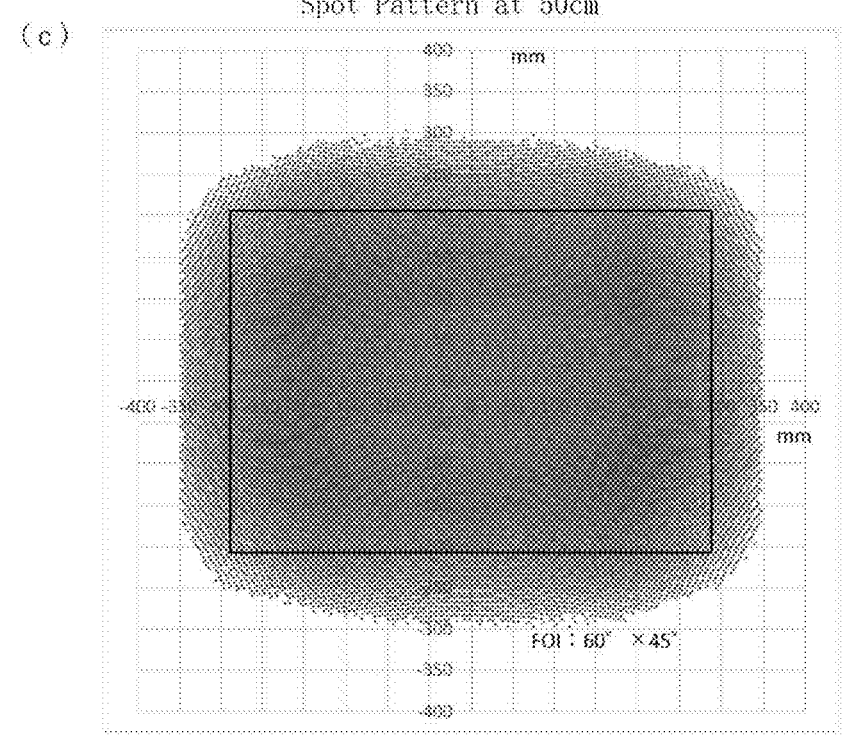

Such a principle can be explained as follows. Note that the emitting unit 1 had the light sources 10 each emitting light with a wavelength of 940 nm and arranged in a hexatic manner in such a way that the minimum pitch became 21 μm. Moreover, the size of the light source 10 was 10 μm. Furthermore, the planar shape of the lens 21 of the optical element 2 was a rectangular shape of 21 μm in the vertical direction and of 36.4 μm in the horizontal direction. Still further, the distance between the emitting unit 1 and the optical element 2 was 1407 μm. As illustrated in part (a) of FIG. 57, when the lenses 21 of the optical element 2 in adjacent rows are arranged in the same way, when the positions of the light sources 10 relative to each lens 21 are synthesized, it becomes as illustrated in part (b) of FIG. 57, and the number of lights from the light sources 10 per a lens 21 becomes two. In this case, the dot pattern to be emitted becomes as illustrated in part (c) of FIG. 57. Conversely, as illustrated in part (a) of FIG. 58, when the lenses 21 of the optical element 2 in adjacent rows are arranged so as to be shifted R/2 by R/2, and when the positions of the light sources 10 relative to each lens 21 is synthesized, it becomes as illustrated in part (b) of FIG. 58, and the number of lights from the light sources 10 per a lens 21 becomes four. In this case, as illustrated in part (c) of FIG. 58, since the lights from the light sources 10 per a lens 21 are increased twofold, the number of dots of the dot pattern to be emitted becomes twofold. Furthermore, as illustrated in part (a) of FIG. 59, when the lenses 21 of the optical element 2 adjoins in adjacent rows are arranged so as to be shifted 3/R by 3/R, and when the positions of the light sources 10 relative to each lens 21 are synthesized, it becomes as illustrated in part (b) of FIG. 59, and the number of lights from the light sources 10 per a lens 21 becomes six. In this case, as illustrated in part (c) of FIG. 59, since the lights from the light sources 10 per a lens 21 are increased threefold, the number of dots of a dot pattern to be emitted is increased threefold. When the lenses 21 of the optical element 2 in the adjacent rows are arranged so as to be shifted R/i by R/i as described above, when the light sources 10 relative to each lens 21 are synthesized, the number of lights from the light sources 10 per a lens 21 becomes 2i. Hence, the lights from the light sources 10 per a lens 21 becomes i times when the adjacent rows of the lenses 21 are not shifted, and the number of dots to be emitted also becomes i times.

Figure 60:
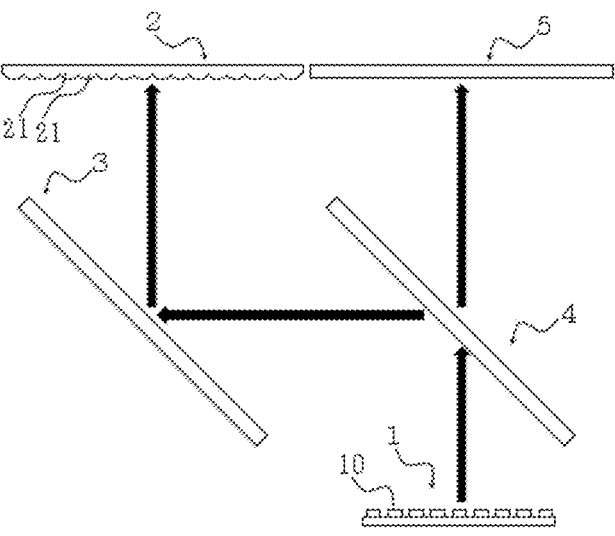
FIG. 60 is a schematic cross-sectional view illustrating an optical device of the present disclosure which also utilizes a diffuser.

Moreover, there is a case in which both of the optical element 2 according to the present disclosure and a conventional diffuser type optical element 5 are utilized together as needed. In this case, as illustrated in FIG. 60, the optical device may include a diffuser that diffuses light from the emitting unit 1 in a predetermined shape, a half mirror which is placed between the light source 10 and the diffuser, allows some lights from the emitting unit 1 pass therethrough, and reflects the remaining lights, and a mirror that reflects light reflected by the half mirror 4 to the optical element 2.

Furthermore, the optical element 2 according to the present disclosure can be utilized for not only emitting a dot pattern but also an application as a diffuser.

Figure 61:
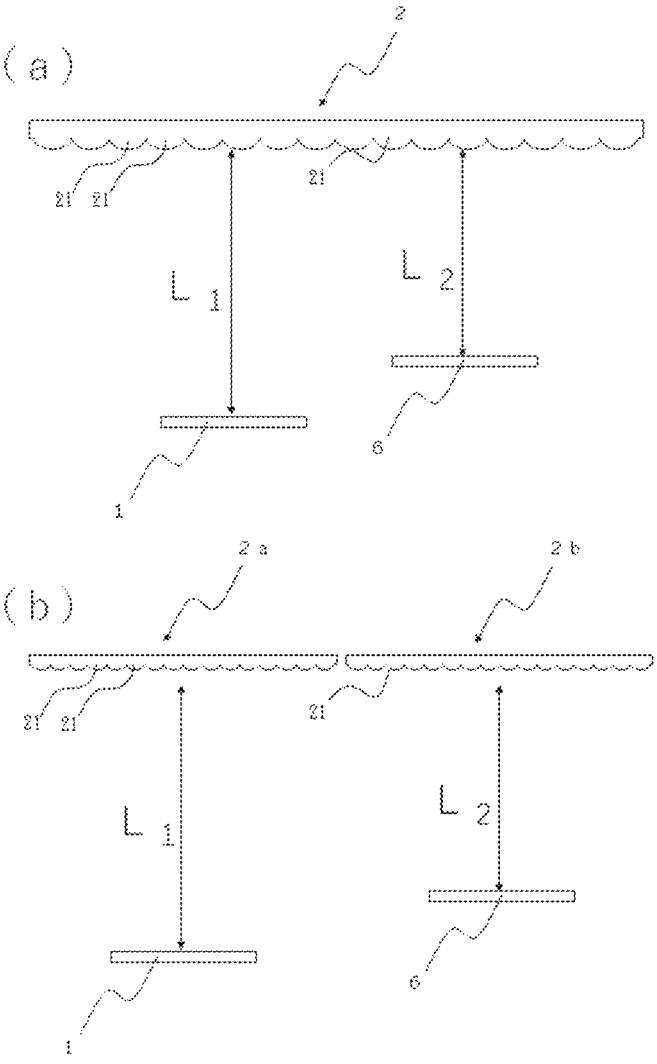
FIG. 61 is a schematic cross-sectional view illustrating an optical device that has a dot pattern emitting function and a diffuser function according to the present disclosure.

As for a first scheme of utilizing the optical element 2 as a diffuser, as illustrated in FIG. 61, a diffuser emitting unit 6 arranged in the similar way to the emitting unit 1 that utilizes the plurality of light sources 10 which emit respective lights with a wavelength λ to emit a dot pattern is prepared. Next, it is appropriate if a distance $L_2$ between the diffuser emitting unit 6 and the optical element 2 satisfies the following formula 2.

[Equation 16]

$$\frac{(n-0.9)P_k^2}{2\lambda} < L_2 < \frac{(n-0.1)P_k^2}{2\lambda}$$ (Formula 2)

Accordingly, it becomes clear that, like the above-described simulation 1 and as illustrated in FIG. 7 to FIG. 9, the width of each peak spreads, and the variability in light intensity decreases.

Note that it is more preferable that the distance $L_2$ should satisfy the following formula 3.

[Equation 17]

$$\frac{(n-0.6)P_k^2}{2\lambda} < L_2 < \frac{(n-0.4)P_k^2}{2\lambda}$$ (Formula 3)

Note that in this case, as illustrated in part (a) of FIG. 61, a common optical element 2 may be applied, or as illustrated in part (b) of FIG. 61, two components that are an optical element 2a for dot pattern, and an optical element 2b for diffuser may be applied.

Moreover, as for a second scheme of utilizing the optical element 2 as a diffuser, the diffuser emitting unit 6 that has a plurality of light sources 60 each emitting light with a wavelength λ and arranged is prepared. When m is defined as a natural number that is equal to or greater than 1, the diffuser emitting unit 6 may be placed in such a way that the plurality of light sources 60 does not become m times or 1/m times as much as a period of the lenses 21 of the optical element 2 relative to such a periodic direction.

Figure 62:
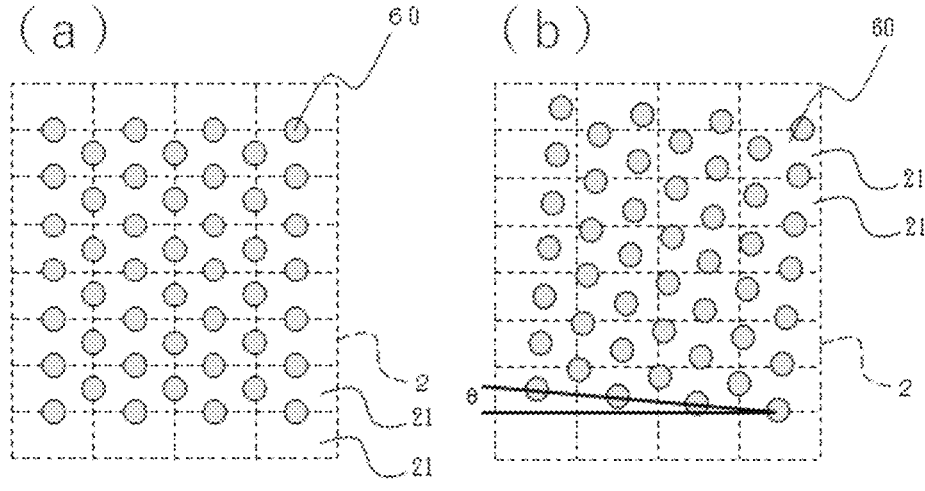
FIG. 62 is a schematic plan view illustrating a positional relation between an emitting unit and an optical element according to the present disclosure.
Figure 63:
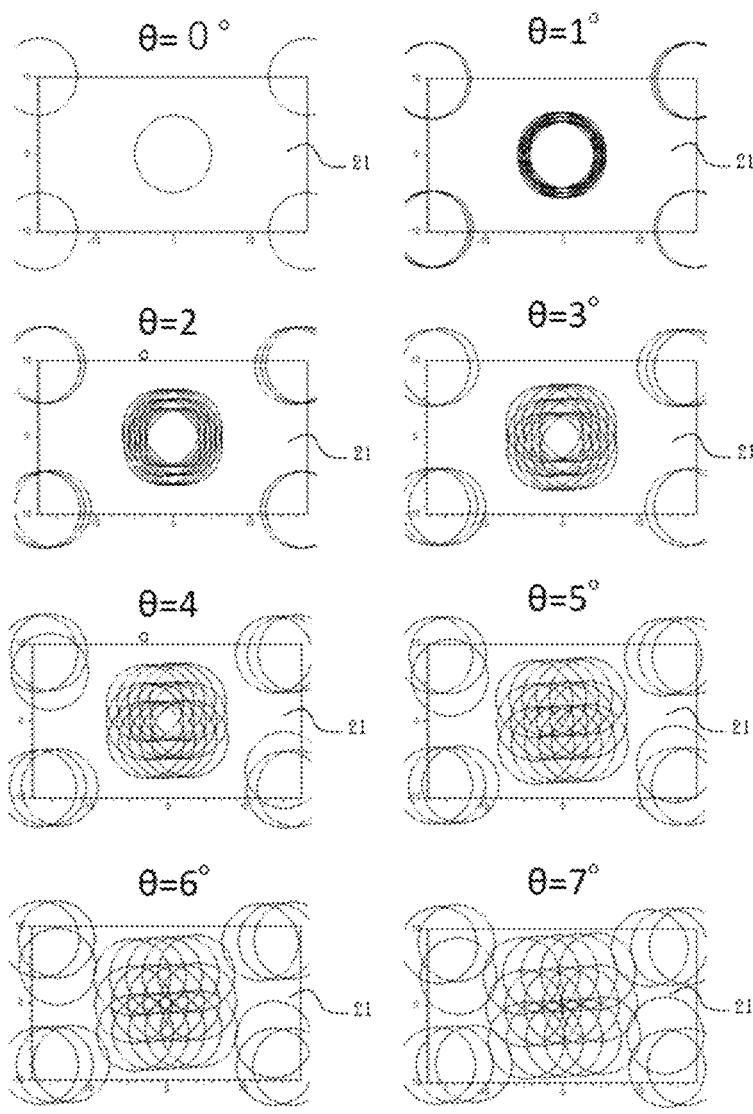
FIG. 63 is a diagram illustrating a variability in light source position due to a difference in angle θ (0 to 7 degrees) between an emitting unit and an optical element.
Figure 64:
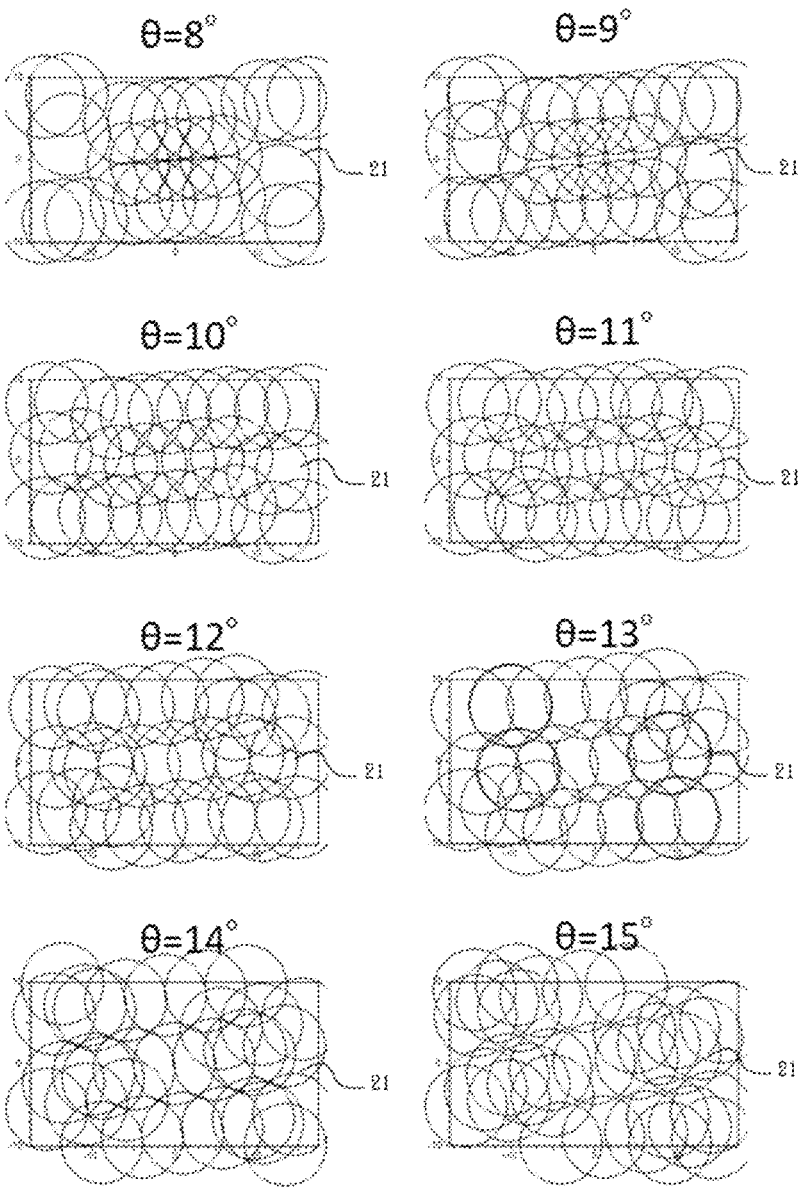
FIG. 64 is a diagram illustrating a variability in light source position due to an angle θ (8 to 15 degrees) between an emitting unit and an optical element.
Figure 65:
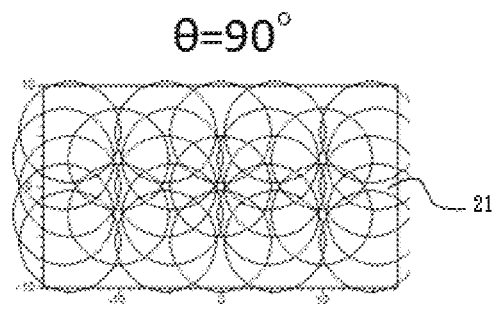
FIG. 65 is a diagram illustrating a variability in light source position due to an angle θ (90 degrees) between an emitting unit and an optical element.

Note that as illustrated in part (a) of FIG. 62, there may be a case in which the plurality of light sources 60 of the diffuser emitting unit 6 may be m times or 1/m times as much as the period. In such a case, as illustrated in part (b) of FIG. 62, the diffuser emitting unit 6 relative to the optical element may be rotated relative to the direction of the optical axis of the light source 60. Hence, the arrangement can be shifted in such a way that the plurality of light sources 60 does not become m times or 1/m times relative to the periodic direction of the lenses 21 of the optical element 2. FIG. 63 to FIG. 65 are diagrams each illustrating a state in which the positions of the light sources 60 relative to each lens 21 are synthesized to a lens 21 when light from the diffuser emitting unit 6 is emitted to the optical element 2. A rotation angle θ means an angular difference of a direction in which the light sources 10 of the diffuser emitting unit 6 takes a pitch $mP_k$ or $P_k/m$ relative to a direction in which the lenses 21 of the optical element 2 takes a pitch $P_k$. For example, as illustrated in part (a) of FIG. 62, when the pitch of the emitting unit 1 and the pitch of the optical element 2 are consistent (when θ is 0 degree), since the position of the light sources 10 are consistent in any lens 21, as illustrated in FIG. 63 (θ=0 degree), the respective positions of the light sources 10 clearly overlap. Conversely, as the angle θ increases, the displacement of the position of the light source 10 occurs.

(Simulation 10)

A simulation was carried out for a relation between a rotation angle relative to the optical element 2 and a dot pattern. The emitting unit was a VCSEL which had a hexatic arrangement with a pitch of 21 μm, a wavelength of 940 nm, a spread angle (FWHM) of 20 degrees, and an emitter pitch of 10 μm. The optical element had an index of refraction of 1.53, a rectangular shape with a pitch of 21 μm×36.37 μm, and an FOI of 60 degrees×45 degrees. Moreover, a distance between the optical element and the emitting unit was 1407 μm. Furthermore, the projecting position of a dot pattern was 50-cm ahead from the optical element. The rotation angle θ relative to the optical element 2 was set to 0 degree, 1 degree, 5 degrees, 10 degrees, and 15 degrees. FIG. 66 to FIG. 70 are diagrams each illustrating a rotation angle relative to the optical element 2 and a dot pattern. Note that an optical simulation software BeamPROP (available from Synopsys Inc.,) was applied for the simulation.

Figure 66:
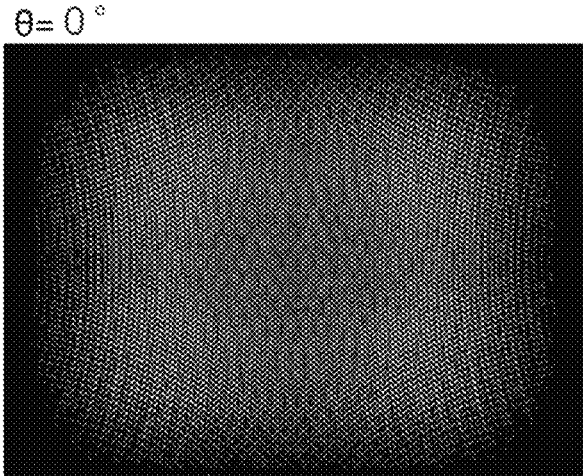
FIG. 66 is a diagram illustrating a light intensity at a far-field in a simulation 10 (θ=0 degree)
Figure 67:
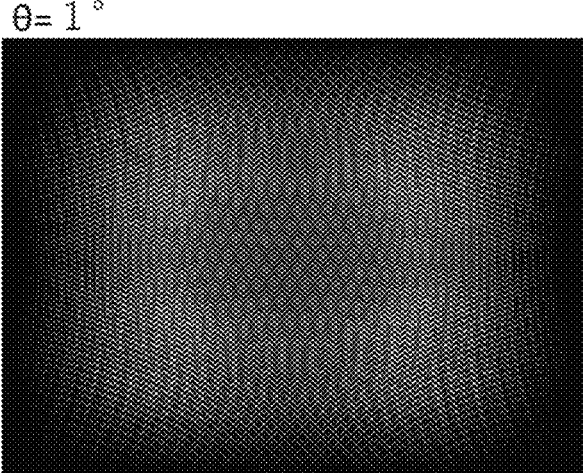
FIG. 67 is a diagram illustrating a light intensity at a far-field in the simulation 10 (where θ=1 degree)
Figure 68:
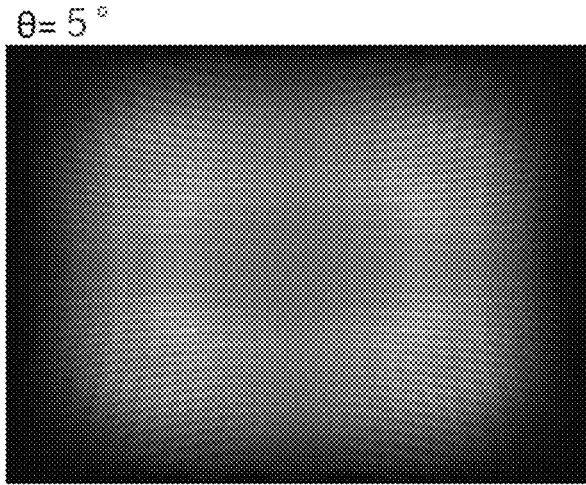
FIG. 68 is a diagram illustrating a light intensity at a far-field in the simulation 10 (where θ=5 degrees)
Figure 69:
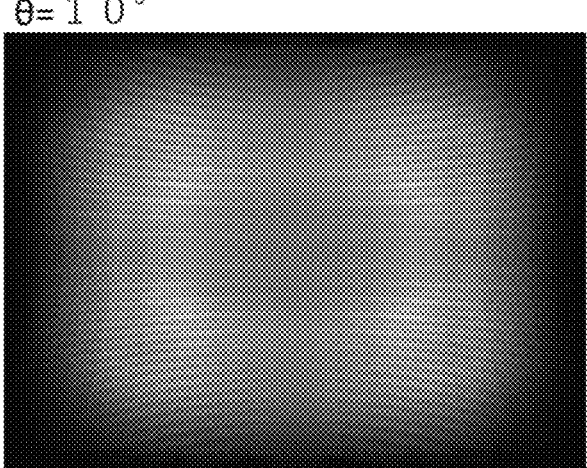
FIG. 69 is a diagram illustrating a light intensity at a far-field in the simulation 10 (where θ=10 degrees)
Figure 70:
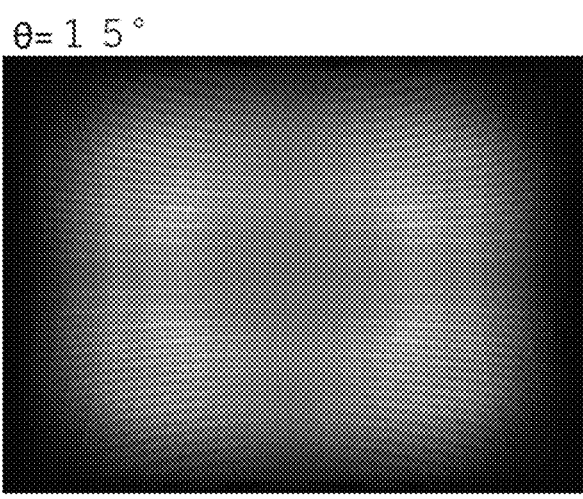
FIG. 70 is a diagram illustrating a light intensity at a far-field in the simulation 10 (where θ=15 degrees).

As illustrated in FIG. 66, it becomes clear that, when the plurality of light sources 60 of the diffuser emitting unit 6 matches the period of the lenses of the optical element (when the rotation angle is 0 degree), a clear dot pattern appears, but as the rotation angle increases and as the displacement between the pitch of the light sources 60 and the pitch of the lenses increases, a peak width spreads and lights are diffused. Hence, by appropriately adjusting the rotation angle of the diffuser emitting unit 6 relative to the optical element, the optical element 2 can be utilized as a diffuser.

Moreover, a third scheme of utilizing the optical element 2 as a diffuser is a scheme of increasing the number of dots of a dot pattern so as to make emitted light apparently uniform. The term apparently in this example means, when, for example, it is applied for a TOF, the number of dots is increased to be equal to or greater than the resolution of a light receiving sensor that receives reflected light of the emitted light. In order to increase the number of dots of a dot pattern, as described above, the planar shape of the lens 21 is changed in a square shape, a rectangular shape, a rhombic shape or a parallel parallelogram shape having any side with a length of R. Moreover, regarding the arrangement of the lenses 21, the rows of the lenses 21 continuous in the direction along the above-described side are arranged so as to be shifted R/i by R/i. Next, i may be adjusted in such a way that the number of dots to be emitted becomes equal to or greater than the resolution of a light receiving sensor.

A diffuser formed in this way can be utilized in combination with the above-described optical device for emitting a dot pattern. Accordingly, as for an object at a long distance, a distance and a shape, etc., can be measured with the intensity of emitted light being ensured by a dot pattern, and as for an object at a close distance, a distance and a shape, etc., can be further precisely measured by emitting light from the diffuser.

REFERENCE SIGNS LIST

1 Emitting unit
1A First emitting unit
1B Second emitting unit
2 Optical element
3 Mirror
4 Half mirror
5 Diffuser type optical element
6 Diffuser emitting unit
7 Aperture mask
8 Light diffusion portion
10 Light source
11 Emitting unit
12 Emitting unit
13 Emitting unit
21 Lens
25 Substrate
60 Light source
70 Aperture

The invention claimed is:

1. An optical device comprising:

an optical element comprising a plurality of lenses arranged periodically, the lenses allowing light with a wavelength $\lambda$ to pass therethrough; and an emitting unit comprising a light source that emits the light with the wavelength $\lambda$ to the plurality of lenses, wherein when n is a natural number that is equal to or greater than 1, and a size of a k-th (where k is a natural number that is equal to or greater than 1) pitch from a smallest pitch among pitches of the lenses is $P_k$, a distance $L_1$ between the emitting unit and the optical element satisfies a following equation 1 for equal to or greater than the any one pitch $P_k$, wherein the lenses are aspheric lenses in which boundaries between the lenses are square, rectangular, or hexagonal in a plan view, and wherein a normal line overlapping rate of a surface of a lens is equal to or smaller than 10%.

[Equation 1]

$$\frac{(n-0.1)P_k^2}{2\lambda} \leqq L_1 \leqq \frac{(n+0.1)P_k^2}{2\lambda} \qquad \text{(Formula 1)}$$

2. The optical device according to claim 1, further comprising an aperture mask which is provided with an opening and which blocks some of noise lights that increases an overlapping rate of transmitted lights from the lenses.

3. The optical device according to claim 2, wherein the aperture mask has the opening located at a portion including at least an optical axis of the lens.

4. The optical device according to claim 2, wherein the aperture mask is placed at an optical path of noise light of the lens.

5. The optical device according to claim 2, wherein the aperture mask is placed at a boundary portion between the lenses.

6. The optical device according to claim 2, wherein the aperture mask blocks the light emitted to a boundary portion between the lenses.

7. The optical device according to claim 2, wherein the aperture mask is formed so as to be integrated with the optical element.

8. The optical device according to claim 1, wherein the optical element comprises a light diffusion portion which is formed at a boundary portion between the lenses and which refracts transmitted light to an external side of an emitting angle of the lens.

9. The optical device according to claim 1, satisfying the equation 1 for a smallest pitch $P_1$ and also satisfying the equation 1 for a second smallest pitch $P_2$.

10. The optical device according to claim 1, further comprising a mirror that reflects the light from the emitting unit.

11. The optical device according to claim 1, comprising a plurality of the emitting units.

12. The optical device according to claim 11, wherein the emitting units comprise:

a first emitting unit comprising a plurality of light sources each of which emit light with a wavelength $\lambda$ and which are arranged regularly; and a second emitting unit comprising a plurality of light sources each of which emit light with a wavelength $\lambda$ and which are arranged regularly so as to be shifted half period by half period in a vertical direction and in a horizontal direction relative to the plurality of light sources of the first emitting unit.

13. The optical device according to claim 11, wherein:

the emitting units comprise a first emitting unit, a second emitting unit and a third emitting unit each comprising a plurality of light sources each of which emit light with a wavelength $\lambda$ and which are arranged regularly; and relative to a direction in which the lenses of the optical elements have the pitch $P_k$, the respective light sources of the first emitting unit, the second emitting unit and the third emitting unit are arranged so as to be shifted $P_k/3$ by $P_k/3$.

14. The optical device according to claim 11, wherein the respective emitting units are caused to emit the light in sequence at different times.

15. The optical device according to claim 1, wherein:

a planar shape of the lens is a square shape or a rectangular shape having any one of sides with a length R; and regarding the arrangement of the lenses, when i is a natural number that is equal to or greater than 1, respective rows of the lenses continuous in a direction along the side are arranged so as to be shifted R/i by R/i.

16. The optical device according to claim 9, wherein when m is a natural number that is equal to or greater than 1, the emitting unit has a plurality of the light sources arranged in a hexatic manner at a pitch of $mP_1$ or $P_1/m$; and a planar shape of the lens of the optical element is a rectangular shape with a ratio between a short side and a long side that is $P_1:P_2=1:\sqrt{3}$.

17. The optical device according to claim 16, wherein: the distance $L_1$ between the emitting unit and the optical element is $3P_1^2/2\lambda$ or multiples of $3P_1^2/2\lambda$.

18. The optical device according to claim 1, wherein the overlapping rate is determined by a method comprising:

(1) defining a plane perpendicular to an optical axis of the lens as an x-y plane; dividing the lens into n square fine regions on the x-y plane; and assigning non-duplicated numbers from 1 to n to the respective fine regions, wherein a length of one side of each fine region is equal to or less than one-quarter ($\lambda/4$) of a wavelength of light emitted from the emitting unit;

(2) defining a center point of an i-th fine region (i=1, 2, . . . , n) among the divided fine regions as Pi, and an inscribed circle thereof as Ci; and defining a group of center points of fine regions other than the i-th fine region as Qi;

(3) defining a normal vector Npi as a normal of the lens surface at an intersection between a line passing through Pi and perpendicular to the x-y plane and the lens surface, and defining a group of normal vectors Nci as normals of the lens surface at intersections between lines passing through Ci and perpendicular to the x-y plane and the lens surface; and defining a minimum value of an angle between Npi and Nci as $\delta\theta i$;

(4) defining a group of normal vectors Nqi at intersections between lines passing through the point group Qi and perpendicular to the x-y plane and the lens surface, wherein each normal vector in the group corresponds to a normal of the lens surface at the respective intersection;

(5) defining a state flag of the i-th fine region as Fi, and setting an initial value of Fi to 0;

(6) calculating, for all i=1, 2, . . . , n, an angle $\theta i$ between the normal vector Npi and the vector group Nqi, and setting Fi to 1 when $\theta i$ is equal to or less than $\delta\theta i$; and (7) determining the normal line overlapping rate as (m/n)×100(%), where m is the number of Fi having a value of 1.

19. The optical device according to claim 1, wherein a line in a cross-section of a lens surface is free of any inflection point.

* * * * *